(12) United States Patent
Chen et al.

(10) Patent No.: US 12,324,278 B2
(45) Date of Patent: Jun. 3, 2025

(54) SEMICONDUCTOR EPITAXIAL STRUCTURE AND APPLICATION AND MANUFACTURING METHODS THEREOF

(71) Applicant: SHENZHEN JING XIANG TECHNOLOGIES CO., LTD., Shenzhen (CN)

(72) Inventors: Weijun Chen, Shenzhen (CN); Meihua Liu, Shenzhen (CN)

(73) Assignee: SHENZHEN JING XIANG TECHNOLOGIES CO., LTD., Shenzhen (CN)

( * ) Notice: Subject to any disclaimer, the term of this patent is extended or adjusted under 35 U.S.C. 154(b) by 453 days.

(21) Appl. No.: 17/698,013

(22) Filed: Mar. 18, 2022

(65) Prior Publication Data

US 2022/0223759 A1     Jul. 14, 2022

Related U.S. Application Data

(63) Continuation of application No. PCT/CN2020/116501, filed on Sep. 21, 2020.

(30) Foreign Application Priority Data

Sep. 20, 2019  (CN) .................. 201910895152.5

(51) Int. Cl.
*H10H 20/825* (2025.01)
*H10H 20/01* (2025.01)
*H10H 20/811* (2025.01)

(52) U.S. Cl.
CPC ...... *H10H 20/825* (2025.01); *H10H 20/0137* (2025.01); *H10H 20/811* (2025.01)

(58) Field of Classification Search
CPC ...... H01L 33/32; H01L 33/0075; H01L 33/04
See application file for complete search history.

(56) References Cited

U.S. PATENT DOCUMENTS

| 6,168,659 B1* | 1/2001 | Yuri ................. H01L 21/02505 257/E21.127 |
| 2011/0272665 A1* | 11/2011 | Yamaguchi ......... H01L 21/0254 257/E29.074 |
| 2013/0214281 A1* | 8/2013 | Li .......................... H01L 29/20 257/E29.089 |
| 2019/0172913 A1* | 6/2019 | Liang ............... H01L 29/66795 |

\* cited by examiner

*Primary Examiner* — Brian Turner
(74) *Attorney, Agent, or Firm* — Hemisphere Law, PLLC; Zhigang Ma

(57) ABSTRACT

A semiconductor epitaxial structure, an application thereof and a manufacturing method therefor are provided. The semiconductor epitaxial structure includes a substrate, an aluminum nitride layer formed on the substrate, and a gallium nitride layer formed on the aluminum nitride layer. The semiconductor epitaxial structure can be applied in a semiconductor device and an electronic device.

3 Claims, 36 Drawing Sheets

SEMICONDUCTOR EPITAXIAL STRUCTURE AND APPLICATION AND MANUFACTURING METHODS THEREOF

CROSS-REFERENCE TO RELATED APPLICATIONS

The present closure is a continuation of International Application No. PCT/CN2020/116501, filed on Sep. 21, 2020. The International Application claims priority from Chinese patent application No. 201910895152.5, filed on Sep. 20, 2019, which is hereby incorporated herein by reference in its entirety.

TECHNICAL FIELD

The present disclosure relates to the field of semiconductors, and in particular, to a semiconductor epitaxial structure and application and manufacturing methods thereof.

BACKGROUND

Since the third-generation semiconductor materials, such as gallium nitride or silicon carbide, have advantages such as large band gap, high electron saturation velocity, high breakdown electric field, high thermal conductivity, high corrosion resistance, and high radiation-resistant performance, they can be used as semiconductor materials to obtain semiconductor epitaxial structures.

However, when the third-generation semiconductor material, such as gallium nitride is used for the semiconductor epitaxial structure, there are still various problems such as lattice mismatch and so on.

SUMMARY

In view of the above-described defects in the prior art, the present disclosure proposes a semiconductor epitaxial structure to reduce lattice mismatch between gallium nitride and silicon and improve the quality of the semiconductor epitaxial structure.

In order to achieve the above object and other objects, the present disclosure proposes a semiconductor epitaxial structure including:

a substrate;

an aluminum nitride layer formed on the substrate;

a first aluminum gallium nitride layer formed on the aluminum nitride layer;

a second aluminum gallium nitride layer formed on the first aluminum gallium nitride layer; and a gallium nitride layer formed on the second aluminum gallium nitride layer;

an aluminum content of the first aluminum gallium nitride layer is higher than an aluminum content of the second aluminum gallium nitride layer.

In one embodiment of the present disclosure, the X value of the first aluminum gallium nitride layer ($Al_xGa_{1-x}N$) is greater than the Y value in the second aluminum gallium nitride layer ($Al_yGa_{1-y}N$).

In one embodiment of the present disclosure, the gallium nitride layer includes a first gallium nitride layer, a second gallium nitride layer, and a third gallium nitride layer.

In one embodiment of the present disclosure, the thickness of the first aluminum gallium nitride layer or the second aluminum gallium nitride layer is 600-1200 nm.

The present disclosure further provides a semiconductor device, including the semiconductor epitaxial structure described above.

The present disclosure further provides an electronic device, characterized by comprising the semiconductor device described above.

A method for manufacturing a semiconductor epitaxial structure, comprising the steps of:

providing a substrate;

forming an aluminum nitride layer on the substrate;

forming a first aluminum gallium nitride layer on the aluminum nitride layer;

forming a second aluminum gallium nitride layer on the first aluminum gallium nitride layer; and forming a gallium nitride layer on the second aluminum gallium nitride layer;

an aluminum content of the first aluminum gallium nitride layer is higher than an aluminum content of the second aluminum gallium nitride layer.

In summary, the present disclosure proposes a semiconductor epitaxial structure and an application and manufacturing method therefor, so as to obtain a high-quality epitaxial structure, which can improve the voltage-resistance performance and improve the quality of the semiconductor epitaxial structure.

DETAILED DESCRIPTION OF EMBODIMENTS

Other advantages and efficacy of the present disclosure will be readily apparent to those skilled in the art from the disclosure by specific examples below. The present disclosure may also be practiced or applied by other different specific embodiments, and details of the present description may also be based on different viewpoints and applications, and various modifications or changes may be made without departing from the spirit of the present disclosure.

Figure 1:
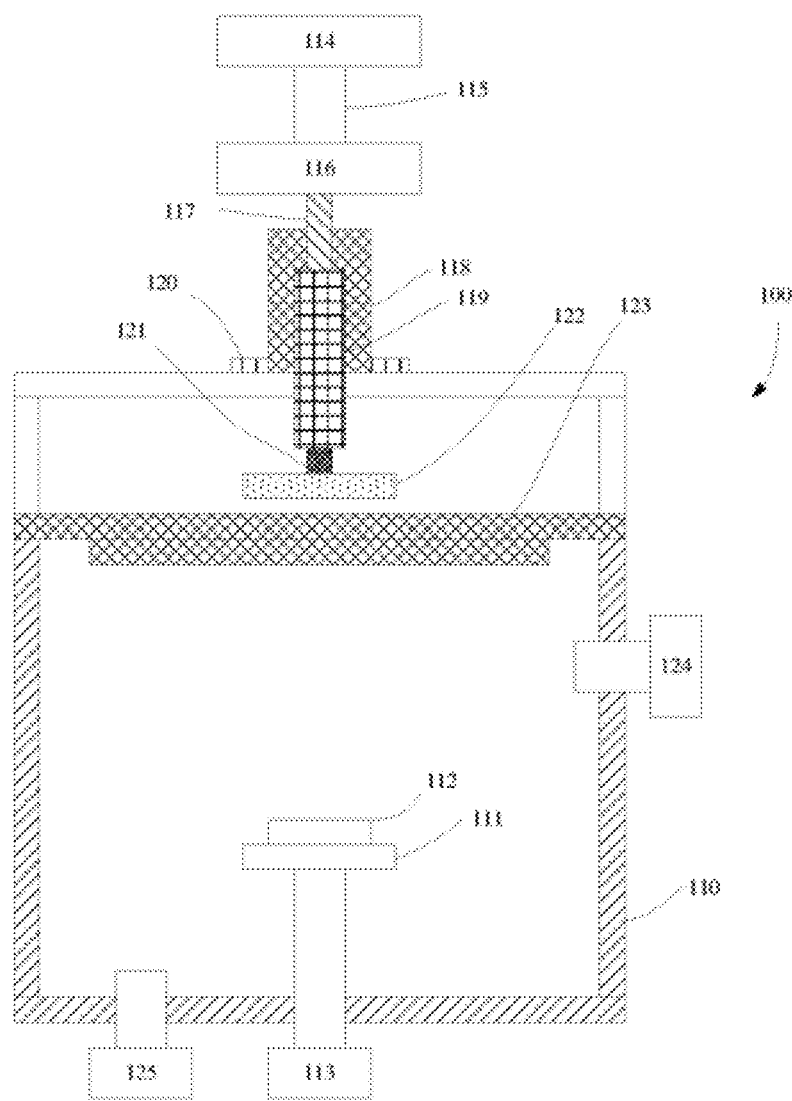
FIG. 1 is a schematic diagram of a growth chamber provided by an embodiment of the present disclosure.

Referring to FIG. 1, this embodiment proposes a semiconductor equipment 100. The semiconductor equipment 100 includes a growth chamber 110, a base 111, a target 123, and a magnet 122. The base 111 is disposed within the growth chamber 110, and the base 111 may be disposed at a bottom end of the growth chamber 110, and one or more substrates 112 (e.g., four, six or more) are allowed to be placed on the base 111. In some embodiments, the diameter of the base 111 may range, for example, from 200 mm to 800 mm. In some embodiments, the size of the base 111 is, for example, from 2 to 12 inches. The base 111 may be formed of a variety of materials, including silicon carbide or graphite coated with silicon carbide. The material of the substrate 112 may include sapphire, silicon carbide, silicon, gallium nitride, diamond, lithium aluminate, zinc oxide, tungsten, copper and/or gallium aluminum nitride. The substrate 112 may also be, for example, soda lime glass and/or high silicon glass. In general, the substrate 112 may be composed of a material having a compatible lattice constant and coefficient of thermal expansion, a substrate compatible with a group III-V material grown thereon, or a substrate that is thermally and chemically thermally stable at a III-V growth temperature. The size of the substrate 112 may range from 50 mm to 100 mm (or more) in diameter. For example, the substrate 112 may be a silicon substrate, and a metal compound film may be formed on the silicon substrate, for example, an aluminum nitride film or a gallium nitride film, for example, an aluminum nitride film oriented in (002). As shown in FIG.

1, the base 111 is further connected to a driving unit 113, and the driving unit 113 can be electrically connected to a control unit (not shown). The driving unit 113 is configured to drive the base 111 to move up or down, and the driving unit 113 may adopt a driving device such as a servo motor or a stepping motor. The control unit is configured to control the driving unit 113 to drive the base 111 to rise during magnetron sputtering, so that the distance between the target 123 and the base 111 can be maintained at a predetermined value. The predetermined value may be set according to specific requirements, so as to obtain an optimum value of a process result such as an ideal uniformity of the thin film and a deposition rate. Therefore, by controlling the driving unit 113 to drive the base 111 to rise during magnetron sputtering by the control unit, the distance between the target substrates can be kept unchanged, so as to improve the uniformity of the thin film and the deposition rate, and further improve the process quality. The control unit may be, for example, an upper computer or a PLC, and in some embodiments, the base 111 may also be connected to a rotation unit, and the rotation unit is configured to rotate the base 111 during film deposition, further improve thickness uniformity of the coating, and improve stress uniformity of the coating.

It is to be understood that in some embodiments, the semiconductor equipment 100 may also, for example, include a load lock chamber, a carrier cassette, and a selectively additional MOCVD reaction chamber (not shown) for numerous applications. In some embodiments, the target 123 of the semiconductor equipment 100 may include, but is not limited to, an Al-containing metal, an alloy, a compound such as Al, AlN, AlGa, $Al_2O_3$, etc., and the target may be doped with an element such as Group II/IV/VI to improve layer compatibility and device performance. In some embodiments, the sputtering process gas may include, but is not limited to, a nitrogen-containing gas such as $N_2$, NH3, $NO_2$, NO and an inert gas such as Ar, Ne, Kr.

In some implementations, the semiconductor devices of the present disclosure may be used to form devices and methods of high-quality buffer layers and group III-V layers that may be used to form possible semiconductor components, such as radio frequency components, power components, or other possible components.

Figure 2:
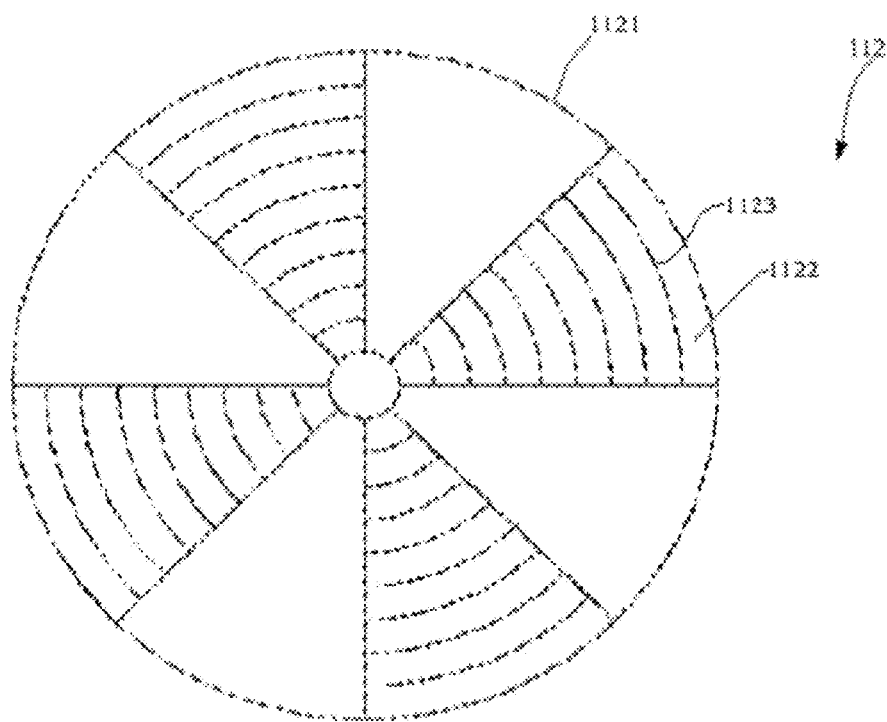
FIG. 2 is another schematic diagram of a base in an embodiment of the present disclosure.

Referring to FIG. 2, in some embodiments, an intermediate portion of the base 111 may be convex with respect to an edge, and the substrate 112 is disposed on an intermediate portion of the base 111, so that a portion of the substrate 112 covers the edge region and may be spaced apart from the edge region. At the edge of the substrate 112, there is no direct contact between the base 111 and the substrate 112, which is believed to reduce contact cooling of the base 111 to the substrate 112. When the substrate 112 is heated during the entire deposition process due to ion bombardment, since the substrate 112 is in thermal contact with an intermediate portion of the base 111, an intermediate portion of the substrate 112 may be cooled by the base 111, and an edge of the substrate 112 may not be directly contacted and cooled, thus, subjected to a higher temperature. This makes the edge of the film layer more stretchable, thus again functioning as an overall change in stress on the film layer.

Figure 3:
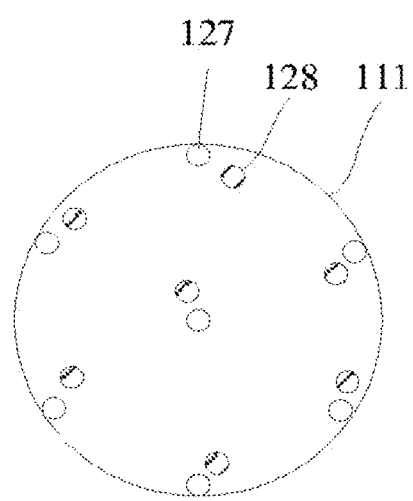
FIG. 3 is a schematic diagram of a back surface of a base in an embodiment of the present disclosure.
Figure 4:
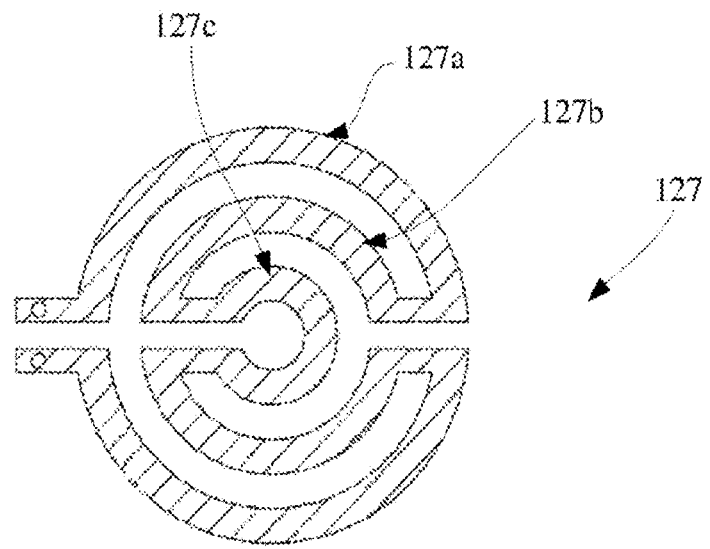
FIG. 4 is a schematic diagram of a heater in an embodiment of the present disclosure.

Referring to FIGS. 3-4, FIG. 3 shows a back surface of the base 111. In some embodiments, at least one heater may be disposed on the back surface of the base 111, wherein the heater may include a plurality of heating electrodes 126 and one heating coil 127, and a temperature measurement point 128 may also be disposed near the heating electrode 126. In the present embodiment, a plurality of heating electrodes 126 are connected to one heating coil 127. The heating coil 127 may include a first portion and a second portion, the first portion and the second portion being connected symmetrically with respect to the center of the heating coil 127. The first portion comprises a first arc edge 127a, a second arc edge 127b and a third arc edge 127c in order from outside to inside. The first arc edge 127a, the second arc edge 127b, and the third arc edge 127c may have a concentric circular shape. One end of the first arc edge 127a is connected to one end of the second arc edge 127b, the other end of the second arc edge 127b is connected to the third arc edge 127c, and the first part is connected to the second part through the third arc edge 127c to form a circular heating coil 127. The other end of the first arc edge 127a is connected to the heating electrode 126.

As shown in FIG. 3, after the plurality of heating electrodes 126 are connected to an external power supply, the heating coil 127 starts heating the base 111. By heating the coil 127, the heating uniformity to the base 111 can be ensured, so that the temperature uniformity of the substrate 112 can be ensured. The heating coil 127 may be disposed, for example, on a pyrolyzed boron nitride substrate. In some embodiments, the shape and number of turns of the heating coil 127 may be adjusted to further improve the uniformity of heating. In one embodiment, the backside of the base 111 may be provided with seven, eight or more of the heating electrodes 126.

Figure 5:
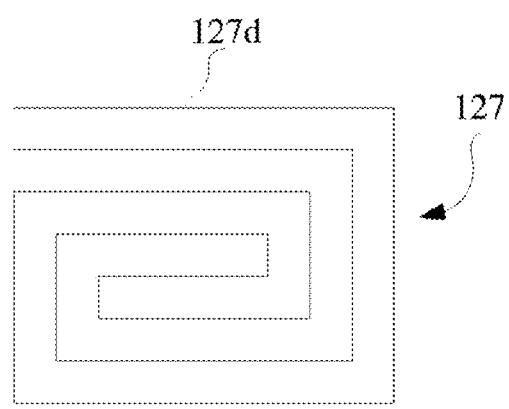
FIG. 5 is another schematic diagram of a heater according to an embodiment of the present disclosure.

Referring to FIG. 5, in some embodiments, in order to further improve the heating uniformity of the base 111, the heating coil 127 may be adjusted, for example, the heating coil 127 is formed by bending a paint wire 127d, and the cross section of the paint wire 127d may be circular or square or flat. The number of underwindings of the paint wire 127d may be adjusted according to practical situations, or the heating coil 127 may be arranged in an asymmetric shape, or the paint wire 127d may be made in other shapes.

Figure 6:
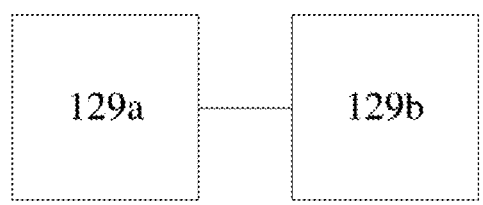
FIG. 6 is a schematic diagram of a temperature measurement apparatus in an embodiment of the present disclosure.

Referring to FIGS. 3 and 6, in the present embodiment, a temperature measurement point 128 may be further provided near the heating electrode 126, and the temperature measurement point 128 is connected to the temperature measurement apparatus. In the present embodiment, the temperature measurement apparatus includes a detection circuit 129a and a temperature collection module 129b which are connected in sequence. The detection circuit 129a may be constituted by, for example, two conductors of different materials, and one end (working end) of the detection circuit 129a is in contact with the temperature measurement point 128 to generate a thermoelectric signal. The temperature collecting module 129b is configured to receive the thermoelectric signal through the first detection point and the second detection point at the other end (free end) of the detection circuit 129a, and calculate the temperature of the temperature measuring point 128 according to the thermoelectric signal. Since the detection circuit 129a is composed of a plurality of conductors of different materials, the thermoelectric signal affects the potential difference between the first detection point and the second detection point, and the temperature collecting module 129b calculates the temperature of the temperature detection point 128 by calculating the potential difference between the first detection point and the second detection point. In this embodiment, the temperature measuring device may be, for example, a thermocouple. In some embodiments, other thermometers may be used to measure the temperature on the base 111, for example, the temperature on the base 111 may also be measured by an infrared thermometer. In this embodiment, the temperature measurement apparatus can learn in real time the temperature conditions at various positions of the base 111, and can ensure that the temperature on the base 111 is in a uniform and stable state, and also ensure that the substrate 112 on the base 111 is in a uniform and stable temperature environment.

Referring back to FIG. 1, in the present embodiment, the target 123 may be disposed at the top of the growth chamber 110, and the target 123 is electrically connected to a sputtering power supply (not shown). During magnetron sputtering, the sputtering power supply outputs a sputtering power to the target 123, so that the plasma formed in the growth chamber 110 etches the target 123. In some embodiments, the material of the target 123 is selected from, but is not limited to, the group of substantially pure aluminum, an aluminum-containing alloy, an aluminum-containing compound such as AlN, AlGa, Al$_2$O$_3$, and an aluminum-containing target doped with Group II/IV/VI elements to improve layer compatibility and device performance. In some implementations, dopant atoms may be added to the deposited film by doping the target material and/or delivering the dopant gas to the generated sputtering plasma to adjust the electrical, mechanical and optical properties of the deposited PVD AlN buffer layer, e. g. such that the film is adapted to fabricate a group III-nitride device thereon. In some embodiments, the thickness of the thin film (e. g. AlN buffer layer) formed within the growth chamber 110 is between 0.1-1000 nanometers.

Referring to FIG. 1, in the present embodiment, the magnet 122 may be located above the target 123, the magnet 122 rotates about the central axis of the target 123, for example, the magnet 122 rotates about the central axis of the target 123 by 90 degrees or 180 degrees or 360 degrees or any angle, or the magnet 122 may rotate about the central axis of the target 123 by any angle. In the present embodiment, the magnet 122 is connected to a driving mechanism, and the driving mechanism drives the magnet 122 to rotate, and the magnet 122 can also reciprocate upward and downward. The driving mechanism comprises a first electric motor 114, a transmission lever 115, a second electric motor 116 and a lifting assembly, wherein the first electric motor 114 is connected to the second electric motor 116 via the transmission lever 115. The first electric motor 114 is, for example, a servo motor or a stepping motor, the transmission rod 115 may be, for example, a wire rod, and the second electric motor 116 may be, for example, a rotating servo motor. Thus, the first electric motor 114 can drive the second electric motor 116 to reciprocate upward and downward via the transmission lever 115, and the first electric motor 114 drives the transmission lever 115 forward. or the reverse rotation may reciprocate the second electric motor 116. In various embodiments, the lift assembly includes an outer shaft 118 and an inner shaft 119 disposed within the outer shaft 118. The inner shaft 119 allows movement along the outer shaft 118 while the outer shaft 118 is disposed on the growth chamber 110, and a part of the inner shaft 119 is disposed in the growth chamber 110. One end of the inner shaft 119 is further provided with a fixing device 121, and the magnet 122 is fixed to one end of the inner shaft 119 by using the fixing device 121. Meanwhile, a sealing device 120 is further provided around the outer shaft 118 in contact with the growth chamber 110, and a vacuum sealing is achieved through the sealing device 120. The sealing device 120 may be, for example, a sealing ring. In various embodiments, the second electric motor 116 is connected to the inner shaft 119 via an output shaft 117, and the output shaft 117 is partially located within the outer shaft 118. The second electric motor 116 can drive the inner shaft 119 to rotate through the output shaft 117, and the first electric motor 114 drives the second electric motor 116 to reciprocate upward and downward through the transmission rod 115. Thus, when the first electric motor 114 and the second electric motor 116 are simultaneously opened, the inner shaft 119 can reciprocate upward and downward. The rotational movement can also be performed, so that the magnet 122 on the inner shaft 119 can be driven to also perform corresponding movement. When the first electric motor 114 is turned on and the second electric motor 116 is turned off, the inner shaft 119 can only perform up and down reciprocating motion. When the first electric motor 114 is turned off and the second electric motor 116 is turned on, the inner shaft 119 may only be rotationally moved, whereby the worker may choose to turn on and/or turn off the first electric motor 114 and/or the second electric motor 116 depending on the implementation.

In some implementations, when the magnet 122 is in rotational motion, the target 123 may remain in a stationary state and may also rotate around its central axis, but there may be a difference in rotational speed between the target 123 and the magnet 122. When the magnet 122 is rotated, the target 123 may be driven to rotate around its central axis by a power source such as a motor, so that there is a velocity difference between the target 123 and the magnet 122. The relative movement between the target 123 and the magnet 122 enables the magnetic field generated by the magnet 122 to uniformly scan the sputtering surface of the target 123. Furthermore, in the present embodiment, the electric field acts on the secondary electrons simultaneously with the magnetic field uniformly distributed on the sputtering surface of the target 123. The movement trajectory of the secondary electrons may be adjusted to increase the number of collisions between the secondary electrons and the argon atom, so that the argon atom near the sputtering surface of the target 123 is sufficiently ionized. to produce more argon ions; Furthermore, by bombarding the target 123 with more argon ions, the utilization rate of sputtering and uniformity of sputtering of the target 123 can be effectively improved, and the quality and uniformity of the deposited thin film can be further improved.

Figure 7:
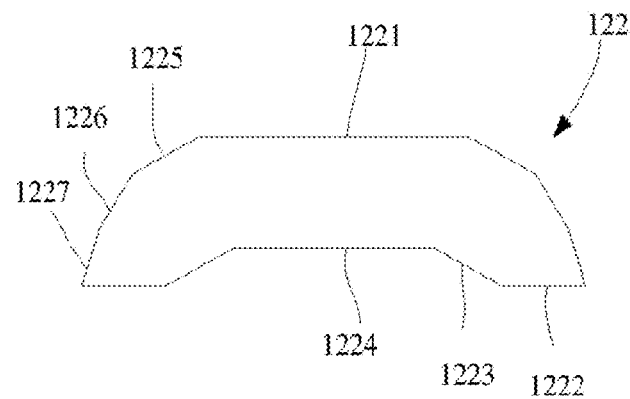
FIG. 7 is a schematic diagram of a magnet in an embodiment of the present disclosure.

Referring to FIG. 7, in the present embodiment, the magnet 122 includes a first portion, a second portion, and a plurality of third portions connected between the first portion and the second portion. The first part comprises a first magnetic unit 1221, and the second part comprises a second magnetic unit 1222, a third magnetic unit 1223 and a fourth magnetic unit 1224, and the third part comprises a fifth magnetic unit 1225, a sixth magnetic unit 1226 and a seventh magnetic unit 1227. In the present embodiment, a plurality of magnetic units are spliced into symmetrical annular magnets 122, and an arc-shaped magnetic field can be formed when the magnets 122 are stationary, and a uniform magnetic field can be formed when the magnets 122 rotate around the target 123. The uniform magnetic field can provide uniformity of sputtering of the target, thereby achieving uniformity of coating.

Figure 8:
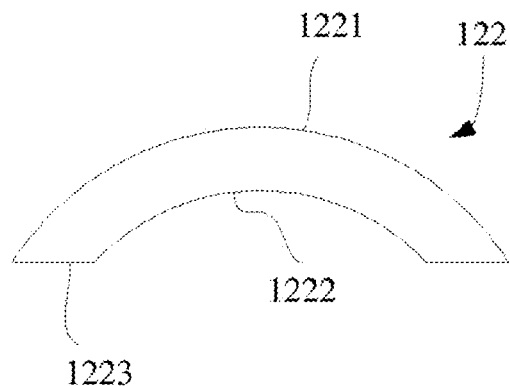
FIG. 8 is another schematic diagram of a magnet in an embodiment of the present disclosure.

Referring to FIG. 8, in some embodiments, the magnet 122 may also be an arc structure, and the magnet 122 includes a first magnetic unit 1221, a second magnetic unit 1222 and a plurality of third magnetic units 1223, in which the first magnetic unit 1221 is connected to the second magnetic unit 1222 through the third magnetic unit 1223; The first magnetic unit 1221 and the second magnetic unit 1222 are, for example, arc-shaped, and the first magnetic unit 1221 and the second magnetic unit 1222 are of the same arc-shaped structure. The third magnetic unit 1223 is connected between the first magnetic unit 1221 and the second magnetic unit 1222, and is symmetrical about a central axis of the first magnetic unit 1221 and the second magnetic unit 1222. An arc-shaped magnetic field may be formed when the magnet 122 is stationary, and a uniform magnetic field may be formed when the magnet 122 rotates about the target 1223. The uniform magnetic field can provide uniformity of sputtering of the target, thereby achieving uniformity of coating.

Figure 9:
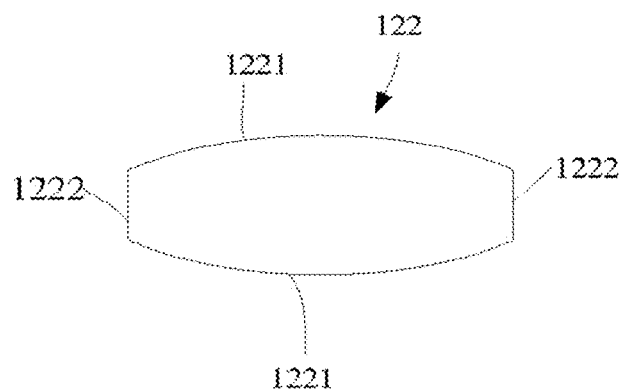
FIG. 9 is still another schematic diagram of a magnet in an embodiment of the present disclosure.

Referring to FIG. 9, in some embodiments, the magnet 122 may also be an approximate rectangular structure, and the magnet 122 includes a plurality of first magnetic units 1221 disposed opposite to each other and a plurality of second magnetic units 1222 disposed opposite to each other. The first magnetic unit 1221 is connected to the second magnetic unit 1222, and the first magnetic unit 1221 may be an arc structure. Furthermore, the first magnetic unit 1221 may be recessed inward or outward, and the plurality of first magnetic units 1221 may also be an arc structure recessed inward or outward at the same time. The plurality of first magnetic units 1221 may also include different arc structures. The magnet 122 may have a my-symmetrical structure or an asymmetrical structure, and may form an arc-shaped magnetic field when the magnet 122 is stationary, and may form a uniform magnetic field when the magnet 122 rotates around the target 123. The uniform magnetic field can provide uniformity of sputtering of the target, thereby achieving uniformity of coating.

Figure 10:
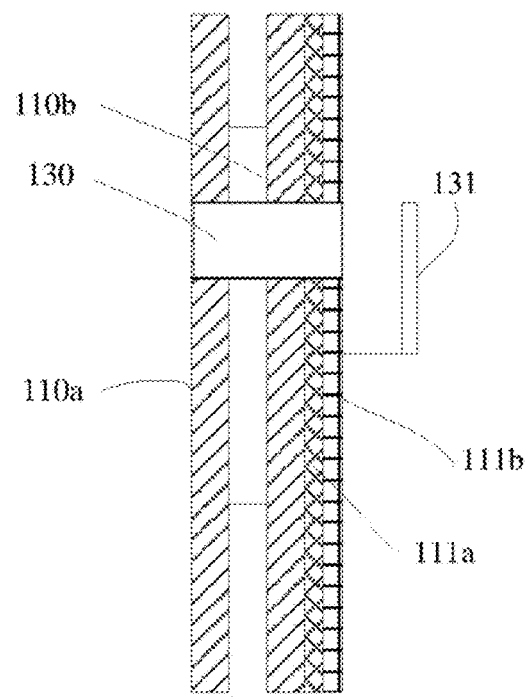
FIG. 10 is a schematic diagram of a reflective plate in an embodiment of the present disclosure.

Referring to FIG. 10, in some embodiments, the growth chamber 110 may include an outer wall 110a and an inner wall 110b. The inner wall 110b is disposed in the outer wall 110a. The inner wall 110b is fixed in the outer wall 110a by a plurality of bolts. Therefore, the outer wall 110a and the inner wall 110b form an annular structure. When the semiconductor equipment 100 is in operation, the annular structure may reduce heat dissipation. The inner wall 110b is further provided with a multi-layer reflective plate, for example, the inner wall 110b is provided with a first reflective plate 111a and a second reflective plate 111b in sequence from inner to outer, and the first reflective plate 111a and the second reflective plate 111b are successively bonded to each other; during deposition, the base 112 is in a high-temperature state, and the multi-layer reflective plate is arranged on the inner wall 110b to timely insulate the radiant heat, thereby preventing the heat from. The first reflective plate 111a and the second reflective plate 111b are circularly disposed on the inner wall 110b. The first reflective plate 111a and the second reflective plate 111b may be composed of an integral thermal insulation material or a plurality of thermal insulation materials. In this embodiment, two reflective plates are disposed on the inner wall 110b, and in some embodiments, three or four or more reflective plates may be disposed.

Figure 11:
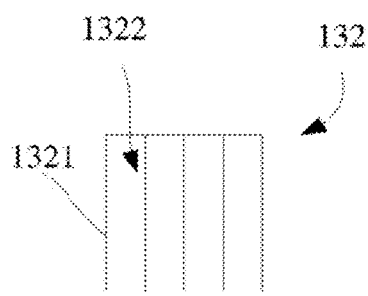
FIG. 11 is a schematic diagram of a hoop according to an embodiment of the present disclosure.

Referring to FIGS. 10-11, in the present embodiment, a plurality of hoops 132 are provided on the inner wall 110b of the growth chamber 110, and the hoops 132 are used for fixing the first reflective plate 111a and the second reflective plate 111b. The clamping hoop 132 comprises a plurality of limiting strips 1321, two adjacent limiting strips 1321 form a clamping slot 1322, and a limiting strip 1321 at one end of the clamping hoop 132 is arranged on the inner wall 110b, and then the first reflecting plate 111a and the second reflecting plate 111b are arranged in the corresponding clamping slot 1322. In this embodiment, the first reflective plate 111a and the second reflective plate 111b are disposed in adjacent card clamping slots 1322, and in some embodiments, the first reflective plate 111a and the second reflective plate 111b may be disposed in corresponding card clamping slots 1322 at intervals. The two ends of the first reflective plate 111a and the second reflective plate 111b respectively include a bending portion (not shown), and the bending portions at the two ends of the first reflective plate 111a protrude from the clamping slot 1322, so that the first reflective plate 111a is circularly disposed on the inner wall 110b. In the present embodiment, for example, six hoops 132 are provided on the inner wall 110b, and the hoops 132 are uniformly provided on the inner wall 110b. In the present embodiment, the outer wall 110a, the inner wall 110b, the first reflective plate 111a and the second reflective plate 111b are provided with through holes 130 of the same size, the through holes 130 are located higher than the base 111, and a high-temperature resistant transparent material is provided in the through holes 130 of the outer wall 110a and the inner wall 110b. Thus, the worker knows the growth condition in the growth chamber 110 from the outside of the growth chamber 110. A shutter 131 is also provided on the inner wall 110b.

Figure 12:
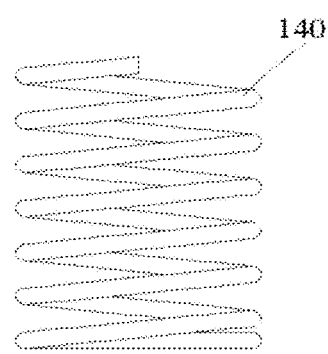
FIG. 12 is a schematic diagram of a cooling device in an embodiment of the present disclosure.

Referring to FIG. 12, the outer wall 110a of the growth chamber 110 is further provided with a cooling device 140 for absorbing heat dissipated to the outer wall 110a, and preventing the outer wall 110a from deforming due to high temperature. In the present embodiment, the cooling device 140 is, for example, a water pipe surrounding the outer wall 110a, one end of the water pipe is a water inlet, the other end of the water pipe is a water outlet, and the temperature of the outer wall 110a is effectively absorbed by forming the water pipe into a circulating water path.

Figure 13:
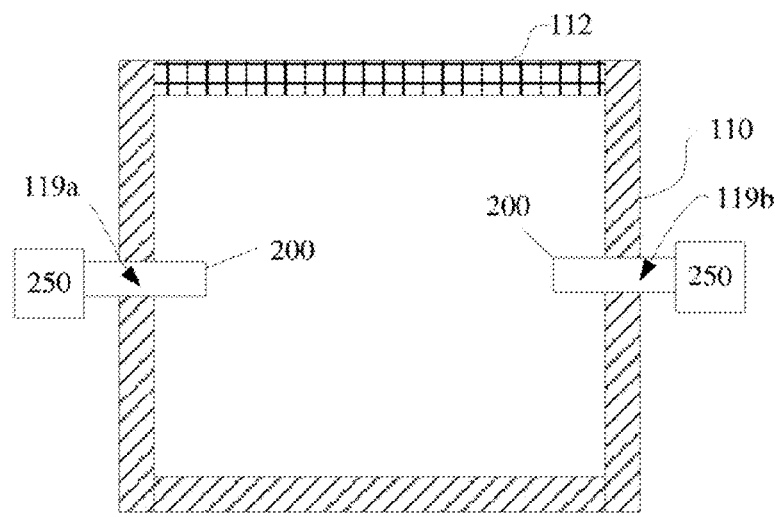
FIG. 13 is a schematic diagram of an air inlet in an embodiment of the present disclosure.
Figure 14:
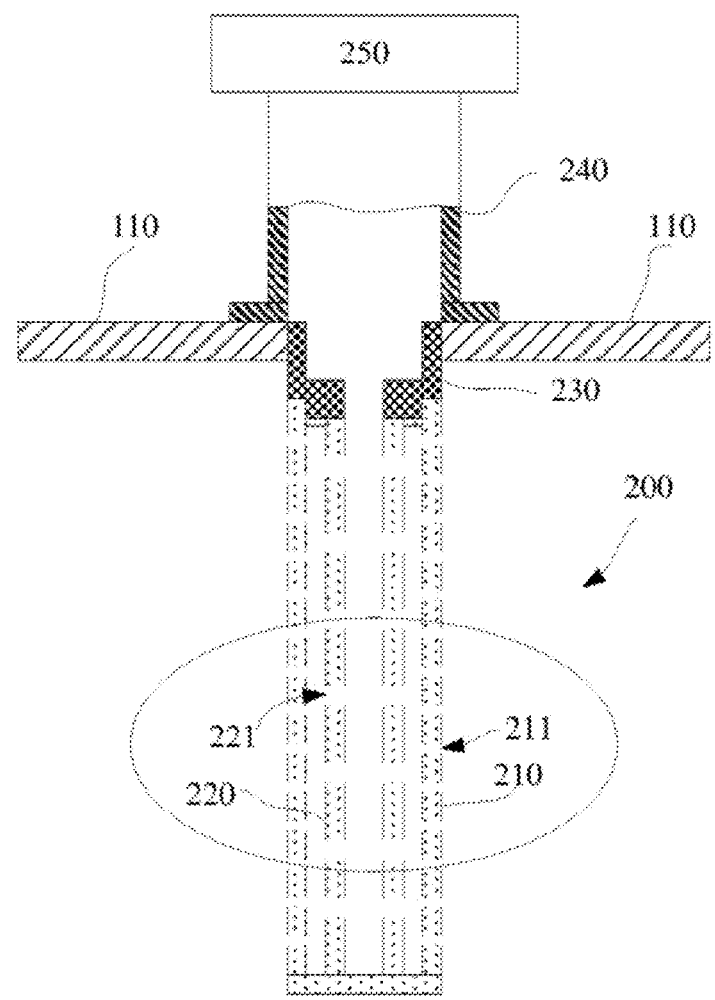
FIG. 14 is a schematic diagram of an intake duct in an embodiment of the present disclosure.

Referring to FIGS. 1 and 13-14, in the present embodiment, the growth chamber 110 includes at least one gas inlet, the gas inlet is connected to an external gas source 124, and the external gas source 124 sends a gas into the growth chamber 110 through the gas inlet. At least one pumping port is provided on the growth chamber 110, the pumping port is connected to the vacuum pump 125, and the vacuum pump 125 performs a vacuum pumping process on the growth chamber 110 through the pumping port. In some embodiments, the growth chamber 110 comprises at least two air inlets, for example, a first air inlet 119a and a second air inlet 119b, the first air inlet 119a and the second air inlet 119b are respectively disposed on opposite sides of the growth chamber 110, the first air inlet 119a and the second air inlet 119b are symmetrical to each other, and gas can be input into the growth chamber 110 through the first air inlet 119a and the second air inlet 119b. In the present embodiment, the first air inlet 119a and the second air inlet 119b are respectively connected to an intake duct 200. The intake duct 200 comprises an outer sleeve 210 and an inner sleeve 220. The inner sleeve 220 is arranged in parallel in the outer sleeve 210. One end of the inner sleeve 220 may be connected to one end of the outer sleeve 210 to form a closed annular chamber. One end of the intake duct 200 is connected to the intake port, and the other end of the intake duct 200 may contact the inner wall of the growth chamber 110 or the other end of the intake duct 200 may have a certain gap with the inner wall of the growth chamber 110. The outer sleeve 210 comprises a plurality of first exhaust holes 211, and the outer sleeve 210 comprises a plurality of second exhaust holes 221. The plurality of first exhaust holes 211 are respectively uniformly disposed on the outer sleeve 210, and the plurality of second exhaust holes 221 are respectively uniformly disposed on the inner sleeve 220. The size of the second exhaust hole 221 is greater than or equal to the size of the first exhaust hole 211, and therefore the first exhaust hole 211 and the second exhaust hole 221 may be overlapped or partially overlapped with each other. In the present embodiment, the size of the first exhaust hole 211 is smaller than the size of the second exhaust hole 221, and the first exhaust hole 211 and the second exhaust hole 221 are staggered with each other, and the first exhaust hole 211 and the second exhaust hole 221 are, for example, a circular shape, a rectangular shape, a triangular shape, or a combination thereof. The external airflow first enters the inner sleeve 220, and then enters the annular chamber through the second exhaust hole 221 on the inner sleeve 220. Then, the first exhaust hole 211 on the outer sleeve 210 enters the growth chamber 110 uniformly, so that the flow rate of the airflow entering the growth chamber 110 can be slowed to a great extent without disturbance. Thus, the vibration of the apparatus and the product caused by the air flow impact is greatly reduced, and the hard damage of the apparatus and the damage of the product are avoided. Meanwhile, the airflow entering the growth chamber 110 is uniform, and the uniformity of the coating can also be improved.

Referring to FIG. 14, in the present embodiment, the intake duct 200 is connected to the inlet via a branch pipe 230, and one end of the branch pipe 230 is fixed to the inlet. The other end of the branch pipe 230 is connected to the outer sleeve 210, and an exhaust pipe 240 is further provided on the outer wall of the growth chamber 110. The exhaust pipe 240 is sealed with the outer wall of the growth chamber 110, and the exhaust pipe 240 is disposed on the air inlet. The exhaust pipe 240 is further connected to an external gas source 250, and the gas is delivered into the branch pipe 230 through the exhaust pipe 240. After the gas enters the inner sleeve 220, the gas enters the outer sleeve 210 through a plurality of second exhaust holes 221 in the inner sleeve 220. Then, a plurality of first exhaust holes 211 on the outer sleeve 210 enter the growth chamber 110, so that the flow rate of the airflow entering the growth chamber 110 can be slowed to a great extent without disturbance. Thus, the vibration of the apparatus and the product caused by the air flow impact is greatly reduced, and the hard damage of the apparatus and the damage of the product are avoided. Meanwhile, the airflow entering the growth chamber 110 is uniform, and the uniformity of the coating can also be improved. In some embodiments, a gas flow conditioner may also be disposed on the manifold 230 or the exhaust pipe 240, and the gas flow conditioner may be used to adjust the gas flow rate within the intake pipe 200.

Figure 15:
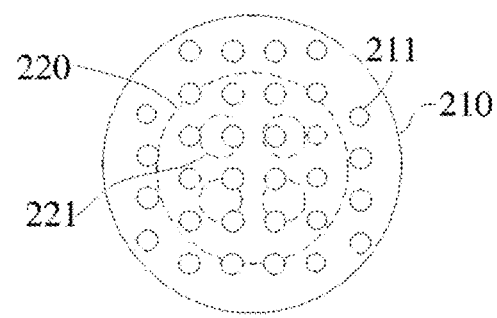
FIG. 15 is a bottom schematic diagram of the intake duct in an embodiment of the present disclosure.

Referring to FIG. 15, in some embodiments, there is a gap between the bottom of the inner sleeve 220 and the bottom of the outer sleeve 210, such as 2-3 mm. A plurality of second exhaust holes 221 are disposed on the bottom of the inner sleeve 220, and a plurality of first exhaust holes 211 are disposed on the bottom of the outer sleeve 210, and at the same time, the diameter of the second exhaust holes 221 is greater than the diameter of the first exhaust holes 211, so the relative density of the first exhaust holes 211 is greater than the relative density of the second exhaust holes 221, and at the same time, the first exhaust holes 211 and the second exhaust ho. In the present embodiment, a plurality of through holes are provided at one end of the intake duct 200, so that the uniformity of the gas flow into the growth chamber 110 can be further improved.

Figure 16:
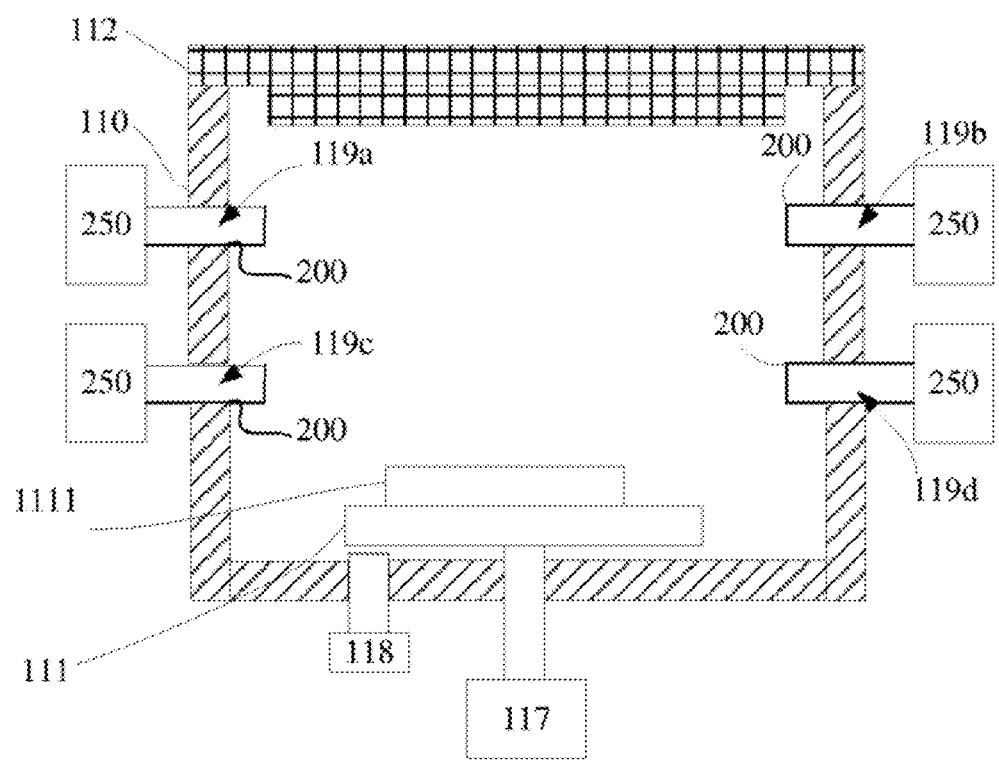
FIG. 16 is another schematic diagram of an air inlet in an embodiment of the present disclosure.

Referring to FIG. 16, in some embodiments, a plurality of air inlets are provided on the sidewalls of the growth chamber 110, for example, the first air inlet 119a, the second air inlet 119b, the third air inlet 119c and the fourth air inlet 119d, respectively. The four gas inlets are respectively connected to a gas intake duct 200, and the gas is inputted to the growth chamber 110 through the four gas inlets, thereby improving the uniformity of the gas in the growth chamber 110, thereby improving the uniformity of the plating film.

Figure 17:
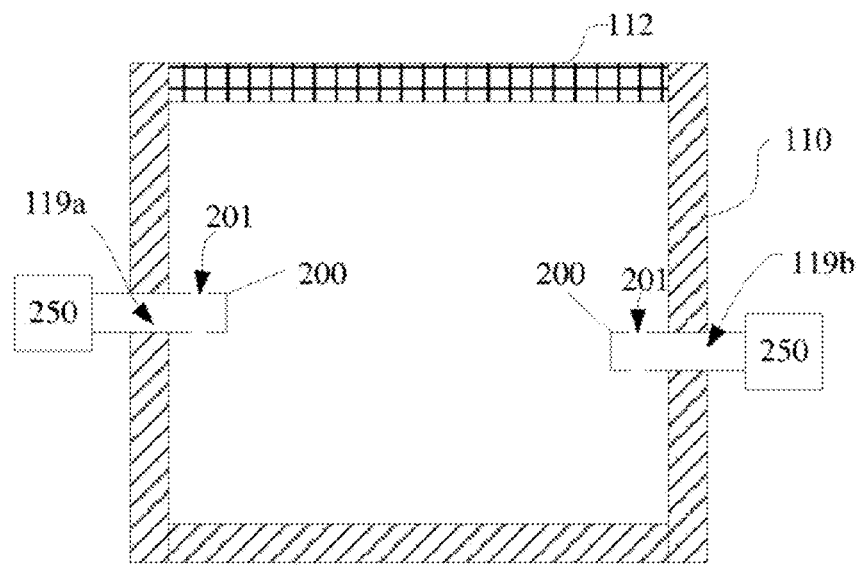
FIG. 17 is another schematic diagram of an air inlet in an embodiment of the present disclosure.

Referring to FIG. 17, in some embodiments, two air inlets are provided on the sidewall of the growth chamber 110, which are a first air inlet 119a and a second air inlet 119b, respectively. The first air inlet 119a and the second air inlet 119b are staggered from each other. The first air inlet 119a and the second air inlet 119b respectively access an intake duct 200. The intake duct 200 comprises a plurality of air exhaust holes 201, so that the gas enters the growth chamber 110 and becomes more uniform. The diameter of the intake duct 200 connected to the first inlet port 119a and the second inlet port 119b may be the same or different, so as to adjust the flow rate of the gas.

Figure 18:
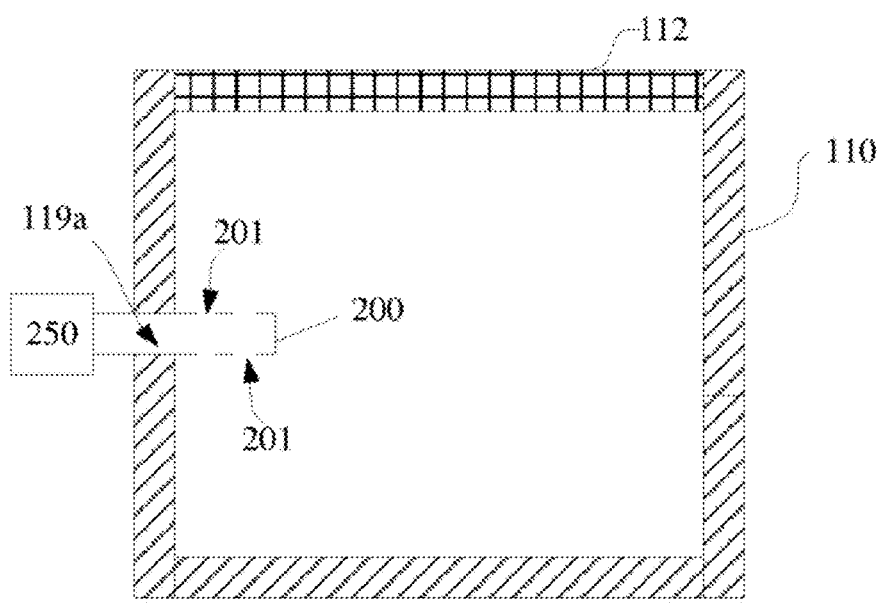
FIG. 18 is still another schematic diagram of an air inlet in an embodiment of the present disclosure.

Referring to FIG. 18, in some embodiments, an firs air inlet 119a is provided on a sidewall of the growth chamber 110, an air inlet pipe 200 is connected to the first air inlet 119a, a plurality of air exhaust holes 201 are included in the air inlet pipe 200, and the diameter of the plurality of air exhaust holes 201 may be the same or different, so as to adjust the flow rate of the gas.

Figure 19:
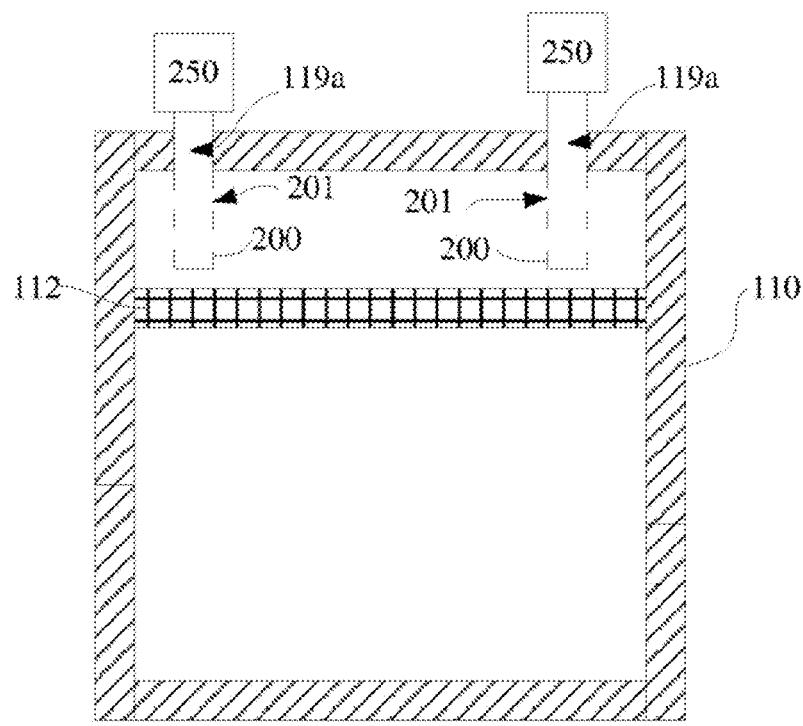
FIG. 19 is even still another schematic diagram of an air inlet in an embodiment of the present disclosure.

Referring to FIG. 19, in some embodiments, a plurality of air inlets are provided on the top of the growth chamber 110, which are a first air inlet 119a and a second air inlet 119b, respectively. The first air inlet 119a and the second air inlet 119b are respectively connected to an intake duct 200, and the intake duct 200 is located above the target 112. The intake duct 200 comprises a plurality of exhaust holes 201, so that the gas enters the growth chamber 110 and becomes more uniform. The sputtering uniformity of the target 112 and the utilization rate of the target 112 are improved to improve the uniformity of the coating. The diameter of the intake duct 200 connected to the first inlet port 119a and the second inlet port 119b may be the same or different, so as to adjust the flow rate of the gas.

Figure 20:
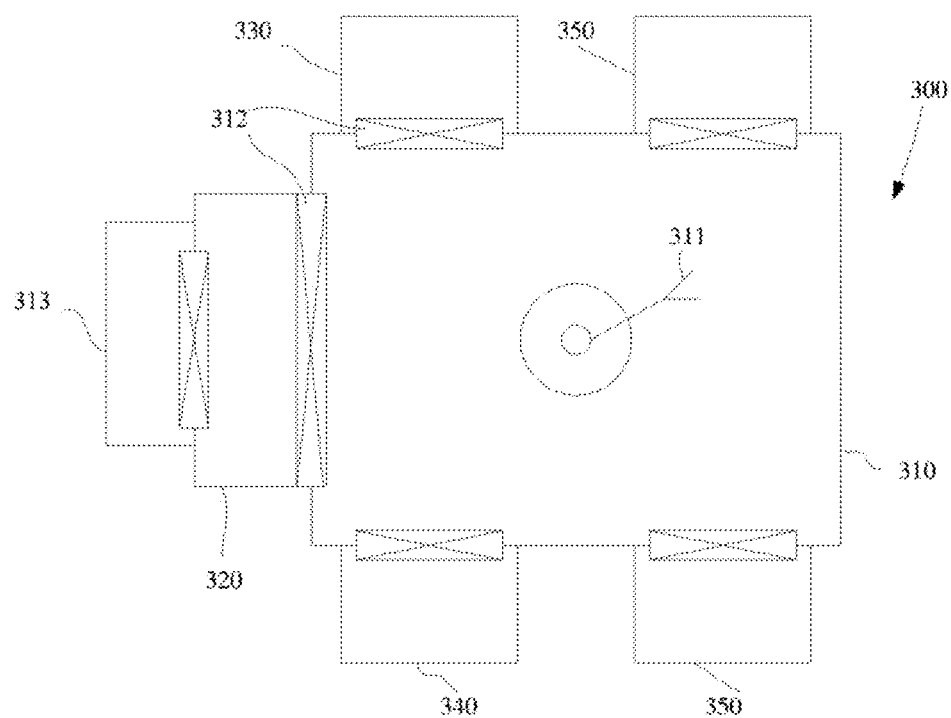
FIG. 20 is a schematic diagram of a semiconductor equipment provided by an embodiment of the present disclosure.

Referring to FIG. 20, in one embodiment, a semiconductor equipment 300 is further provided. The semiconductor equipment 300 comprises a transfer chamber 310, a transition chamber 320, a cleaning chamber 330, a preheating chamber 340, and a plurality of growth chamber 350. The transfer chamber 310 may include a substrate loading/unloading robot 311 operable to transfer a substrate between the transition chamber 320 and the growth chamber 350. In some embodiments, the semiconductor device further comprises a manufacturing interface 313, which comprises a cassette and a substrate loading and unloading robot arm (not shown) in the manufacturing interface 313, the cassette contains a substrate to be processed, and the substrate loading and unloading robot arm may comprise a substrate planning system to load the substrate in the cassette into the transition chamber 320.

Figure 21:
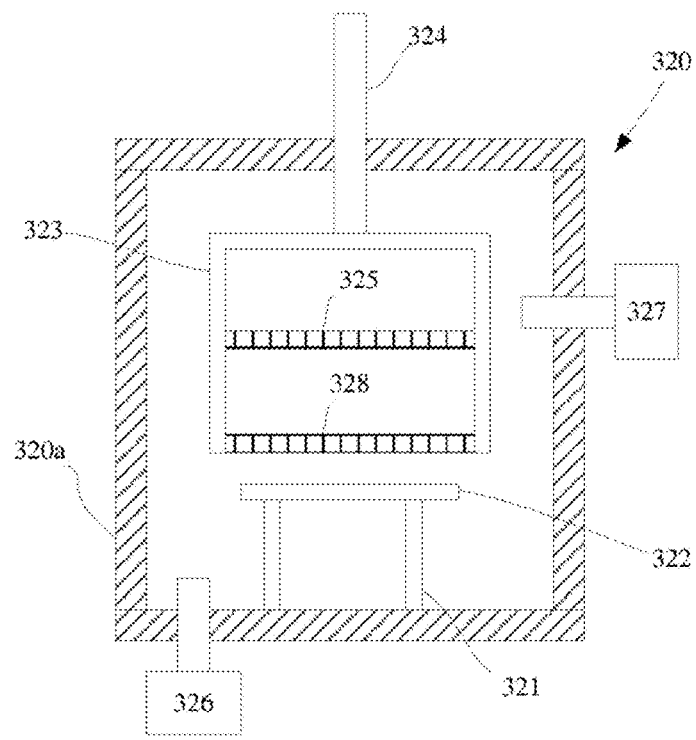
FIG. 21 is a schematic diagram of a transition chamber in an embodiment of the present disclosure.

Referring to FIG. 21, the transition chamber 320 is connected to the transfer chamber 310, and the transition chamber 320 is located between the manufacturing interface 313 and the transfer chamber 310. The transition chamber 320 provides a vacuum interface between the manufacturing interface 313 and the transfer chamber 310. The transition chamber 320 may include a housing 320a, for example, a sealed cylinder, and at the same time, an exhaust port and an exhaust port are provided on a sidewall of the housing 320a. A cooling plate 322 is disposed in the transition chamber 320, and the cooling plate 322 is fixed to the bottom of the housing 320a through a plurality of brackets 321. The substrate may be cooled by the cooling plate 322. In this embodiment, the cooling plate 322 may be, for example, cylindrical or rectangular or other shapes, and the cooling plate 322 may be fixed in the housing 320a by, for example, four brackets 321.

Figure 22:
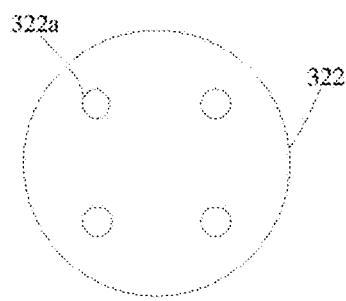
FIG. 22 is a schematic diagram of a cooling plate in an embodiment of the present disclosure.

Referring to FIG. 22, the cooling plate 322 may be cylindrical, and the cooling plate 322 includes a plurality of internally threaded holes 322a, for example, four internally threaded holes 322a. The two ends of the bracket 321 are provided with corresponding external threads, so that one end of the bracket 321 can be provided in the internal threaded hole 322a.

Figure 23:
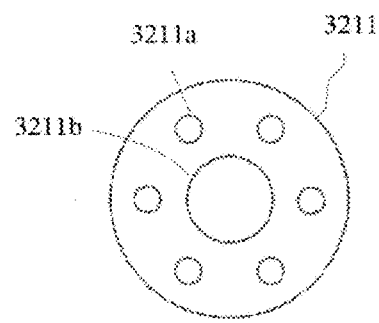
FIG. 23 is a schematic diagram of a base in an embodiment of the present disclosure.

Referring to FIG. 23, the other end of the bracket 321 is fixed in the housing 320a through the pedestal 3211, and the pedestal 3211 includes a plurality of first threaded holes 3211a and a second threaded hole 3211b, wherein the second threaded holes 3211b are located at the center position of the pedestal 3211, and the plurality of first threaded holes 3211a are uniformly disposed around the second threaded holes 3211b. The other end of the bracket 321 is disposed in the second threaded hole 3211b, and a plurality of first threaded holes 3211a are used for placing a plurality of nuts, so that the pedestal 3211 can be fixed in the housing 320a. In the present embodiment, six first threaded holes 3211a are included in the pedestal 3211, and in some embodiments, four or more first threaded holes 3211a may be provided in the pedestal 3211.

Referring to FIG. 21, at least one stage 325 is disposed in the housing 320a, for example, two stages are disposed, for example, a first stage 325 and a second stage 328, the first stage 325 and the second stage 328 are fixed on the support plate 323, and the first stage 325 is located on the second stage 328. The support plate 323 comprises a main rod and two side plates, the two side plates are respectively arranged at two ends of the main rod, and the first stage 325 and the second stage 328 are arranged between the two side plates. The support plate 323 is further connected to a control rod 324. Specifically, the control rod 324 is connected to the main rod of the support plate 323, and one end of the control rod 324 is further located outside the housing 320a, and the control rod 324 can drive the support plate 323 to move up and/or down. In the present embodiment, the control rod 324 is connected to a driving unit (not shown), and the driving unit is used for controlling the control rod 324 to rise and/or fall. The control rod 324 is connected to a driving unit (not shown), and the driving unit is used for controlling the control rod 324 to rise and/or fall. When the drive unit control rod 324 is lowered, the second stage 328 may contact the cooling plate 322.

Figure 24:
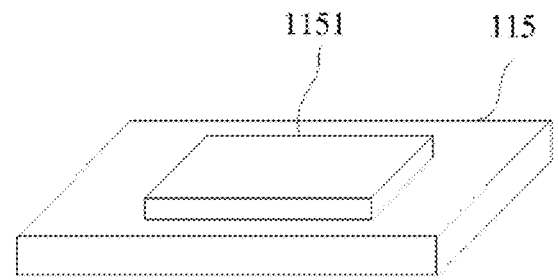
FIG. 24 is a schematic diagram of a stage and a tray in an embodiment of the present disclosure.

Referring to FIG. 24, at least one tray may be placed on the first stage 325 and the second stage 328, and the tray is used for placing a substrate, for example, taking the first stage 325 as an example, at least one tray 3251 may be placed on the first stage 325, for example, two or more trays 3251 may be placed.

Referring again to FIG. 21, the transition chamber 320 can further include an evacuation port, which is connected to a vacuum pump 327, and evacuates the transition chamber 320 through the vacuum pump 327. In this embodiment, a vacuum evacuation process is implemented in a plurality of steps, for example, the transition chamber 320 is first evacuated to $1 \times 10^{-2}$ Pa using a dry pump (Dry Pump). The transition chamber 320 is then drawn to $1 \times 10^{-4}$ Pa or less than $1 \times 10^{-4}$ Pa using a turbo high vacuum pump (Turbo Molecular Pump). After the transition chamber 320 enters the vacuum state, the control rod 324 drives the first stage 325 and the second stage 328 to move along a preset path. For example, the control rod 324 drives upward movement. In the present embodiment, the transition chamber 320 is connected to the transfer chamber, and the substrate loading/unloading robot arm in the transfer chamber transfers the substrate from the transition chamber 320 to the transfer chamber, and then transfers the substrate to other cavities by the substrate loading/unloading robot arm, for example, a preheating chamber, cleans the chamber or growth chamber, and a thin film can be formed on the surface of the substrate within the growth chamber. After the substrate is subjected to the coating operation, the substrate loading/unloading robot in the transfer chamber transfers the substrate to the second stage 328 in the transition chamber 320. Then, the control rod 324 drives the first stage 325 and the second stage 328 to move in the direction opposite to the preset path. For example, the second stage 328 is moved downward to contact the cooling plate 322, and the substrates on the second stage 328 and the second stage 328 are cooled by the cooling plate 322. Meanwhile, an exhaust port is further included on one side of the housing 320a, and the exhaust port is connected to a gas source 326, and when a vacuum process is performed on the transition chamber 320. Firstly, the second stage 328 is driven away from the cooling plate 322 by the control rod 324, so that a preset distance exists between the second stage 328 and the cooling plate 322. The preset pitch is, for example, 5-10 mm, and then nitrogen or argon is introduced into the transition chamber 320 through the exhaust port through the gas source 326. The transitional chamber 320 is subjected to a vacuum breaking process, so as to avoid the substrate from cracking due to the introduction of nitrogen gas while cooling. After the transitional chamber 320 completes the vacuum, the substrate can be removed for storage analysis.

Referring back to FIG. 20, the cleaning chamber 330 is connected to the transfer chamber 310, and the cleaning chamber 330 is located on the sidewall of the transfer chamber 310. When the substrate enters the transition chamber 320, the substrate loading/unloading robot 311 in the transfer chamber 310 then transfers the substrate from the transition chamber 320 to the cleaning chamber 330 for cleaning.

Figure 25:
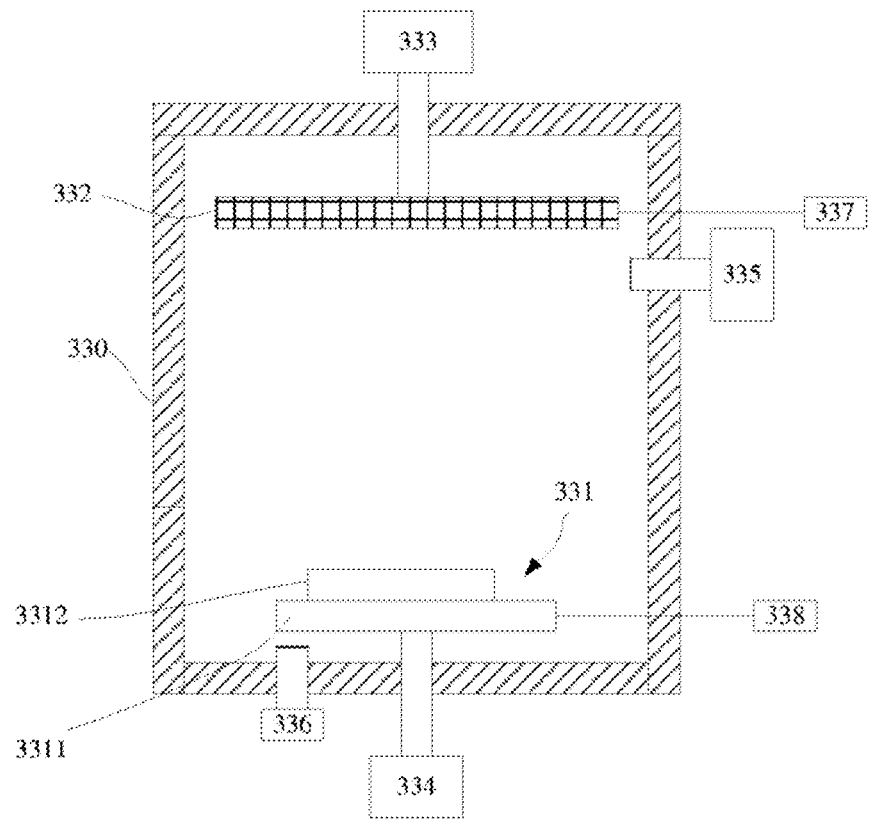
FIG. 25 is a schematic diagram of a cleaning chamber in an embodiment of the present disclosure.

Referring to FIG. 25, a substrate supporting assembly 331 is disposed in the cleaning chamber 330, the substrate supporting assembly 331 is disposed at the bottom of the cleaning chamber 330, and the substrate supporting assembly 331 does not contact the cleaning chamber 330. The substrate supporting assembly 331 comprises a pedestal electrode 3311 and an electrostatic chuck 3312. The electrostatic chuck 3312 is disposed on the pedestal electrode 3311. The electrostatic chuck 3312 is configured to place a substrate. The electrostatic chuck 3312 may place at least one substrate. In some embodiments, a plurality of substrates may be disposed on the electrostatic chuck 3312, and cleaning operations.

Referring back to FIG. 25, the substrate supporting assembly 331 is further connected to a lifting and rotating mechanism 334. Specifically, the lifting and rotating mechanism 334 is connected to the pedestal electrode 3311, and the lifting and lowering of the substrate supporting assembly 331 can be achieved by the lifting and rotating mechanism 334, and the lifting and lowering of the substrate can be achieved indirectly. When the substrate supporting assembly 331 rotates up or down, the distance between the substrate and the electrode 332 changes to adjust the electric field strength between the pedestal electrode 3311 and the electrode 332, so that the plasma can better clean the substrate.

Figure 26:
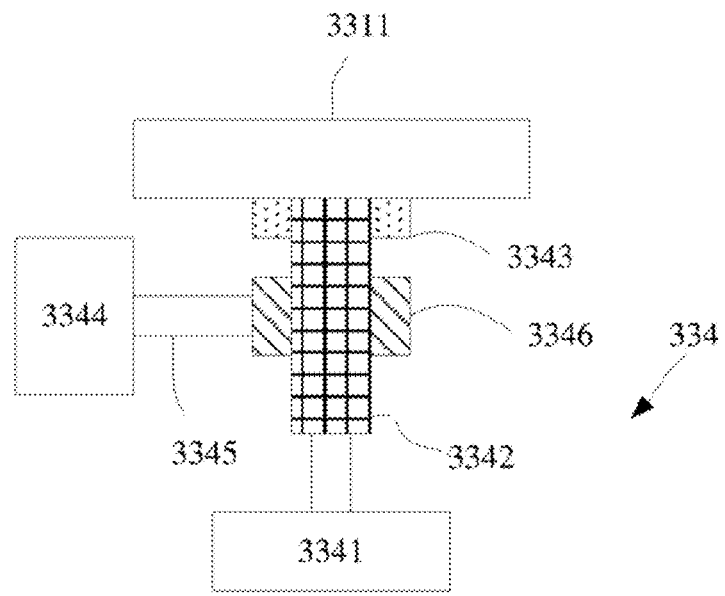
FIG. 26 is a schematic diagram of a lifting and rotating mechanism in an embodiment of the present disclosure.

Referring to FIG. 26, the lifting and rotating mechanism 334 includes an elevating mechanism for driving the pedestal electrode 3311 to move up or down and a rotating mechanism for driving the pedestal electrode 3311 to rotate. The lifting mechanism includes a lifting motor 3341 and a guide rod 3342. One end of the guide rod 3342 is disposed in the cleaning chamber 330 and is connected to the pedestal electrode 3311, and the guide rod 3342 and the pedestal electrode 3311 are sealed with each other by a sealing ring 3343. In the present embodiment, the output shaft of the lifting motor 3341 is connected to the guide rod 3342, so that the pedestal electrode 3311 can be moved up or down by the lifting motor 3341. In the present embodiment, the rotating mechanism includes a rotating motor 3344, a worm 3345, and a worm gear 3346. An output shaft of the rotating motor 3344 is connected to the worm 3345. The worm 3345 connects to the worm gear 3346. The worm gear 3346 is fixed to the guide rod 3342. The worm gear 3346 and the worm 3345 are transmitted in engagement. The rotating motor 3344 is, for example, a stepping electrical machine, and the rotating motor 3344 further rotates a holding position once. A bracket for holding the rotation mechanism is fixed to the guide rod 3342.

Referring back to FIG. 25, the cleaning chamber 330 further includes an electrode 332 disposed opposite to the substrate supporting assembly 331. The electrode 332 does not contact the top of the cleaning chamber 330. In some embodiments, the distance between the electrode 332 and the substrate supporting assembly 331 may be between 2-25 cm, for example, between 10-20 cm, and between 16-18 cm. The electrode 332 is also connected to a lifting and rotating mechanism 333 at the same time, and the lifting and rotating mechanism 333 has the same structure as the lifting and rotating mechanism 334. The lifting and rotating mechanism 333 is not described in this embodiment. When the electrode 332 rotates up or down, the distance between the electrode 332 and the substrate changes to adjust the electric field strength between the electrode 332 and the substrate, so that the plasma can uniformly clean the substrate. When the electrode 332 and the substrate supporting assembly 331 rotate simultaneously, the rotation speed of the electrode 332 and the rotation speed of the substrate supporting assembly 331 may be the same or have a certain speed difference, so that the plasma is cleaned uniformly.

Referring again to FIG. 25, the substrate supporting assembly 331 is further connected to at least one radio frequency bias power supply 338, specifically, the radio frequency bias power supply 338 is connected to the pedestal electrode 3311. The radio frequency of the radio frequency bias power supply 338 may be a high frequency, an intermediate frequency, or a low frequency, for example, the high frequency may be a radio frequency bias source of 13.56 MHz; The intermediate frequency may be a radio frequency bias source of 2 MHz, and the low frequency may be a radio frequency bias source of several 300-500 KHz. Wherein, silicon etching can be performed by using a high frequency radio frequency; dielectric etching can be performed by using an intermediate frequency or a low frequency radio frequency; therefore, radio frequency bias power sources 338 of different frequencies can be connected to the pedestal electrode 3311 at the same time to implement silicon and dielectric etching at the same time. In the present embodiment, the electrode 332 is further connected to at least one radio frequency power supply 337, and the radio frequency of the radio frequency power supply 337 is, for example, 13.56 MHz. The radio frequency power source 337 and the radio frequency bias power supply 338 are both driven by synchronization pulses, and can switch the radio frequency power source 337 simultaneously to reduce the electron temperature in the cleaning chamber 330, and the synchronization pulses have good control over the cleaning (etching depth) of the dense region of the substrate.

Referring again to FIG. 25, the cleaning chamber 330 further includes an air inlet, the air inlet is close to the electrode 332, the air inlet is connected to the gas source 335, and the gas is delivered into the cleaning chamber 330 through the gas source 335, and the gas is a precursor gas for cleaning applications, for example, including a chlorine-containing gas, a fluorine-containing gas, an iodine-containing gas, a bromine-containing gas, a nitrogen-containing gas, and/or other suitable reactive elements. When the radio frequency power source 337 and/or the radio frequency bias power supply 338 are activated, plasma is generated at the substrate surface accessory. In one embodiment, a bias of about −5 volts to −1000 volts is applied to the pedestal electrode 3311 disposed in the substrate supporting assembly 331 for about 1 second to 15 minutes, and the substrate is disposed on the substrate supporting assembly 331. The frequency of the power delivered to the processing region of the washing chamber 330 may vary from about 10 kilohertz to 100 megahertz, and the power level may be between about 1 kilowatts and 10 kilowatts. The cleaning chamber 330 can further include a pumping port close to the substrate supporting assembly 331, and the pumping port is connected to a vacuum pump 336. The vacuum pump 336 is configured to draw the gas in the cleaning chamber 330 so that the pressure of the cleaning chamber 330 enters a predetermined local vacuum range. The predetermined background vacuum range is, for example, $10^{-5}$–$10^{-3}$ Pa, and the precursor gas used for the cleaning application is mixed into the cleaning chamber 330. The pumping speed of the cleaning chamber 330 is adjusted so that the pressure of the cleaning chamber 330 enters a predetermined working pressure range. The predetermined operating pressure range is, for example, 1 Pa to 20 Pa.

Figure 27:
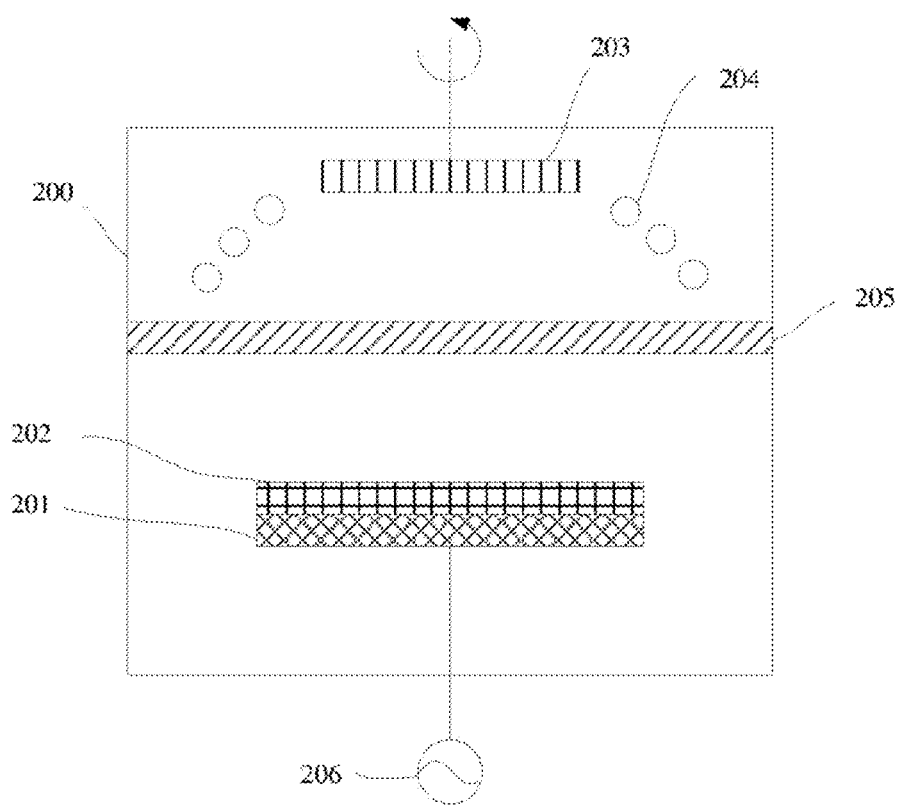
FIG. 27 is another schematic diagram of the cleaning chamber according to an embodiment of the present disclosure.

Referring to FIG. 27, another embodiment of the present invention provides a cleaning chamber, including a reaction chamber 200, a lower electrode 201, a bushing 203, a coil assembly 204, and a radio frequency bias source 206. The reaction chamber 200 has a reaction space in which the generated plasma and other components can be accommodated. The chamber wall of the reaction chamber 200 may be a quartz window 205. The lower electrode 201 may be disposed at the bottom of the reaction chamber 200, but is not in contact with the bottom of the reaction chamber 200. The lower electrode 201 is configured to support the substrate 202 to be etched, and the lower electrode 201 is a conductive plate, for example, may be a ferrite plate, but is not limited thereto. Further, the lower electrode 201 may be connected to a temperature controller (not shown), and the temperature controller controls the temperature of the lower electrode 201 to be within a range of 0-100 degrees centigrade, and the lower electrode 201 may indirectly control the substrate 202 to reach the temperature required for the process.

Figure 28:
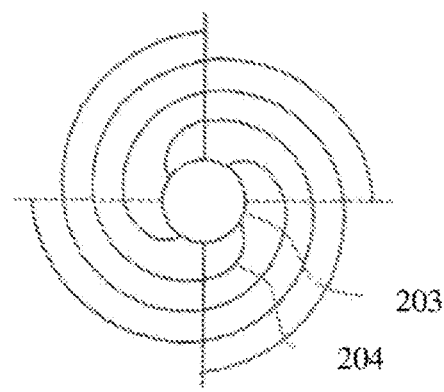
FIG. 28 is a schematic diagram of a bushing and a coil assembly in an embodiment of the present disclosure.

Referring to FIGS. 27 and 28, the liner 203 is disposed at the top central region of the reaction chamber 200, that is, the liner 203 is disposed above the upper chamber wall of the reaction chamber 200 and is not in contact with the upper chamber wall. The bushing 203 may be cylindrical or other shapes. In addition, the bushing 203 is a conductive plate, such as an iron plate, but is not limited thereto. Further, the bushing 203 is a rotatable bushing, and the rotation shaft thereof is perpendicular to the upper wall of the reaction chamber 200, and of course, may also have a certain angle of deflection. The position between the bushing 203 and the coil assembly 204 is not fixedly connected, and the relative position thereof changes by the rotation of the bushing 203 during the etching process, so that the etching rate (cleaning rate) at each position on the substrate 202 will be more balanced.

Referring to FIG. 27, the bushing 203 is further connected to a radio frequency power supply (not shown), and the frequency of the radio frequency power supply is, for example, 13.56 MHz. The lower electrode 201 is connected to at least one radio frequency bias source 206, and only one radio frequency bias source 206 is shown in FIG. 27. The radio frequency of the radio frequency bias source 206 may be a high frequency, an intermediate frequency, or a low frequency. For example, the high frequency may be a radio frequency bias source of 13.56 MHz. The intermediate frequency may be a radio frequency bias source of 2 MHz, and the low frequency may be a radio frequency bias source of 400-600 KHz.

Referring again to FIG. 20, the preheating chamber 340 is connected to the transfer chamber 310, and the preheating chamber 340 is located on the sidewall of the transfer chamber 310. After a necessary semiconductor process is completed in the preheating chamber 340, the substrate loading/unloading robot 311 in the transfer chamber 310 transfers the substrate into the preheating chamber 340, and pre-heats the substrate.

Figure 29:
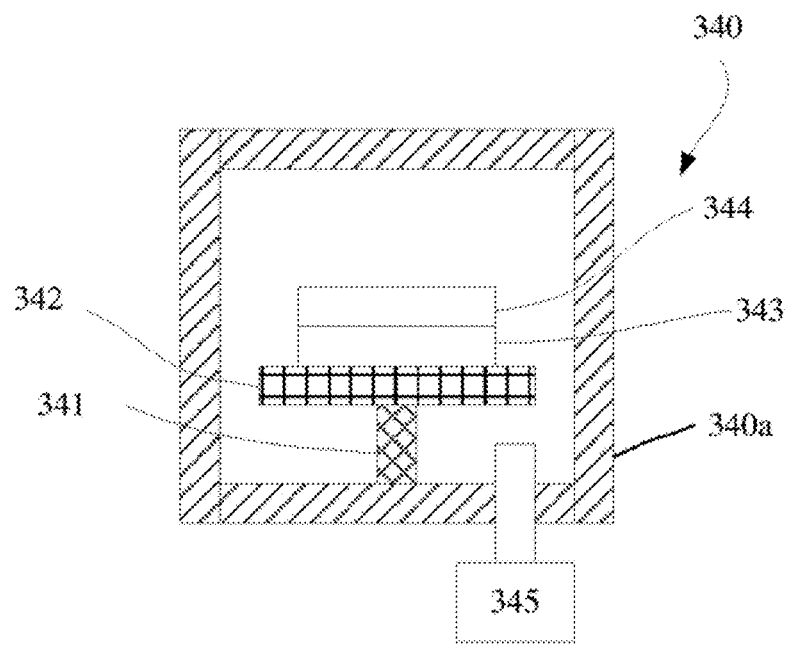
FIG. 29 is a schematic diagram of a preheating chamber in an embodiment of the present disclosure.

Referring to FIG. 29, the preheating chamber 340 includes a housing 340a, and a bracket 341 is provided at the bottom of the housing 340a. The bracket 341 may be, for example, a hollow structure, and then a wire is placed in an internal structure of the bracket 341, and the wire is connected to the heater 342. In this embodiment, the bracket 341 may be, for example, a high temperature resistant material.

Figure 30:
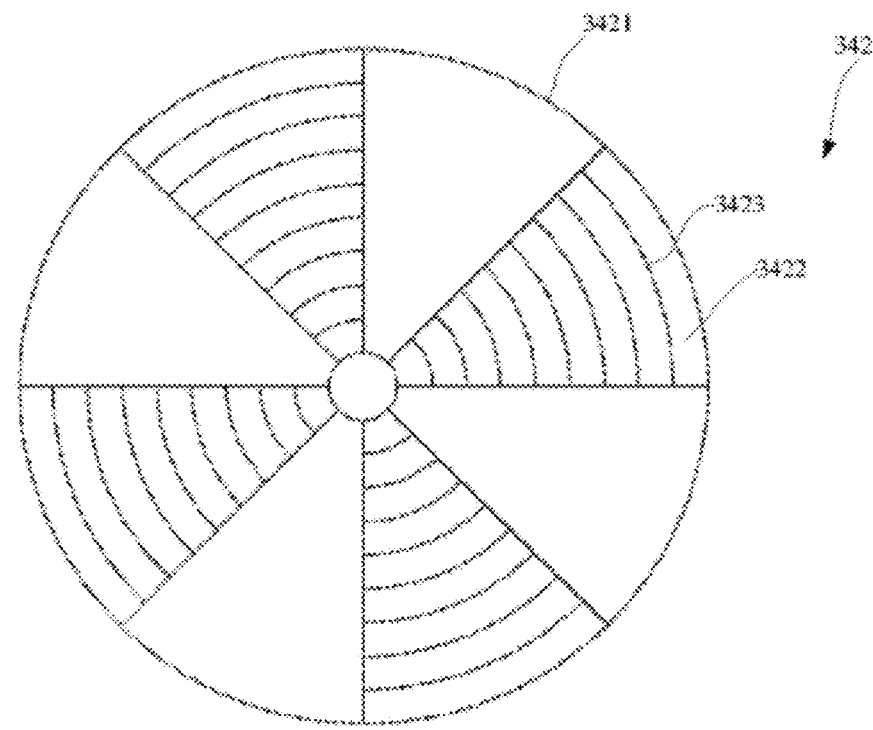
FIG. 30 is a schematic diagram of a heater in an embodiment of the present disclosure.

Referring to FIGS. 29-30, a heater 342 is disposed in the preheating chamber 340, and the heater 342 is fixed on the bracket 341. The heater 342 includes a bottom chassis 3421 and a heating coil 3424. The bottom chassis 3421 includes a plurality of limiting strips 3422. The plurality of limiting strips 3422 are sectorially (in sector-shaped) formed on the bottom chassis 3421. A spacer chamber is disposed between two adjacent limiting strips 3422. The spacer chamber can facilitate heat dissipation of a lacquer wire. The plurality of limiting strips 3422 and the bottom chassis 3421 may be integrally formed. The plurality of limiting strips 3422 are further provided with a plurality of baffles 3423, and the plurality of baffles 3423 are distributed in a sector shape on the plurality of limiting strips to form a concentric circle structure.

Figure 31:
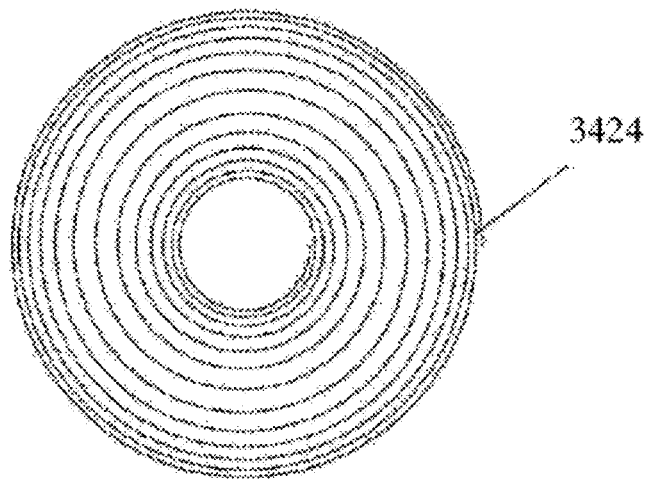
FIG. 31 is a schematic diagram of a heating coil in an embodiment of the present disclosure.

Referring to FIG. 31, a cross section of the heating coil 3424 is circular, and a height of the baffle 3423 is greater than a height of the heating coil 3424.

Figure 32:
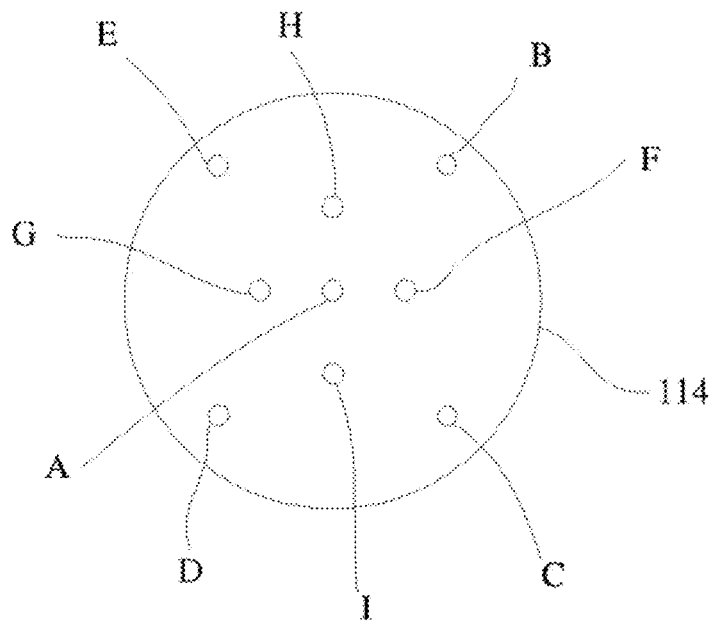
FIG. 32 is a schematic diagram of a temperature measurement point in an embodiment of the present disclosure.

Referring to FIG. 32, a plurality of measurement points are further disposed on a surface of the tray 343 close to the substrate 344, and then the plurality of measurement points are connected to a temperature measuring device. The temperature measuring device may be disposed in the preheating chamber 340 or disposed outside the preheating chamber 340, and the temperature of the substrate 344 may be measured in real time by the temperature measuring device, thereby controlling the surface temperature of the substrate 344 and the thermal uniformity thereof.

Referring to FIG. 29 again, a pumping port may be provided at the bottom of the preheating chamber 340, and the pumping port is connected to the vacuum pump 345, and the preheating chamber 340 is vacuum-evacuated by the vacuum pump 345 to obtain the preheating chamber 340 in a vacuum state. A heater 342 is disposed in the preheating chamber 340. It should be noted that, a plurality of heaters 342 may be disposed on the sidewall of the preheating chamber 340, and a plurality of heaters may be disposed on the top of the preheating chamber 340 to ensure the temperature uniformity of the entire preheating chamber 340.

Referring to FIG. 20, a plurality of growth chamber 350 are disposed on the sidewalls of the transfer chamber 310, and after the substrate completes the corresponding process in the preheating chamber 340. The substrate loading/unloading robot 311 in the transfer chamber 310 transfers the substrate into the growth chamber 350 for operation. Since a uniform arc magnetic field is formed in the growth chamber 350, uniform sputtering ions can be formed on the surface of the substrate. Thus, a uniform thin film is formed on the substrate.

Figure 33:
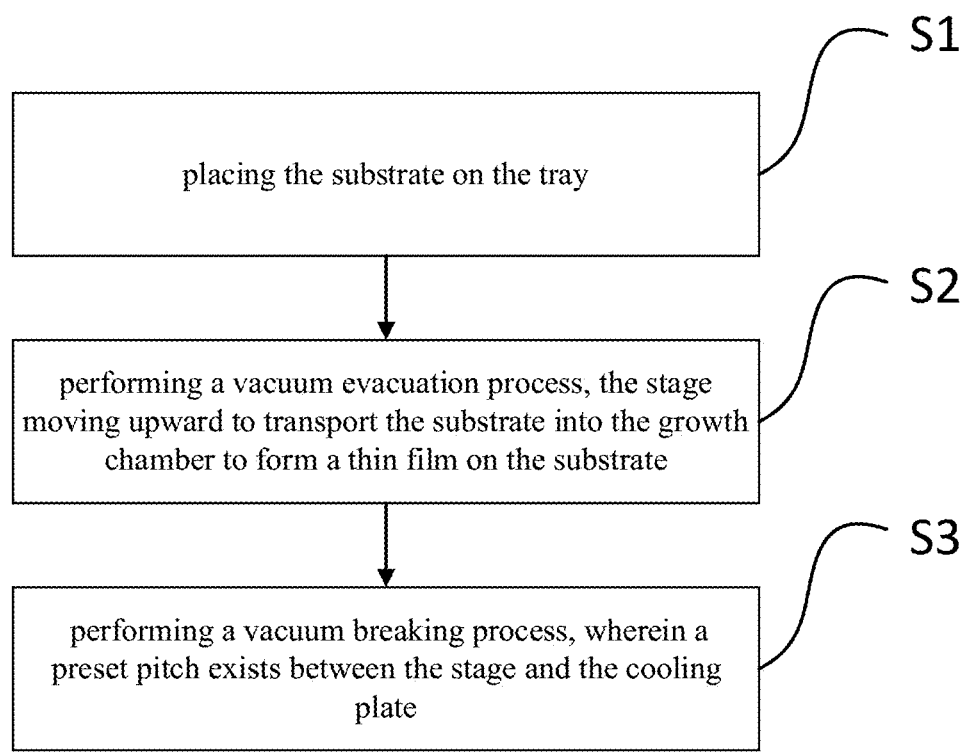
FIG. 33 is a flowchart of a method for using a semiconductor equipment in an embodiment of the present disclosure.

Referring to FIG. 33, the present embodiment further provides a method for using a semiconductor device, including: S1: placing the substrate on the tray;

S2: performing a vacuum evacuation process, the stage moving upward to transport the substrate into the growth chamber to form a thin film on the substrate;

S3: performing a vacuum breaking process, wherein a preset pitch exists between the stage and the cooling plate.

Figure 34:
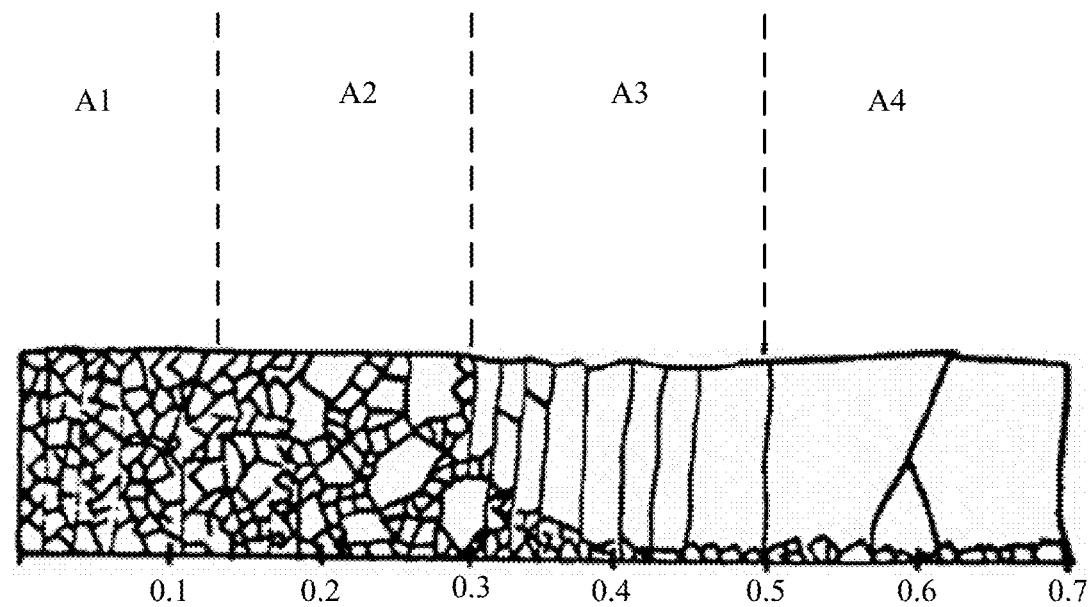
FIG. 34 is analytical diagram of an aluminum nitride coating in an embodiment of the present disclosure.

Referring to FIG. 34, in one embodiment, a thin film (for example, an aluminum nitride coating) on a substrate is analyzed, and it can be seen from the figure that, when the relative temperature is less than 0.1, the A1 region appears as loose fiber-shaped microcrystals, and the structure is an inverted tapered fiber, and at the same time, a large amount of gaps exist in grain boundaries, and the strength of the thin film is poor. When the relative temperature is in the range of 0.1 to 0.3, the A2 region is manifested as dense fiber-like microcrystals. When the relative temperature is in the range of 0.3 to 0.5, the A3 region is manifested as a columnar crystalline feature, and each grain is grown in the region to obtain a uniform columnar crystalline crystal, the defect density in the columnar crystalline crystal is low, the grain boundary density is high, and the crystal planar feature is presented. When the relative temperature is greater than 0.5, the A4 region behaves roughly equiaxed crystals, the intra-axial defect density is very low, the thin film crystals are very complete, and the intensity is high. Thus, when the relative temperature is low, that is, 0-0.3, the sputtering ions fail to diffuse sufficiently after incident on the surface of the substrate. The subsequent sputtering ions are continuously covered, thereby forming denser fiber tissue grown parallel to each other. The fibers are surrounded by a relatively loose boundary, and the fiber tissue has a low boundary density and a low bonding strength. Thinner and prone to cracking and exhibit significant bundle fiber characteristics on the cross-sectional topography. When the sputtering ions are relatively stable, that is, 0.3-0.7, after incident on the surface of the substrate, sufficient surface diffusion can occur, the migration distance of the sputtering ions increases, and the microfiber tissue forms columnar crystals due to surface diffusion, the columnar crystals move through the bulk diffusion and grain boundary to form large equiaxed crystals, and the defects in grain boundary decrease. Therefore, the semiconductor device of the present disclosure deposits a plating film at a uniform high temperature, which can have a fast film formation rate, and the lattice arrangement of thin films (for example, aluminum nitride) exhibits a columnar crystal growth direction, has good crystallinity of the film formation, and also has improved film formation uniformity. The relative temperature is a ratio of the substrate temperature to the melting temperature of the thin film, and if the substrate temperature is lower, the relative temperature is lower, and if the substrate temperature is higher, the relative temperature is higher.

Figure 35:
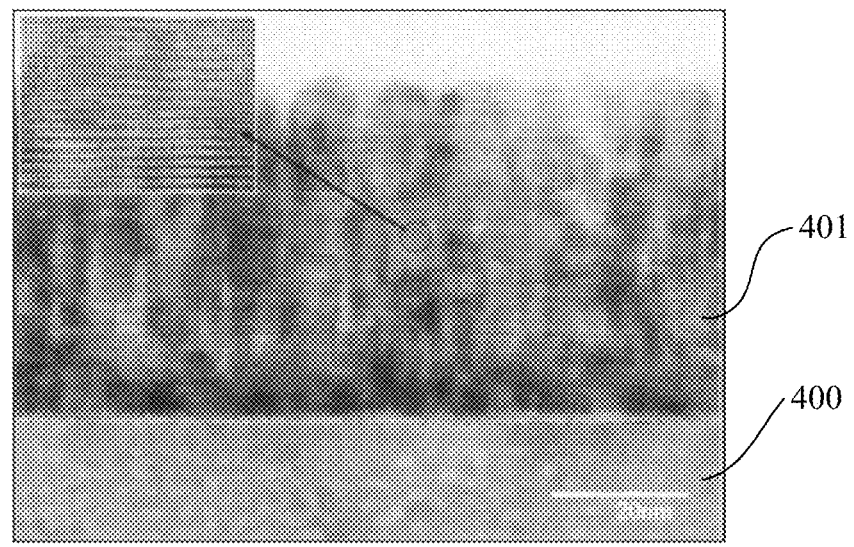
FIG. 35 is an electron microscope image of the aluminum nitride thin film in an embodiment of the present disclosure.

Referring to FIG. 35, the present embodiment analyzes the aluminum nitride thin film 401 formed on the substrate 400, and it can be seen from the figure that the aluminum nitride thin film 401 has a columnar crystal structure, and the aluminum nitride thin film 401 has a high internal density and a low defect density; therefore, the aluminum nitride thin film formed by the semiconductor device has a high quality.

Figure 36:
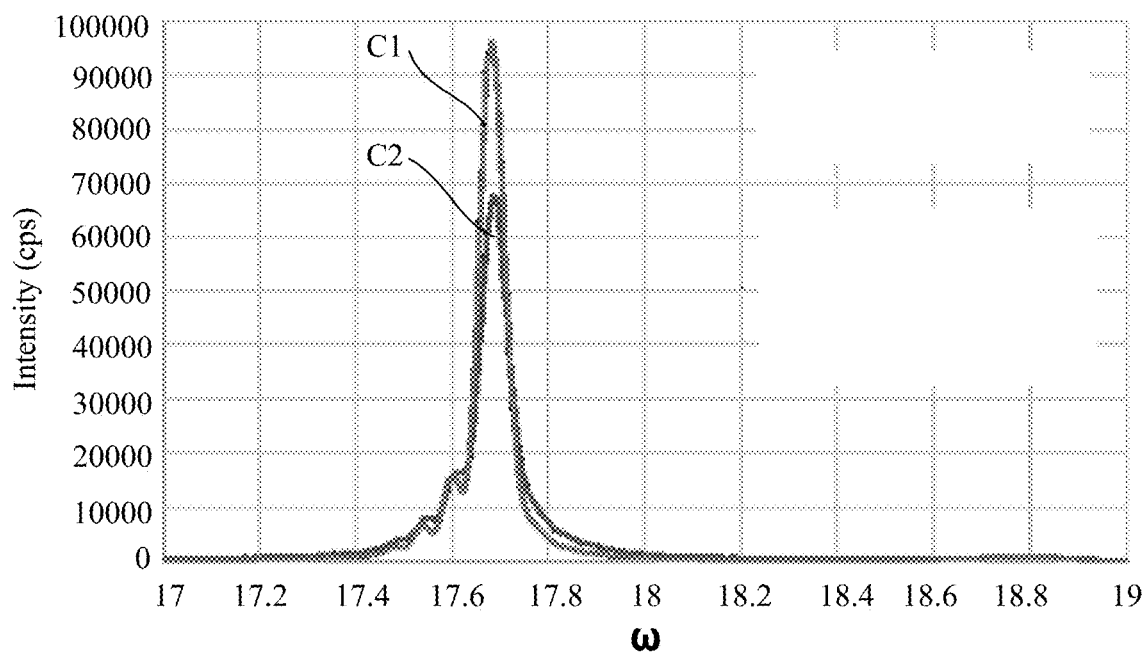
FIG. 36 is a swing graph of the aluminum nitride thin film in an embodiment of the present disclosure.

Referring to FIG. 36, a swing curve of an aluminum nitride thin film formed under two different film forming conditions is shown, and then the dislocation density of the crystal plane of the aluminum nitride thin film (002) is investigated by the swing curve. It should be noted that the difference between the two film formation conditions is only the pre-processing of the substrate. It can be seen from FIG. 36 that the half-peak width of the C1 curve is 227 arc angle, and the half-peak width of the C2 curve is 259 arc angle, thereby obtaining that the growth rate of the aluminum nitride film obtained by the pre-processing of the substrate is fast, the dislocation density is large, the growth rate of the aluminum nitride film obtained by the pre-processing of the substrate is slow, and the dislocation density is small. Therefore, the quality of the aluminum nitride film formed under the same conditions is improved after the substrate is subjected to pretreatment.

However, the aluminum nitride film described above is not limited to the aluminum nitride film described above, and the apparatus or manufacturing method of the present application can also be used with other films of quality, such as metal films, semiconductor films, insulating films, compound films or other materials. Moreover, the high-quality thin film formed in the present application can be applied to various semiconductor structures, electronic atoms or electronic devices such as switching elements, power elements, radio frequency elements, light emitting diodes, micro light emitting diodes, display panels, cell phones, watches, notebook computers, loading devices, charging devices, charging piles, virtual reality (VR) devices, augmented reality (AR) devices, portable electronic devices, game machines or other electronic devices.

Figure 37:
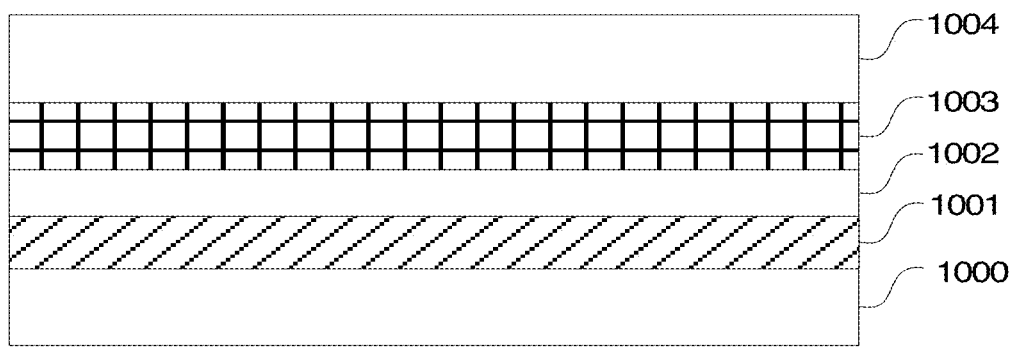
FIG. 37 is A semiconductor epitaxial structure diagram in an embodiment of the present disclosure.

Referring to FIG. 37, when a semiconductor epitaxial structure is manufactured using the semiconductor device of the present disclosure, the semiconductor epitaxial structure may include a substrate 1000, an aluminum nitride layer 1001, a first aluminum gallium nitride layer 1002, a second aluminum gallium nitride layer 1003, and a gallium nitride layer 1004. The aluminum nitride layer 1001 is formed on the substrate 1000, the first aluminum gallium nitride layer is formed on the aluminum nitride layer 1001, the second aluminum gallium nitride layer 1003 is formed on the first aluminum gallium nitride layer 1002, the gallium nitride layer 1004 is formed on the second aluminum gallium nitride layer 1003, and the aluminum content of the first aluminum gallium nitride layer 1002 may be higher than the aluminum content of the second aluminum gallium nitride layer 1003. The substrate 1000 may be a substrate of a silicon-based material, such as silicon (Si) or silicon carbide (SiC). In other embodiments, the substrate 1000 may also be sapphire ($Al_2O_3$), gallium arsenide (GaAs), lithium aluminate ($LiAlO_2$), gallium nitride (GaN), or other semiconductor substrate material.

Figure 38:
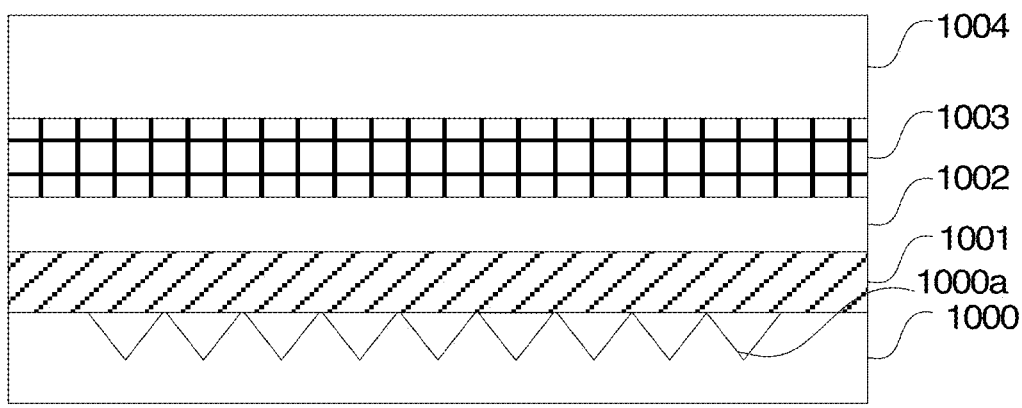
FIG. 38 is a semiconductor epitaxial structure diagram in an embodiment of the present disclosure.

Referring to FIG. 38, in some embodiments, the upper surface of the silicon substrate may be provided with a plurality of micro recesses 1000a, the cross section of the micro recesses 1000a is an inverted triangle or other shape, and in other embodiments, the cross section of the micro recesses 1000a includes an elliptical or polygonal shape. The micro depressions 1000a divide the substrate 1000 into a plurality of dielectric columns, the cross-section of the dielectric columns includes a triangle, an ellipse or other polygons, and the cross-sectional area of the dielectric columns is consistent from top to bottom, or gradually decreases from bottom to top. The inverted triangular micro recesses 1000a have a larger diameter and a larger depth to release packing stress.

Referring again to FIGS. 37 and 38, in some embodiments, the aluminum nitride layer 1001 may be filled within the micro recess 1000a. Arranging an aluminum nitride layer 1001 between the substrate 1000 and the first aluminum gallium nitride layer 1002 can prevent silicon in the substrate 1000 from reacting with gallium in the first aluminum gallium nitride layer 1002.

Referring again to FIG. 37, in various embodiments, a layer of aluminum nitride film may be sputtered on the surface of the substrate 1000 using the semiconductor equipment 100 to form an aluminum nitride layer 1001. When the aluminum nitride layer 1001 is formed, the temperature of the substrate 1000 is controlled between, for example, 800-1000 degrees centigrade, and the thickness of the aluminum nitride layer 1001 may be, for example, 0.01-1.6 micro meters by controlling parameters such as the sputtering rate, the substrate temperature, and the sputtering thickness. After the aluminum nitride layer 1001 is formed, the formed epitaxial structure can be subjected to high-temperature annealing treatment to improve the quality of the aluminum nitride layer 1001. The conditions of the high-temperature annealing process are, for example, 1100-1200 degrees centigrade, and the annealing gas is $H_2+NH_3$.

Referring again to FIG. 37, the aluminum content of the first aluminum gallium nitride layer 1002 may be higher than the aluminum content of the second aluminum gallium nitride layer 1003. For example, in the aluminum gallium nitride layer, the content of aluminum is decreased in a gradient, resulting in an increase in lattice parameters, thereby improving the quality of the semiconductor epitaxial structure.

Referring back to FIG. 37, for example, an aluminum nitride layer 1001 is formed on a silicon substrate 1000, the lattice mismatch between aluminum nitride and silicon can reach 19%, and the dislocation density of the aluminum nitride layer 1001 is very high. Relative straight gradients of reduced aluminum content in the aluminum gallium nitride layer lead to increased lattice parameters, thereby applying compressive stress in subsequent layers during growth. In this case, the aluminum nitride layer 1001 has a high dislocation density problem, and can be improved by designing the first aluminum gallium nitride layer 1002 and the second aluminum gallium nitride layer 1003, thereby improving the quality of the buffer layer.

Referring again to FIG. 37, the first aluminum gallium nitride layer 1002 and the second aluminum gallium nitride layer 1003 can be manufactured by using the semiconductor equipment 100 or the chemical vapor deposition method, wherein the thickness of the first aluminum gallium nitride layer 1002 or the second aluminum gallium nitride layer 1003 can be, for example, 600-1200 nm in order to regulate warpage and surface flatness. The X value of the first aluminum gallium nitride layer ($Al_xGa_{1-x}N$) 1002 is greater than the Y value in the second aluminum gallium nitride layer ($Al_yGa_{1-y}N$) 1003.

Referring again to FIG. 37, the semiconductor epitaxial structure further includes a gallium nitride layer 1004, and the gallium nitride layer 1004 is disposed on the second aluminum gallium nitride layer 1003, wherein the high-resistance gallium nitride layer 1004 can improve the voltage resistance of the device. In order to obtain a high resistance gallium nitride material, the gallium nitride layer 1004 may include a multilayer structure including at least a first gallium nitride layer, a second gallium nitride layer, and a third gallium nitride layer. The first gallium nitride layer may be grown in a high-pressure high-temperature environment, for example, a growth temperature of 1000-1050 degrees centigrade, a reaction chamber pressure of 400-500 torr, a growth rate of 1-1.5 um/h, and a growth thickness of 300-500 nm. The second gallium nitride layer can be grown in a medium pressure low temperature environment, for example, a growth temperature of 900-1000 degrees centigrade, a reaction chamber pressure of 200-250 torr, a growth rate of 2.5-3.5 μm/h, and a growth thickness of 1-4 μm. The third gallium nitride layer may be grown in a low pressure high temperature environment, for example, a growth temperature of 1000-1050 degrees centigrade, a reaction chamber pressure of 100-200 torr, a growth rate of 0.5-1 μm/h, and a growth thickness of 300-500 nm.

Therefore, in some implementations, the quality of the semiconductor epitaxial structure is improved by the arrangement of the aluminum content in the first aluminum gallium nitride layer 1002 and the second aluminum gallium nitride layer 1003.

Figure 39:
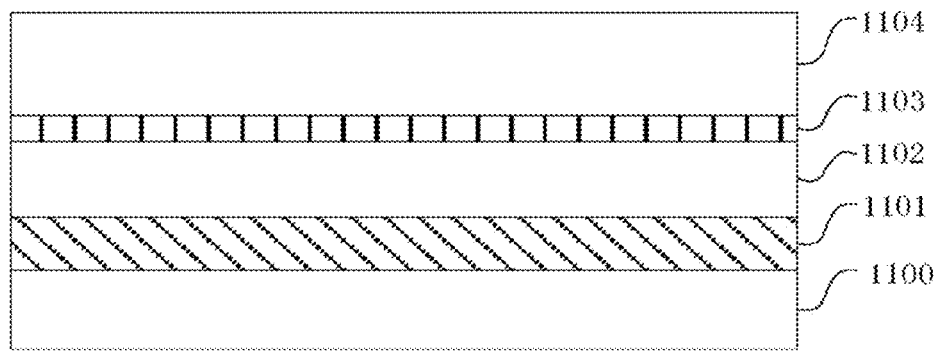
FIG. 39 is another semiconductor epitaxial structure diagram in an embodiment of the present disclosure.

Referring to FIG. 39, in some embodiments, the semiconductor epitaxial structure may include a substrate 1100, a first aluminum nitride layer 1101, a first gallium nitride layer 1102, a second aluminum nitride layer 1103, and a second gallium nitride layer 1104. The first aluminum nitride layer 1101 is formed on the substrate 1100, the first gallium nitride layer 1102 is formed on the first aluminum nitride layer 1101, the second aluminum nitride layer 1103 is formed on the first gallium nitride layer 1102, and the second gallium nitride layer 1104 is formed on the second aluminum nitride layer 1103. The material of the substrate 1100 may be a semiconductor substrate material such as silicon (Si), silicon carbide (SiC), sapphire ($Al_2O_3$), gallium arsenide (GaAs), and lithium aluminate ($LiAlO_2$). In the present embodiment, the substrate 1100 is, for example, a silicon (Si) based material such as silicon (Si) or silicon carbide (SiC).

Referring again to FIG. 39, the method of forming the aluminum nitride layers 1101 and/or 1103 includes, for example, forming an aluminum nitride film on a surface of a substrate using the semiconductor equipment 100 of the present disclosure.

Referring again to FIG. 39, the method of forming the gallium nitride layers 1102 and/or 1104 includes growing gallium nitride on the aluminum nitride layer by a chemical vapor deposition method or a metal organic chemical vapor deposition method. First, in a reaction chamber in which a gallium nitride apparatus is grown, one or more of helium gas, argon gas, nitrogen gas and hydrogen gas, for example, are introduced into the reaction chamber, and then the temperature of the reaction chamber is raised to a preset temperature, wherein the preset temperature is the growth temperature of the gallium nitride layer, and a first gallium nitride layer 1102 and/or a second gallium nitride layer 1104 having a preset thickness are grown under this condition.

Referring again to FIG. 39, by using a plurality of spaced aluminum nitride interlayers, dislocation can be improved and the quality of the semiconductor epitaxial structure can be improved. In other embodiments, according to the quality of the aluminum nitride interlayer, a plurality of aluminum nitride interlayers may be further provided inside the first gallium nitride layer 1102 or the second gallium nitride layer 1104 at intervals, for example, the third gallium nitride layer and the fourth gallium nitride layer may be provided inside the first gallium nitride layer 1102 and the second gallium nitride layer 1104, respectively.

Figure 40:
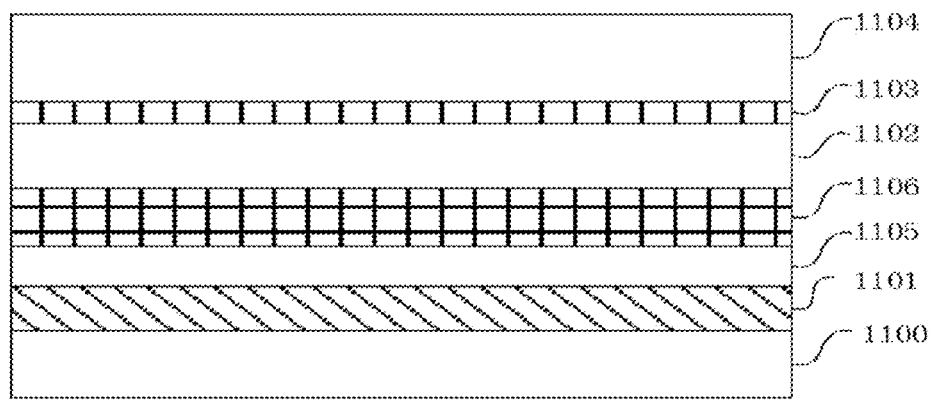
FIG. 40 is still another semiconductor epitaxial structure diagram in an embodiment of the present disclosure.

Referring to FIG. 40, in another embodiment, the first aluminum nitride layer 1101 and the first gallium nitride layer 1102 may include a first aluminum gallium nitride layer 1105 and a second aluminum gallium nitride layer 1106. The first aluminum gallium nitride layer 1105 is disposed on the first aluminum nitride layer 1101, the second aluminum gallium nitride layer 1106 is disposed on the first aluminum gallium nitride layer 1105, and the first gallium nitride layer 1102 is disposed on the second aluminum gallium nitride layer 1106. The content of aluminum of the first aluminum gallium nitride layer 1105 is higher than the content of aluminum of the second aluminum gallium nitride layer 1106. In the aluminum gallium nitride layer, the content of aluminum is decreased in a relative straight direction gradient, resulting in an increase in the lattice parameter.

Figure 41:
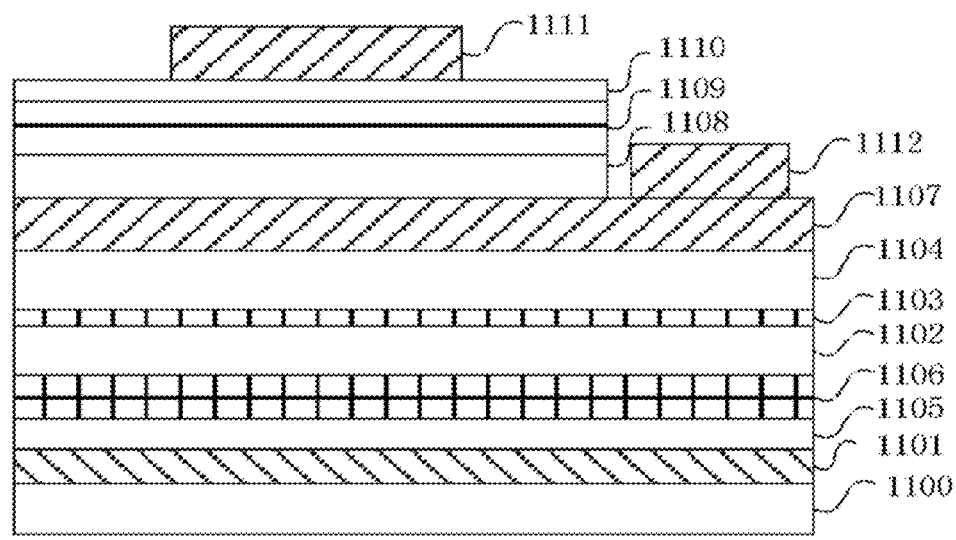
FIG. 41 is a structural diagram of a light emitting diode in an embodiment of the present disclosure.

Referring to FIG. 41, in various embodiments, when a light emitting diode structure is formed using the semiconductor device and the semiconductor epitaxial structure of the present disclosure. Specifically, the light emitting diode structure may include a semiconductor epitaxial structure, a first semiconductor layer 1107, a light emitting layer 1108, a second semiconductor layer 1109, a first electrode 1111, and a second electrode 1112. The first semiconductor layer 1107 is located on the second gallium nitride layer 1104, and the light emitting layer 1108 is located on the first semiconductor layer 1107. The second semiconductor layer 1109 is located on the light emitting layer 1108, and a transparent conductive layer 1110 is further provided on the second semiconductor layer 1109. One side of the second semiconductor layer 1109 is provided with a recess which passes through the transparent conductive layer 1110, the second semiconductor layer 1109 and the light emitting layer 1108 to the first semiconductor layer 1107 in sequence. The recess is in contact with the first semiconductor layer 1107. The first electrode 1111 is formed on the transparent conductive layer 1110, and the second electrode 1112 is formed on the first semiconductor layer 1107 in the recess.

Referring back to FIG. 41, in some embodiments, the semiconductor epitaxial structure may include a substrate 1100, a first aluminum nitride layer 1101, a first aluminum gallium nitride layer 1105, a second aluminum gallium nitride layer 1106, a first gallium nitride layer 1102, a second aluminum nitride layer 1103, and a second gallium nitride layer 1104. The first aluminum nitride layer 1101 is formed on the substrate 1100, the first aluminum gallium nitride layer 1105 is formed on the first aluminum nitride layer 1101, the second aluminum gallium nitride layer 1106 is formed on the first aluminum gallium nitride layer 1105, the first gallium nitride layer 1102 is formed on the second aluminum gallium nitride layer 1106, the second aluminum nitride layer 1103 is formed on the first gallium nitride layer 1102, and the second gallium nitride layer 1104 is formed on the second aluminum nitride layer 1103.

Referring again to FIG. 41, in various embodiments, a first semiconductor layer 1107, a light emitting layer 1108, and a second semiconductor layer 1109 may be provided on the semiconductor epitaxial structure. The first semiconductor layer 1107 may be an N-type semiconductor layer doped with a first impurity, or a P-type semiconductor layer doped with a second impurity, and the corresponding second semiconductor layer 1109 may be a P-type semiconductor layer doped with a second impurity, or an N-type semiconductor layer doped with a first impurity. The first impurity is, for example, a donor impurity, and the second impurity is, for example, an acceptor impurity. According to the semiconductor material used, the first impurity and the second impurity may be different elements. In this embodiment, the first semiconductor layer 1107 may be a gallium nitride half layer, the first impurity may be a silicon (Si) element, and the second impurity may be a magnesium (Mg) element. In other embodiments, the first semiconductor layer 1107 and the second semiconductor layer 1109 may be nitride compounds, for example, the first semiconductor layer 1107 is an N-type doped gallium nitride, and the second semiconductor layer 1109 is a P-type doped gallium nitride. In other embodiments, the first semiconductor layer 1107 and the second semiconductor layer 1109 may also be formed of other suitable transparent materials.

Referring back to FIG. 41, in different embodiments, the light emitting layer 1108 is an intrinsic semiconductor layer or a low-doped semiconductor layer, and the light emitting layer 1108 is doped at a lower doping concentration than the adjacent semiconductor layers of the same doping type, and the light emitting layer 1108 may be a quantum well light emitting layer. For example, indium gallium nitride (InGaN) may be selected. In different embodiments, the light emitting layer may be, for example, a quantum well emitting different light chromatic wavelength bands, and the material of the light emitting layer may be indium gallium nitride (InGaN), zinc selenide (ZnSe), indium gallium nitride/gallium nitride (InGaN/GaN), gallium nitride (InGaN/GaN), gallium phosphide (GaP), gallium phosphide (GaAs), galide (GaP), or the like.

Please refer to FIG. 41 again, the light emitting diode structure further comprises a transparent conductive layer 1110 disposed on the second semiconductor 1109 and located between the first electrode 1111 and the second semiconductor structure 1109. The transparent conductive layer 1110 can make a good ohmic contact between the second semiconductor layer 1109 and the first electrode 1111. The transparent conductive layer 1110 may be made of indium tin oxide (ITO), indium zinc oxide (IZO), zinc oxide (zinc oxide, ZnO), indium tin zinc oxide (ITZO), aluminum tin oxide (ATO), aluminum zinc oxide (aluminum zinc oxide, AZO), or other suitable transparent conductive material.

Referring to FIG. 41 again, the light emitting diode structure further includes a recess which is located on one side of the transparent conductive layer 1110, the second semiconductor layer 1109, and the light emitting layer 1108. A first electrode 1111 is disposed on the transparent conductive layer 1110, a second electrode 1112 is disposed in the recess, and the materials of the first electrode 1111 and the second electrode 1112 may be opaque conductive materials. The opaque conductive material may include a metal material such as titanium (Ti), platinum (Pt), gold (Au), and chromium (Cr), and the opaque conductive material may also be a highly reflective material such as aluminum (Al), silver (Ag). Thus, the first electrode 1111 and the second electrode 1112 are high reflection electrodes, and when the light emitting layer 1108 emits light, the absorption of light by the electrodes is reduced. to improve the luminous brightness. In the present embodiment, the first electrode 1111 and the second electrode 1112 may be formed on the transparent conductive layer 1110 and the first semiconductor layer 1107, respectively, by evaporation and/or sputtering techniques.

Figure 42:
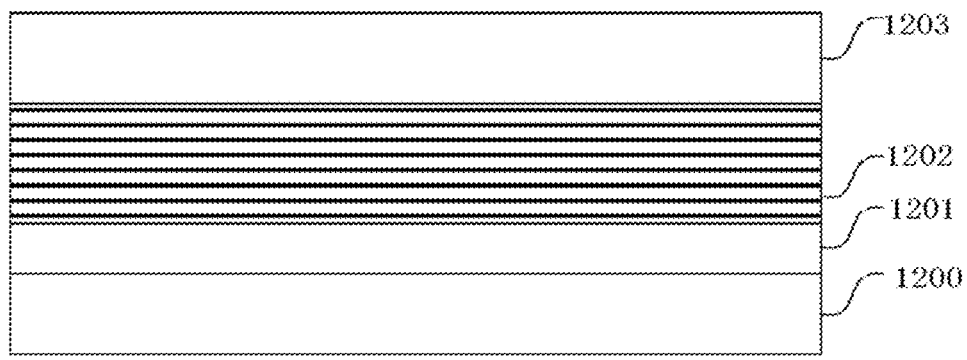
FIG. 42 is still another semiconductor epitaxial structure diagram in an embodiment of the present disclosure.

Referring to FIG. 42, in another embodiment, when a semiconductor epitaxial structure is manufactured using the semiconductor device of the present disclosure, the semiconductor epitaxial structure may include a substrate 1200, an aluminum nitride layer 1201, a superlattice structure 1202, and a gallium nitride layer 1203, and the superlattice structure 1202 includes a plurality of aluminum nitride interlayers. The aluminum nitride layer 1201 is formed on the substrate 1200, the superlattice structure 1202 is formed on the aluminum nitride layer 1201, and the gallium nitride layer 1203 is formed on the superlattice structure 1202.

Referring again to FIG. 42, for example, the aluminum nitride layer 1201 may be formed using the semiconductor equipment 100 of the present disclosure. A superlattice structure 1202 is disposed on the aluminum nitride layer 1201, and the superlattice structure 1202 may be made of two different semiconductor materials with different bandgaps. The two different semiconductor materials are alternately grown to form a periodic structure. The two different semiconductor materials are, for example, aluminum nitride and aluminum gallium nitride, and the superlattice structure 1202 comprises a plurality of aluminum nitride interlayers and a plurality of aluminum gallium nitride interlayers. The aluminum nitride interlayer and the aluminum gallium nitride interlayer are periodically grown on the aluminum nitride layer. The aluminum nitride interlayer, the aluminum gallium nitride interlayer, the aluminum nitride interlayer, and the aluminum gallium nitride interlayer may be periodically grown. In other embodiments, the two different semiconductor materials may be, for example, aluminum nitride and gallium nitride, and the superlattice structure 1202 includes an aluminum nitride interlayer and a gallium nitride interlayer.

Referring again to FIG. 42, the thickness of the aluminum nitride interlayer and the aluminum gallium nitride interlayer may be nano-scale dimensions, and the growth period is, for example, 15-20. The thickness of the aluminum nitride layer is, for example, 4 nm, and the thickness of the aluminum gallium nitride layer is, for example, 20 nm. In other embodiments, the thickness of the aluminum nitride layer is, for example, 4 nm, and the thickness of the gallium nitride interlayer is, for example, 20 nm. Such a superlattice structure 1202 has good vertical leakage and breakdown characteristics, for example, applicable to power devices.

Referring again to FIG. 42, the method for generating the aluminum nitride interlayer and the aluminum gallium nitride interlayer in the superlattice structure 1202 comprises: sequentially forming the aluminum nitride interlayer and the aluminum gallium nitride interlayer on the aluminum nitride layer by a deposition process, and then repeatedly depositing the two interlayers alternately to form a periodic structure in the growth direction. The aluminum nitride interlayer is grown in a single cycle, the growth thickness of the aluminum nitride interlayer may be, for example, 4 nm, and the growth thickness of the aluminum gallium nitride interlayer may be, for example, 20 nm.

Referring back to FIG. 42, a gallium nitride layer 1203 may be provided on the superlattice structure 1202. The growing condition of the gallium nitride layer 1203 is, for example, 950-1000 degrees centigrade. In this embodiment, the growing temperature is, for example, 980 degrees centigrade.

Referring again to FIG. 42, a group III-V nitride material such as GaN can be grown as a single crystal (epitaxial)

layer on a suitable substrate 1200, in which the gallium nitride layer 1203 has a different coefficient of thermal expansion than the substrate 1200; therefore, when cooled after processing, the gallium nitride layer 1203 has a tendency to fracture due to the thicker substrate 1200 constraints on them. The fragmentation of the gallium nitride layer 1203 limits their final application. The aluminum nitride layer 1201 and the superlattice structure 1202 provided in the present application can adjust thermal mismatch, and prevent wafer deformation and fragmentation of the gallium nitride layer 1203 from easily occurring in heating and subsequent cooling devices on the substrate 1200.

Figure 43:
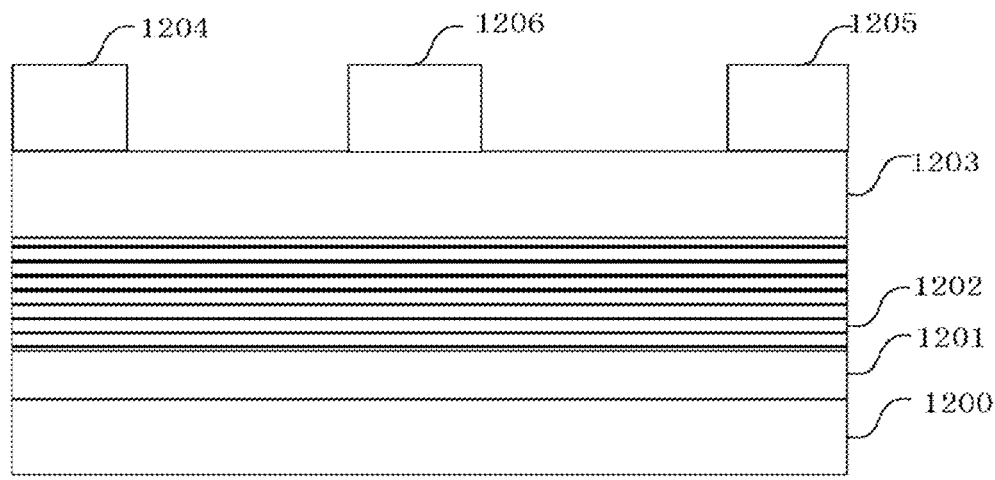
FIG. 43 is a structural diagram of a semiconductor power device in an embodiment of the present disclosure.

Referring to FIG. 43, in various embodiments, when a semiconductor device is manufactured using the semiconductor device and the epitaxial structure of the present disclosure, the semiconductor device may include, for example, the above-described semiconductor epitaxial structure, the source 1204, the drain 1205, and the gate 1206 thereof. The source 1204 and the drain 1205 are located on the gallium nitride layer 1023, and respectively located on two sides of the gallium nitride layer 1203; the gate 1206 is located between the source 1204 and the drain 1205; the gate 1026 can be inserted into the gallium nitride layer and has a pre-set distance from the superlattice structure 1202.

Referring back to FIG. 43, in some embodiments, the epitaxial structure comprises a substrate 1200, an aluminum nitride layer 1201, a superlattice structure 1202 and a gallium nitride layer 1203, the aluminum nitride layer 1201 is located on the substrate 1200, the superlattice structure 1202 is provided on the aluminum nitride layer 1201, and the gallium nitride layer 1203 is provided on the superlattice structure 1202. The content of aluminum in the superlattice structure 1202 in the epitaxial structure may be lower than the content of aluminum in the aluminum nitride layer 1201. As such, the epitaxial structure has good vertical leakage and breakdown characteristics, and the semiconductor device (for example, a semiconductor power device) formed by the epitaxial structure also has good vertical leakage and breakdown characteristics.

Figure 44:
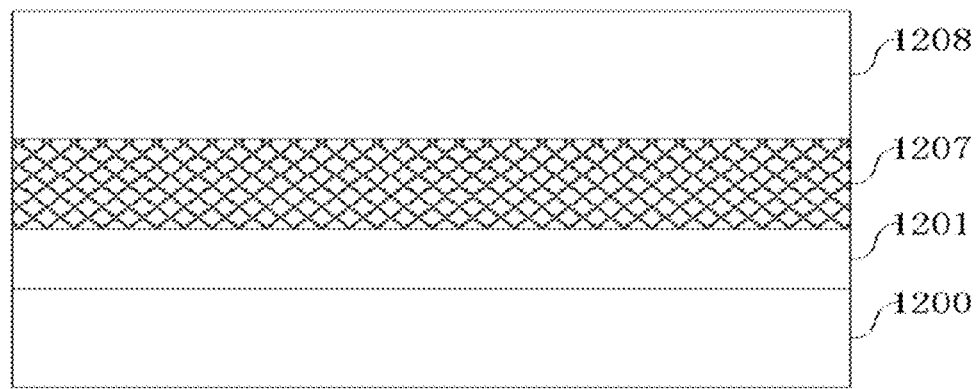
FIG. 44 is a structural diagram of a semiconductor power epitaxial in an embodiment of the present disclosure.

Referring to FIG. 44, in various embodiments, when a semiconductor epitaxial structure is manufactured using the semiconductor device of the present disclosure, the semiconductor epitaxial structure may include a first gallium nitride layer 1207 and a second gallium nitride layer 1208. The second gallium nitride layer 1208 is formed on the first gallium nitride layer 1207, and the lattice structure (for example, a polycrystalline structure or a single crystal structure) of the first gallium nitride layer 1207 may be different from the lattice structure (for example, an amorphous structure) of the second gallium nitride layer 1208.

Referring to FIG. 44, the growth method of the semiconductor epitaxial structure comprises: forming an aluminum nitride layer 1201 on a substrate 1200, wherein the substrate 1200 may be a silicon (Si) based material, such as silicon (Si) or silicon carbide (SiC). The method for forming the aluminum nitride layer 1201 comprises: for example, using the semiconductor device of the present disclosure, forming an aluminum nitride thin film on the surface of the substrate 1200, and ensuring that the surface of the substrate 1200 is filled with an aluminum nitride material by controlling parameters such as the sputtering rate, the substrate temperature, and the sputtering thickness, so as to obtain an aluminum nitride layer 1201 of a certain thickness. After the aluminum nitride layer 1201 is formed, the aluminum nitride layer 1201 is subjected to a high temperature annealing treatment to improve the quality of the aluminum nitride layer 1201.

Referring to FIG. 44, the first gallium nitride layer 1207 and the second gallium nitride layer 1208 of the semiconductor epitaxial structure may be formed using different process methods or different process devices, respectively. For example, when the first gallium nitride layer 1207 is formed, the semiconductor device of the present disclosure can be used, and the first aluminum nitride layer 1201 is formed on the aluminum nitride layer 1201 by a physical vapor deposition method. For example, when the second gallium nitride layer 1208 is formed, the second gallium nitride layer 1208 may be formed on the first gallium nitride layer 1207 by a metal organic compound chemical vapor deposition method.

Figure 45:
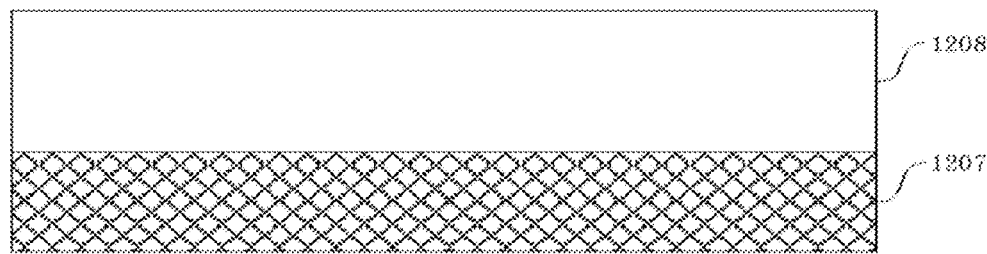
FIG. 45 is another semiconductor power epitaxial structure diagram in an embodiment of the present disclosure.

Referring to FIG. 45, in some embodiments, the first gallium nitride layer 1207 and the second gallium nitride layer 1208 may be peeled off from the substrate 1200 to obtain a gallium nitride epitaxial structure. Specifically, the epitaxial structure (1207, 1208) may be separated from the substrate 1200 by etching or polishing the growth substrate 1200 and the aluminum nitride layer 1201. The gallium nitride epitaxial structure obtained comprises a first gallium nitride layer 1207 and a gallium nitride layer 1208. In different embodiments, the gallium nitride epitaxial structure can be applied to a vertically conductive semiconductor device. For example, an electrode and other semiconductor layers (not shown) may be formed on the upper and lower sides of the first gallium nitride layer 1207 and the gallium nitride layer 1208, thereby forming a vertically conductive semiconductor device.

Figure 46:
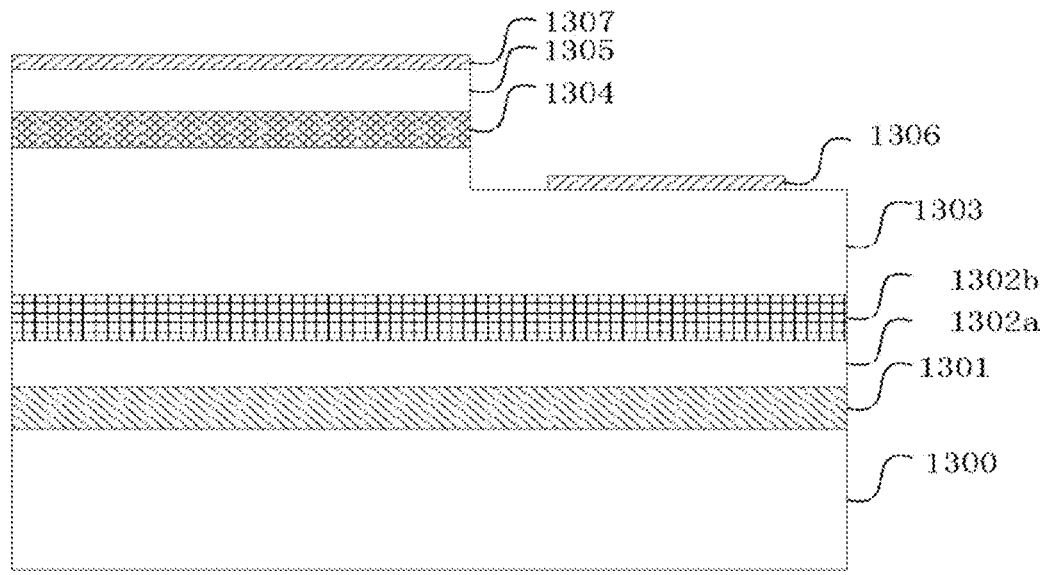
FIG. 46 is a structural diagram of a light emitting diode in an embodiment of the present disclosure.

Referring to FIG. 46, when the light emitting diode structure is manufactured using the semiconductor device and the epitaxial structure of the present disclosure, the light emitting diode structure at least includes a carbon-containing substrate 1300, a low-temperature aluminum nitride layer 1301, a high-temperature gallium nitride buffer layer 1302, a first semiconductor layer 1303, a light emitting layer 1304, a second semiconductor layer 1305, an N-type electrode 1306, and a P-type. The low-temperature aluminum nitride layer 1301 is formed on the carbon-containing substrate 1300, and the high-temperature gallium nitride buffer layer 1302 is formed on the low-temperature aluminum nitride layer 1301. The first semiconductor layer 1303 is formed on the high-temperature gallium nitride buffer layer 1302, and the light emitting layer 1304 is formed on the first semiconductor layer 1303. The second semiconductor layer 1305 is formed on the light emitting layer 1304, and a recess passing through the second semiconductor layer 1305 and the light emitting layer 1304 to the first semiconductor layer 1303 is provided on one side of the second semiconductor layer. The recess is in contact with the first semiconductor layer 1303, and the N-type electrode 1306 is formed on the first semiconductor layer 1303 in the recess. A p-type electrode is formed on the second semiconductor layer 1305.

Referring to FIG. 46, in some implementations, a silicon-based substrate having a carbon-containing layer can be used as the substrate of the light emitting diode structure to improve the quality, performance and reliability of the light emitting diode structure device. The carbon-containing layer in the carbon-containing substrate 1300 can avoid or reduce the inter-mixing of the silicon atoms of the substrate and the metal atoms of the light emitting diode structure, thus improving the quality of the third group of nitride crystals. The third group of nitride crystals with improved quality can improve the performance and reliability of the light emitting diode structure device. The carbon-containing layer is disposed along the surface of the carbon-containing substrate 1300 and extends into the substrate at a depth of about less than 20 μm. In various embodiments, other atoms, such as silicon, germanium, or the like, may be selectively introduced into the substrate in addition to the carbon atom.

Specifically, before the epitaxial structure is grown on the carbon-containing substrate 1300, the carbon-containing substrate 1300 may be cleaned to remove the native oxide on the surface of the carbon-containing substrate 1300. The cleaning process comprises: firstly, performing in situ thermal cleaning on the carbon-containing substrate 1300 under a hydrogen atmosphere for a certain time, for example, 10-20 minutes, the cleaning liquid may be a H2SO4:H2O2 (3:1) solution, and the particles and organic contaminants may be removed; Recleaning with 2% hydrofluoric acid (HF) and deionized water to remove metal contaminants; finally drying under N2 conditions.

Referring to FIG. 46, the thickness of the light emitting diode low-temperature aluminum nitride layer 1301 is, for example, 5-30 nm. The formation process of the aluminum nitride layer 1301 may specifically include, for example, using the semiconductor equipment 100 of the present disclosure. An aluminum nitride thin film is formed on the surface of the carbon-containing substrate 1300, and the temperature of the carbon-containing substrate 1300 is controlled to be 600-1200 degrees centigrade, for example. The surface of the carbon-containing substrate 1300 is ensured by controlling parameters such as the sputtering rate, the substrate temperature, and the sputtering thickness. The aluminum nitride material is filled to form a high-quality low-temperature aluminum nitride layer 1301.

Referring to FIG. 46, a high-temperature gallium nitride buffer layer 1302 may be formed on the low-temperature aluminum nitride layer 1301, and the high-temperature gallium nitride buffer layer 1302 includes a first high-temperature gallium nitride buffer layer 1302a and a second high-temperature gallium nitride buffer layer 1302b. The process comprises, for example, two stages:

In a first stage, the temperature is increased to a preset temperature, for example, 1050-1100° C., and a low-temperature chemical vapor deposition method such as plasma enhanced chemical vapor deposition (PECVD) is adopted at a low V/III ratio, and a non-intentionally doped gallium nitride layer with a certain thickness is grown, which is the first high-temperature gallium nitride buffer layer 1302a, and the thickness of the first high-temperature gallium nitride buffer layer 1302a is 200-400 nm, for example.

In the second stage, at the temperature of the first stage, for example, 1050-1100 degrees centigrade, a low-temperature chemical vapor deposition method such as plasma enhanced chemical vapor deposition (PECVD) is adopted at a high V/III ratio, and a non-intentionally doped gallium nitride layer with a certain thickness is grown, which is the second high-temperature gallium nitride buffer layer 1302b, and the thickness of the second high-temperature gallium nitride buffer layer 1302b is, for example, 0.1-0.5 mm.

Referring to FIG. 46, a first semiconductor layer 1303 may be formed on the high-temperature gallium nitride buffer layer 1302, and the first semiconductor layer 1303 is a silicon-doped N-type gallium nitride layer, wherein the silicon-doped material may be, for example, silane (SiH4). The formation process of the first semiconductor layer 1303 comprises: applying a low-temperature chemical vapor deposition method, such as a plasma enhanced chemical vapor deposition (PECVD), at a high V/III ratio at the same temperature as the formation of the high-temperature gallium nitride buffer layer 1302, and growing a silicon-doped N-type gallium nitride layer of a certain thickness as the first semiconductor layer 1303. In the present embodiment, the thickness of the first semiconductor layer 1303 may be, for example, 2 mm, and at the same time, the first semiconductor layer 1303 with a flat smooth can be obtained at a high V/III ratio.

Referring to FIG. 46, a light emitting layer 1304 may be formed on the first semiconductor layer 1303. In different embodiments, the light emitting layer 1304 is a periodic well layer and a barrier layer, and the light emitting layer 1304 is periodically grown according to the well layer and the barrier layer. The material of the well layer is, for example, In0.15Ga0.85N, and the material of the barrier layer is, for example, In0.02Ga0.98N. The formation process of the light emitting layer 1304 may include, for example, first growing the well layer in a single growth period, the growth temperature being, for example, 700-800 degrees centigrade, the thickness of the well layer may be, for example, 3-5 nm, then increasing the growth temperature to 800-900 degrees centigrade, and under this condition, growing the barrier layer, and the thickness of the barrier layer may be, for example, 9-15 nm. In the present embodiment, there are five growth periods, for example, a light emitting layer 1304 is obtained by growing a periodic well layer and a barrier layer, and in the process of growing the light emitting layer 1304, nitrogen gas is used as a carrier gas in order to improve the incorporation rate of indium.

Referring to FIG. 46, a second semiconductor layer 1305 may be formed on the light emitting layer 1304, and the second semiconductor layer 1305 is a p-doped p-type gallium nitride layer. In some embodiments, the p-doped material may specifically be bicyclopentadienyl magnesium ($CP_2Mg$). The forming process of the second semiconductor layer 1305 comprises: after the light emitting layer 1304 is grown, increasing the temperature of the substrate to, for example, 1000 degrees centigrade, and depositing a thickness of the magnesium-doped p-type gallium nitride layer on the light emitting layer 1304. In various embodiments, the thickness of the second semiconductor layer 1305 may be, for example, 200-400 nm.

Referring back to FIG. 46, in some embodiments, the light emitting diode structure further includes an N-type electrode 1306 and a P-type electrode 1307. The magnesium-doped p-type gallium nitride layer may also be activated before the N-type electrode 1306 and the p-type electrode 1307 are fabricated, that is, the second semiconductor layer 1305. The activation process includes, for example, annealing the prepared light emitting diode structure under a nitrogen atmosphere at, for example, 730 degrees centigrade for a certain length of time, for example, 30 min, so as to activate the second semiconductor layer 1305, and meanwhile monitoring growth in situ by reflection measurement at a certain laser wavelength, for example, at a laser wavelength of 600-700 nm.

Referring back to FIG. 46, in some embodiments, the light emitting diode structure further includes an N-type electrode 1306 and a P-type electrode 1307, and the N-type electrode 1306 is formed on the silicon-doped N-type gallium nitride layer, that is, on the first semiconductor layer 1303. The p-type electrode 1307 is formed on the p-type gallium nitride layer, that is, on the second semiconductor layer 1305. The process of forming the N-type electrode 1306 and the p-type electrode 1307 comprises, for example, annealing. The surface of the structure is partially etched by inductively coupled plasma etching until the first semiconductor layer 1303 is exposed and the first semiconductor layer 1303 is continuously etched to form a recess. Ni/Au contacts are deposited on the recess and then evaporated to form an N-type electrode 1306. A Ti/Al/Ni/Au contact is deposited as the p-type electrode 1307 on the exposed second semiconductor layer 1305.

Although not limited thereto, and in some embodiments, the substrate 1300, the low-temperature aluminum nitride layer 1301, the high-temperature gallium nitride buffer layer 1302 may be removed to expose the first semiconductor layer 1303 without etching portions of the first semiconductor layer 1303 to form recesses. Next, the N-type electrode 1306 is formed on the first semiconductor layer 1303, and thus a vertically conductive light emitting diode structure is formed.

Referring to FIG. 46, by means of the light emitting diode structure provided by the present disclosure, a high-quality light emitting diode structure with no cracks and smooth surface topography can be obtained through the low-temperature aluminum nitride layer 1301 and the high-temperature gallium nitride buffer layer 1302.

Referring to FIGS. 47 to 51, in some embodiments, when the semiconductor epitaxial structure of the present disclosure is applied to manufacture a micro light emitting diode (micro light emitting diode), the method for manufacturing the micro light emitting diode structure may include the following steps: providing a growth substrate 500; forming a buffer layer 501 on the growth substrate, forming a first semiconductor layer 502 on the buffer layer 501, forming a light emitting layer 503 on the first semiconductor layer, and forming a second semiconductor layer 504 on the light emitting layer 503; The first semiconductor layer 502, the light emitting layer 503, and the second semiconductor layer 504 are divided into a plurality of light emitting diode structures 505. The growth substrate 500 may be various suitable growth substrates, for example, a material of the growth substrate may be a semiconductor substrate material such as silicon (Si), silicon carbide (SiC), sapphire (Al$_2$O$_3$), gallium arsenide (GaAs), lithium aluminate (LiAlO$_2$), and in the present embodiment, the growth substrate 500 may be a silicon (Si) based material such as silicon (Si) or silicon carbide (SiC).

Figure 47:
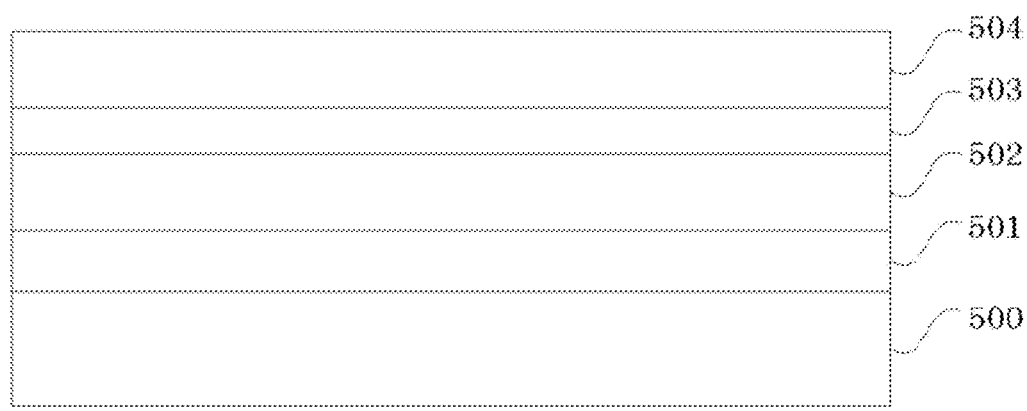
FIG. 47 through FIG. 51 show a forming process of a micro light emitting diode of an embodiment of the present disclosure.

Referring to FIG. 47, in various embodiments, when the buffer layer 501 is formed on the substrate 500, for example, the semiconductor equipment 100 of the present disclosure may be used, and a high-quality buffer layer 501 may be formed on the growth substrate 500 by a physical vapor deposition (PVD) process, and the material of the buffer layer 501 may be a low-temperature nucleation layer formed of aluminum nitride (AlN), gallium nitride (GaN), or the like. The buffer layer 501 can be used to reduce lattice mismatch between the growth substrate and the first semiconductor layer, so as to reduce lattice defects caused by lattice mismatch, reduce dislocation density, and improve the quality of the micro light emitting diode.

Referring to FIG. 47, the first semiconductor layer 502 may be formed on the buffer layer 501 and the second semiconductor layer 504 may be formed on the light emitting layer 503. The first semiconductor layer 502 may be an N-type semiconductor layer doped with a first impurity or a P-type semiconductor layer doped with a second impurity. The corresponding second semiconductor layer 504 may be a p-type semiconductor layer doped with a second impurity, or an N-type semiconductor layer doped with a first impurity. A light emitting layer 503 may be formed on the first semiconductor layer 502, and the light emitting layer 503 may be, for example, an intrinsic semiconductor layer or a low-doped semiconductor layer (the doping concentration of which is lower than that of a semiconductor layer of the same doping type adjacent to each other), or may be a light emitting layer formed of a quantum well. In various embodiments, the light emitting layer 503 is, for example, a quantum well light emitting layer. For example, indium gallium nitride (InGaN) may be selected. In some embodiments, the light emitting layer 503 may emit a blue light band, and the material of the blue light band light emitting layer may be one or more of materials such as indium gallium nitride (InGaN), zinc selenide (ZnSe), indium gallium nitride/gallium nitride (InGaN/GaN). However, it is not limited thereto, and in different embodiments, the light emitting layer 503 may also be a material of a light emitting layer that emits green light or red light band.

Referring to FIGS. 48 to 51, in the process of dividing the first semiconductor layer 502, the light emitting layer 503, and the second semiconductor layer 504 into a plurality of light emitting diode structures 505. For example, the first semiconductor layer 502, the light emitting layer 503, and the second semiconductor layer 504 may be divided into a plurality of light emitting diode structures by etching, laser scribing grooves, or other methods, each of which includes a part of the first semiconductor layer 502, the light emitting layer 503, and the second semiconductor layer 504.

Referring to FIGS. 48 to 51, in one embodiment, when divided into a plurality of light emitting diode structures 505, specifically, a recess or a groove is provided on the structure after the second semiconductor layer 504 is formed, so as to distinguish the first semiconductor layer 502, the light emitting layer 503 and the second semiconductor layer 504 into a plurality of light emitting diode structures. Then, a first electrode 505 may be formed on the separated first semiconductor layer 502, and a second electrode 506 may be formed on the separated second semiconductor layer 504. Thereafter, a passivation layer 507 is formed on the separated second semiconductor layer 502. Then, the growth substrate 500 and the buffer layer 501 may be removed (e. g. etched) to form a plurality of separated light emitting diode structures (e. g. micro light emitting diode structures or micro light emitting diode chips).

Figure 48:
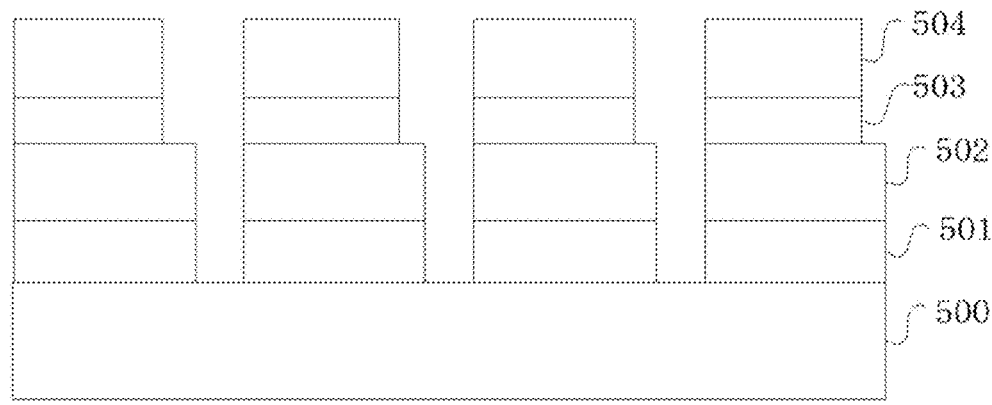

Referring to FIG. 48, when divided into a plurality of light emitting diode structures, specifically, a recess is formed on the second semiconductor layer 504. The recess may include a first recess and a second recess, and the first recess is formed from the second semiconductor layer 504 to the growth substrate 500. The second recess extends from the second semiconductor layer 504 to the first semiconductor layer 502, and the first recess and the second recess may be formed by etching or laser scribing. When a recess is formed on the second semiconductor layer 504, specifically, a layer of photoresist is formed on the second semiconductor layer 504. dissolving the photoresist by using a photolithography process to obtain a photoresist pattern of a set pattern, and under protection of the photoresist, in this embodiment, for example, an inductively coupled plasma etching process is used to arrange the first recess from the second semiconductor layer 504 to the growth substrate 500 on the second semiconductor layer 504. The first recess passes through the second semiconductor layer 504, the light emitting layer 503, the first semiconductor layer 502, and the buffer layer 501 to reach the growth substrate 500. Then, the second etching is performed, and the first recess is etched on one side of the first recess by the same method, and the first recess passes through the second semiconductor layer 504 and the light emitting layer 503 to be in contact with the first semiconductor layer 502, wherein the first recess is connected with the second recess to form a step shape.

Figure 49:
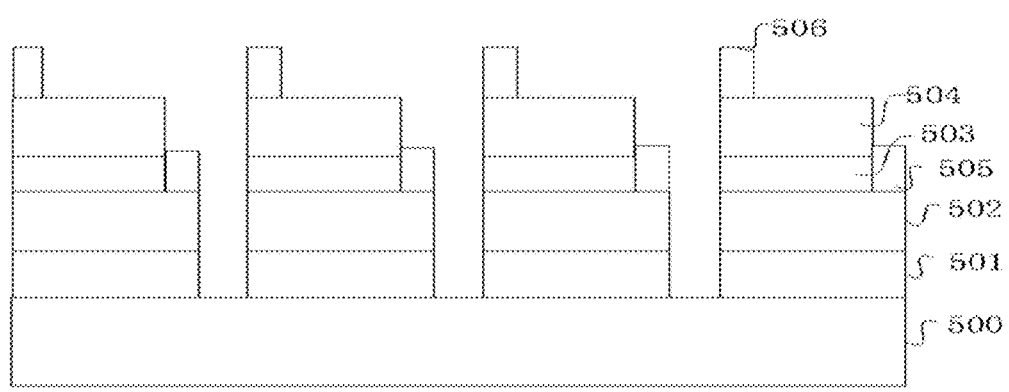

Referring to FIG. 49, when the first electrode 505 is formed on the first semiconductor layer 502 and the second electrode 506 is formed on the second semiconductor layer 504, specifically, the first electrode 505 may be formed on each exposed first semiconductor layer 502 by an evaporation and/or sputtering technique, and the second electrode 506 may be formed on the second semiconductor layer 504, and the first electrode 505 may be located in the second recess. The material of the first electrode 505 and the second electrode 506 may be an opaque conductive material, and the opaque conductive material may include a metal material such as titanium (Ti), platinum (Pt), gold (Au), chromium (Cr), and the like, and the opaque conductive material may also be a highly reflective material such as aluminum (Al), silver (Ag), so that the first electrode 505 and the second electrode 506 are highly reflective electrodes, and when the light emitting layer 503 emits light, the absorption of the electrodes is reduced and the luminous brightness is improved. In other embodiments, tin balls may also be formed on first semiconductor layer 502 and second semiconductor layer 504 by reflow soldering with a shield gas flow.

Figure 50:
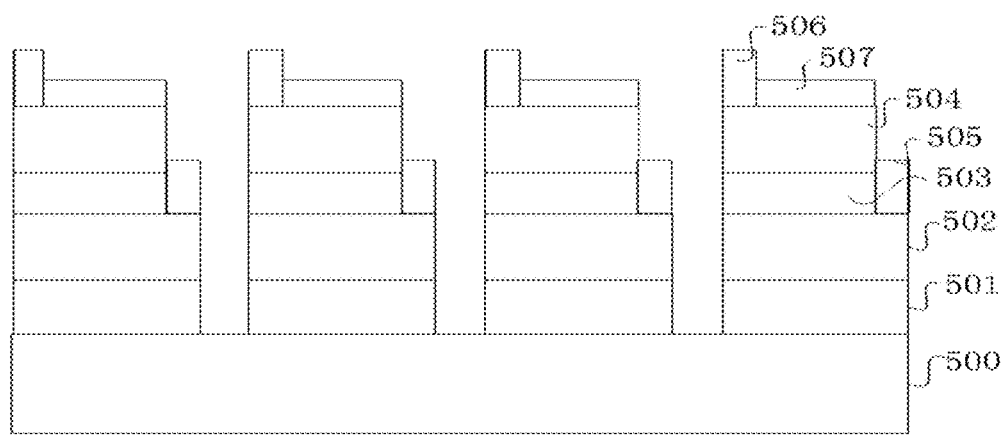

Referring to FIG. 50, when a passivation layer 507 is formed on the second semiconductor layer 502, specifically, a layer of passivation layer 507 is first formed on the surface of the second semiconductor layer 504, then a patterned photoresist layer can be formed on the passivation layer 507, the passivation layer is etched according to the patterned photoresist layer to form the patterned passivation layer 507, and then the patterned photoresist layer is removed and cleaned. In the present embodiment, the passivation layer 507 is further located near the first electrode 505 and the second electrode 506. The material of the passivation layer 507 includes, for example, silicon oxide or aluminum oxide, and protects the micro light emitting diode structure. The problem of reverse leakage is avoided, the reliability of the diode structure is improved, and the material of the passivation layer 507 can be selected as silicon oxide. The holes are conveniently etched, and in some embodiments, the passivation layer 507 may be etched by buffering a silicon oxide etching solution or a dry process.

Figure 51:
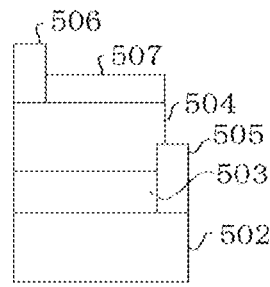
Figure 52:
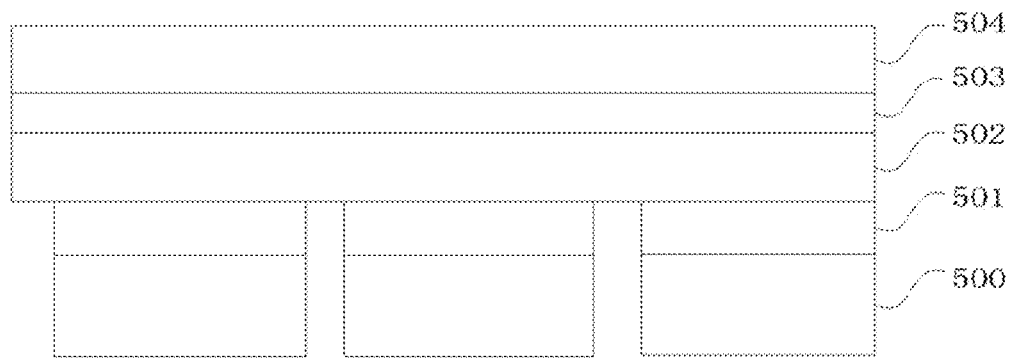
FIG. 52 through FIG. 58 show a forming process of another micro light emitting diode chip in an embodiment of the present disclosure.
Figure 53:
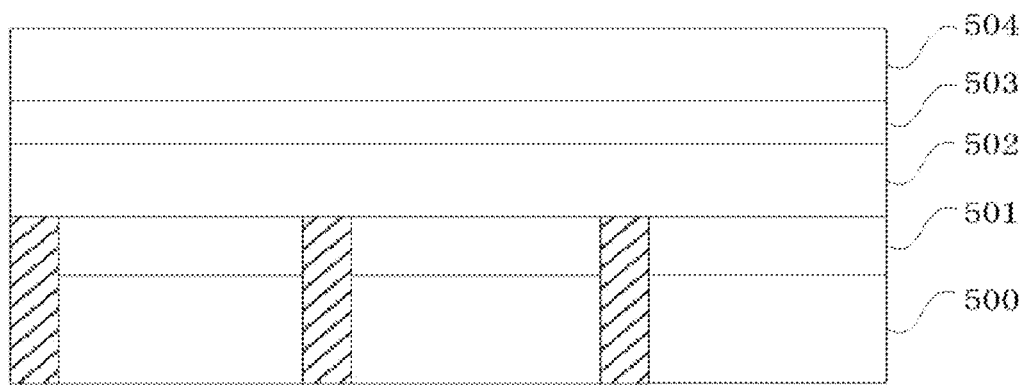
Figure 54:
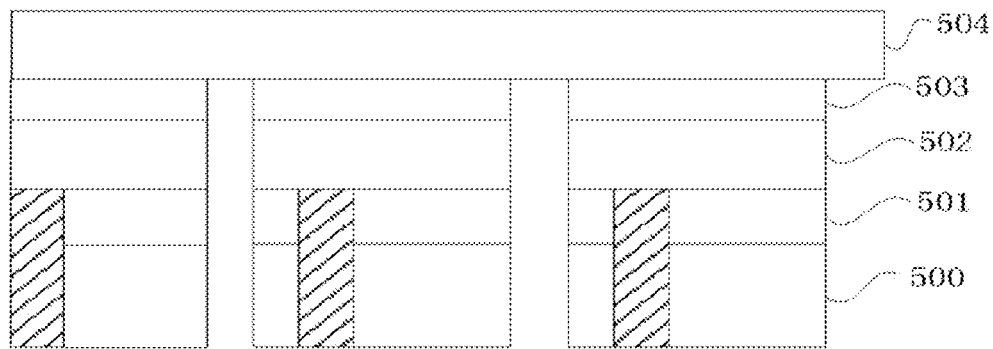
Figure 55:
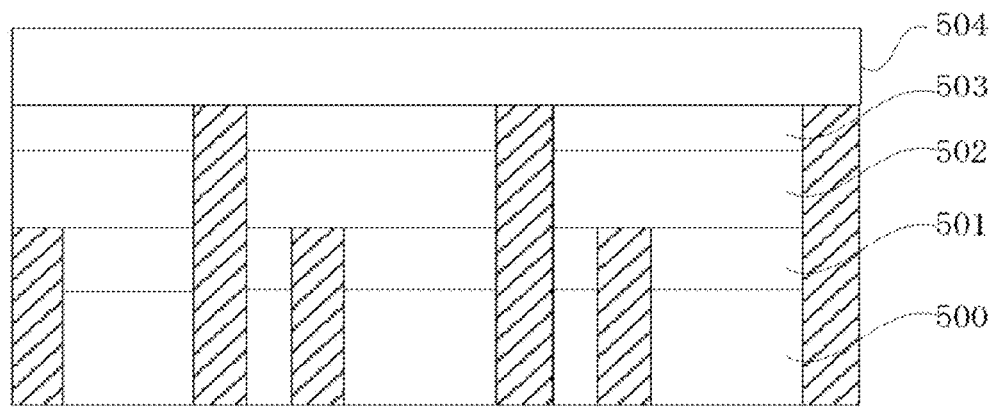
Figure 56:
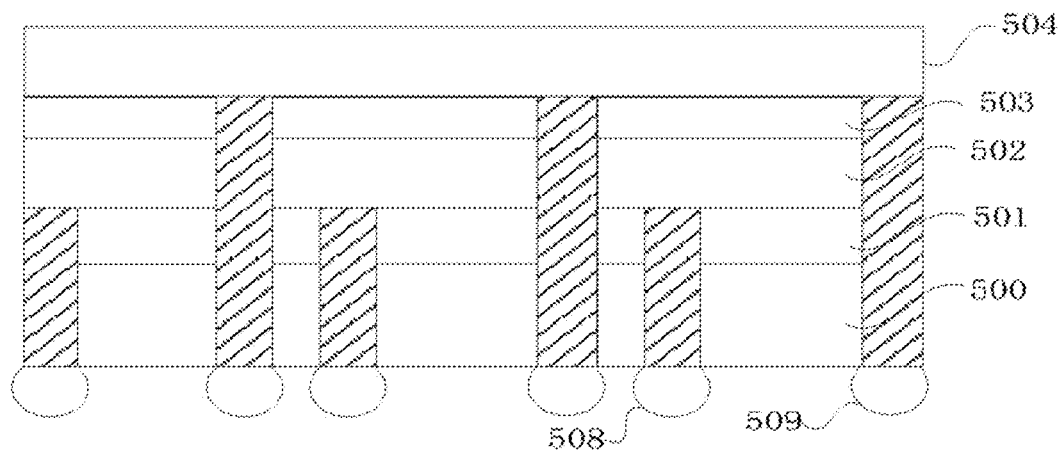

Referring to FIG. 51, when the growth substrate 500 and the buffer layer 501 are removed, specifically, the growth substrate 500 and the buffer layer 501 may be etched by using, for example, an etching technique. to obtain a plurality of micro light emitting diode structures, the etching technology comprising dry etching and wet etching; In the wet etching, an etchant is required, and the etchant may be, for example, nitric acid, hydrofluoric acid, peroxide, alkali, ethylenediamine catechol, amine gallate, TMAH, hydrazine, or the like.

However, in some embodiments, after the growth substrate 500 and the buffer layer 501 are removed, the first electrode 505 is formed on the bottom surface exposed by the first semiconductor layer 502, thereby forming a vertically conductive light emitting diode structure.

Referring to FIGS. 47 to 51, by means of the miniature light emitting diode structure and the manufacturing method thereof provided by this embodiment, a plurality of miniature light emitting diode structures can be obtained at the same time, and the manufacturing efficiency of the miniature light emitting diode can be improved.

Referring to FIGS. 52 to 58, in another embodiment, when the first semiconductor layer 502, the light emitting layer 503 and the second semiconductor layer 504 are divided into a plurality of light emitting diode structures 505, specifically, the growth substrate 500 and the buffer layer 501 are etched to form a plurality of first channels; filling the first channel with a conductor material; etching the growth substrate 500, the buffer layer 501, the first semiconductor layer 502 and the conductive layer 503 to form a plurality of second channels; filling the second channel with a conductor material; forming a first tin ball 508 on the conductor material of the first channel, and forming a second tin ball 509 on the conductor material of the second channel; a passivation layer is formed on the second semiconductor layer 504; a recess is provided on the second semiconductor layer 504; the first semiconductor layer 502, the light emitting layer 503 and the second semiconductor layer 504 are divided into a plurality of light emitting diode structures; the recess passes through the passivation layer 507, the second semiconductor layer 504, the light emitting layer 503, the first semiconductor layer 502, the buffer layer 501 and the growth substrate 500; and the whole structure is divided into a plurality of micro light emitting diode structures.

Referring back to FIG. 53, when the first channel is filled with a conductor material, specifically, the conductor material may be filled in the first channel, for example, a vapor deposition method, a film, a paste, a liquid coating, a casting, or a combination thereof under vacuum may be used. For example, a reflective metal layer is deposited on the first semiconductor layer 502 through the first channel, and then a conductor material is used to fill the channel and form a contact. As described above, the conductor material may include a conductive metal and a metal oxide such as Al, Au, Cu, Ag, Pt, etc.

Referring to FIG. 54 again, when the growth substrate 500, the buffer layer 501, the first semiconductor layer 502 and the conductive layer 503 are etched to form a plurality of second channels, specifically, the growth substrate 500, the buffer layer 501, the first semiconductor layer 502 and the conductive layer 503 are etched by an etching technique, and the etching technique includes dry etching and wet etching. The second channel may be any desired shape, and the first channel passes through the growth substrate 500, the buffer layer 501, the first semiconductor layer 502, and the conductive layer 503 to reach the second semiconductor layer 504.

Referring back to FIG. 55, when the second channel is filled using the semiconductor material, specifically, the conductor material is filled in the second channel, and may include a vapor deposition method, a film, a paste, a liquid coating, a casting, or a combination thereof, optionally under vacuum. For example, a reflective metal layer is deposited on the second semiconductor layer 504 through the second channel, followed by filling the channel with a conductor material and forming a contact.

Referring back to FIG. 56, when the first tin ball 508 is formed on the conductor material of the first channel and the second tin ball 509 is formed on the conductor material of the second channel, specifically, the first tin ball 508 is formed by reflow soldering of a protective gas flow on the conductor material of the first channel, and the second tin ball 509 is formed on the conductor material of the second channel, and the first tin ball 508 and the second tin ball 509 may be disposed on the same horizontal plane. However, other electrical connectors such as pins may be formed on the electrodes in addition to the tin balls.

Figure 57:
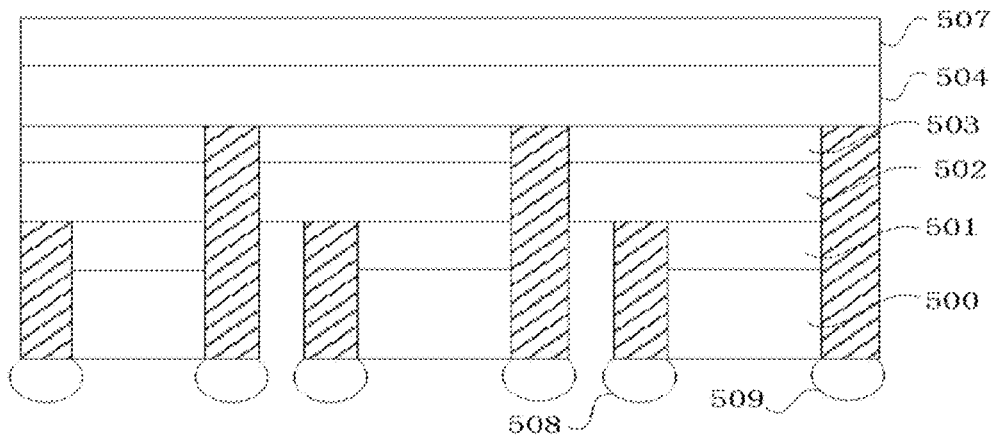
Figure 58:
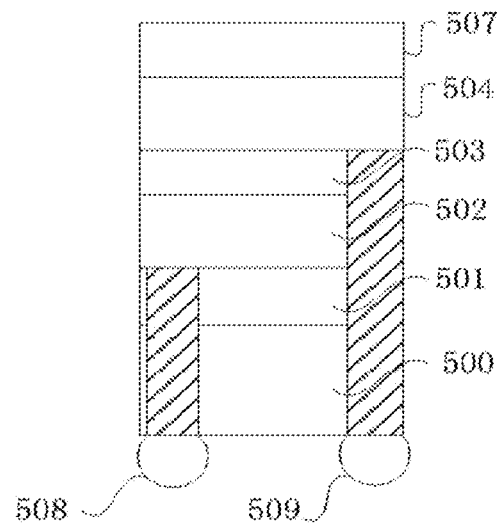

Referring back to FIG. 57, when a passivation layer is formed on the second semiconductor layer 504, the material of the passivation layer 507 may include, for example, silicon oxide or aluminum oxide, and may protect the diode structure, avoid problems such as reverse leakage, and improve the reliability of the diode structure. The material of the passivation layer may be selected from silicon oxide to facilitate etching of the holes, and the passivation layer may be etched by buffering the silicon oxide etching solution or dry etching. In some embodiments, as shown in FIG. 57, a plurality of micro light emitting diode structures may be integrated into a micro light emitting diode chip through a passivation layer 507, a package or a packaging adhesive. The plurality of micro light emitting diode structures of the micro light emitting diode chip may have the same light color (for example, blue light) or different light colors.

Referring to FIGS. 57 to 58 again, when a recess is provided on the second semiconductor layer 504, the first semiconductor layer 502, the light emitting layer 503 and the second semiconductor layer 504 are divided into a plurality of light emitting diode structures. Specifically, a recess is provided on the second semiconductor, and the recess penetrates through the passivation layer 507, the second semiconductor layer 504, the light emitting layer 503, the first semiconductor layer 502, the buffer layer 501 and the growth substrate 500. An etching or laser scribing groove may be used for the opening process. The recess passes through the second semiconductor layer 504, the light emitting layer 503, the first semiconductor layer 502, the buffer layer 501 and the growth substrate 500 to obtain a plurality of micro light emitting diode structures.

Referring to FIGS. 59 to 68, in yet another embodiment, when the first semiconductor layer 502, the light emitting layer 503 and the second semiconductor layer 504 are divided into a plurality of light emitting diode structures 505, specifically, the second electrode 506 is grown on the second semiconductor layer 504. The first concave portion 510 is etched on one side of the second electrode 506, and the first concave portion 510 passes through the second semiconductor layer 504, the light emitting layer 503, the first semiconductor layer 502, and the partial buffer layer 501. An insulating layer 511 is filled in the first concave portion 510, and the insulating layer 511 fills the first concave portion 510 and a part of the second semiconductor layer 504, and the insulating layer 511 is connected to a side surface of the second electrode 506. A second concave portion 512 is formed on a side close to the first concave portion 510, and the second concave portion 512 passes through the second semiconductor layer 504, the light emitting layer 503, the first semiconductor layer 502, and the partial buffer layer 501. filling the second concave portion 512 with a conductive material, the conductive material filling the second concave portion 512 and a part of the insulating layer 511, and being connected to one side of the second electrode 506 with respect to the light emitting layer 503 to form a second electrode extension structure 513; growing a passivation layer 507 on the second semiconductor layer 504; etching the growth substrate 500 and the buffer layer 501; forming a first electrode 505 on the first semiconductor layer 502; forming a first tin ball 508 on the first electrode 505, and forming a second tin ball 507 on the second electrode extension structure; The overall structure is divided into a plurality of micro light emitting diode structures.

Figure 59:
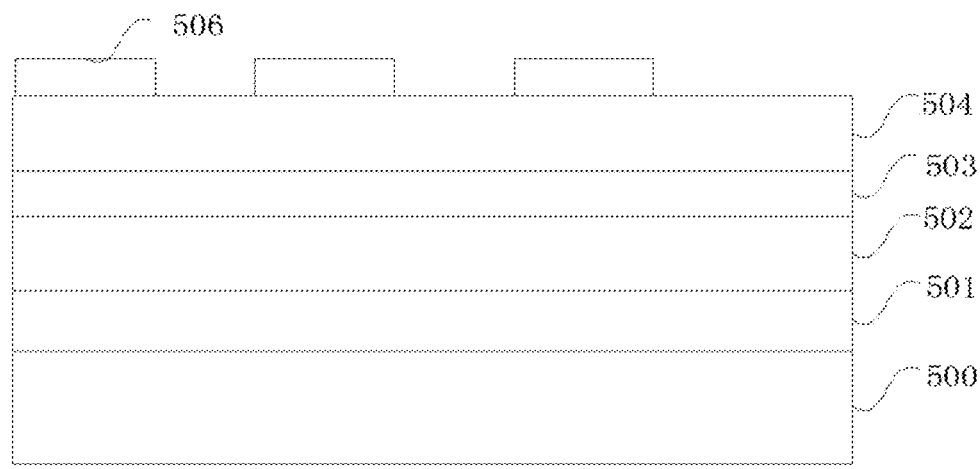
FIG. 59 through FIG. 68 show a forming process of another micro light emitting diode chip in an embodiment of the present disclosure.

Referring to FIG. 59, when the second electrode 506 is grown on the second semiconductor layer 504, specifically, a plurality of second electrodes 506 may be formed on the second semiconductor layer 504 by evaporation and/or sputtering technology, and a predetermined distance exists between adjacent second electrodes 506.

Figure 60:
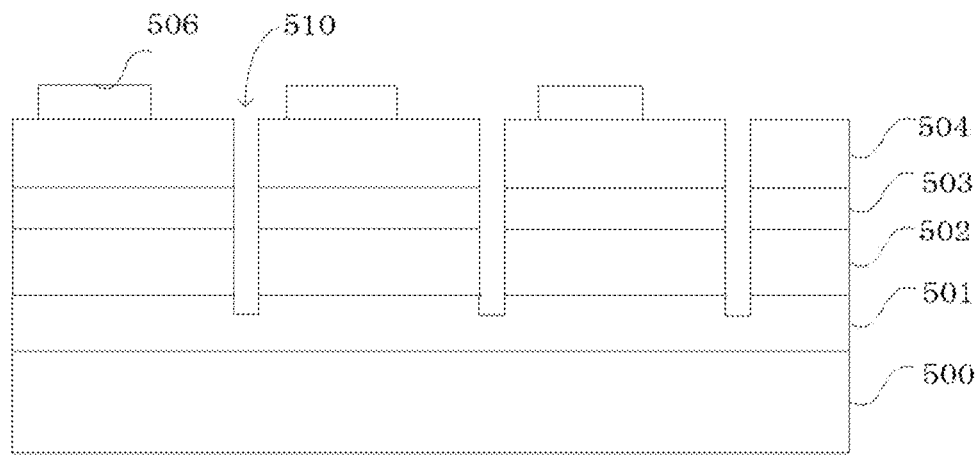

Referring to FIG. 60, when the first concave portion 510 is etched on one side of the second electrode 506, specifically, a photoresist pattern with a set pattern may be formed on the second semiconductor layer 504. Under the protection of the photoresist, the first concave portion 510 is formed on the second semiconductor layer 504 by, for example, a dry etching or wet etching process. The first concave portion 510 passes through the second semiconductor layer 504, the light emitting layer 503, the first semiconductor layer 502, and the partial buffer layer 501.

Figure 61:
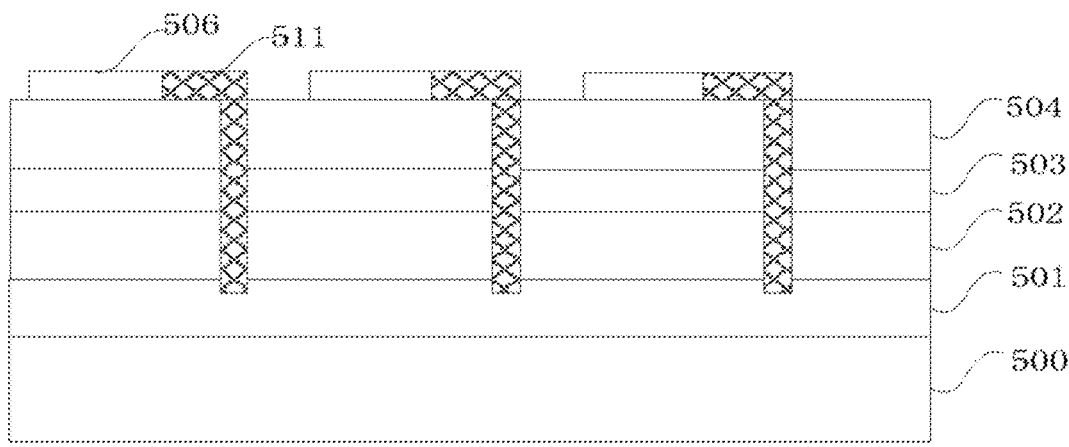

Referring to FIG. 61, when the insulating layer 511 is filled in the first concave portion 510, specifically, the first concave portion 510 is filled with an insulating material, and the insulating material is connected to a side surface of the second electrode 506 to form the insulating layer 511. The insulating material includes, for example, SiOx, SiNx, and SiON, or other inorganic insulating material.

Figure 62:
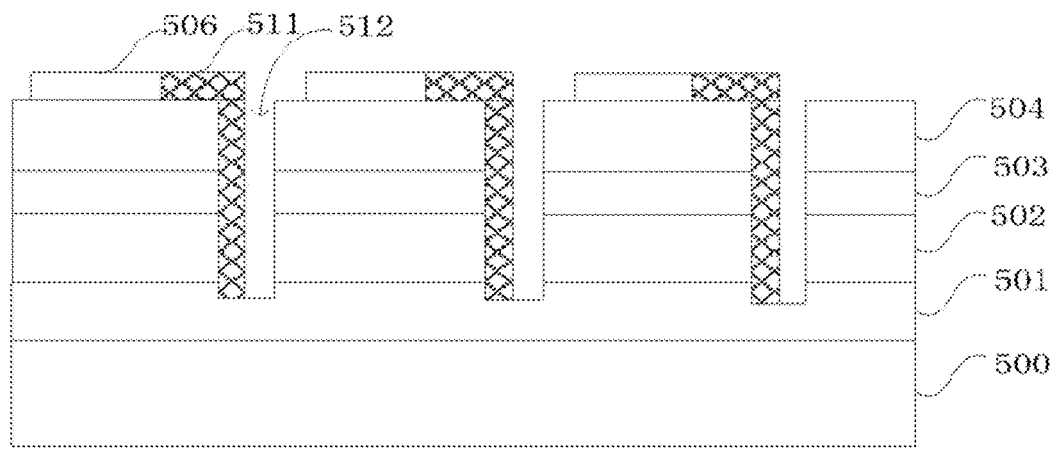

Referring to FIG. 62, when the second concave portion 512 is formed on a side close to the first concave portion 510, specifically, a photoresist pattern of a set pattern is formed on the second semiconductor layer 504. Under the protection of the photoresist, the second concave portion 512 is formed on the second semiconductor layer 504 by, for example, a dry etching or wet etching process. The second concave portion 512 passes through the second semiconductor layer 504, the light emitting layer 503, the first semiconductor layer 502, and the partial buffer layer 501. The depth of the second concave portion 512 may be the same as or different from the first concave portion 510.

Figure 63:
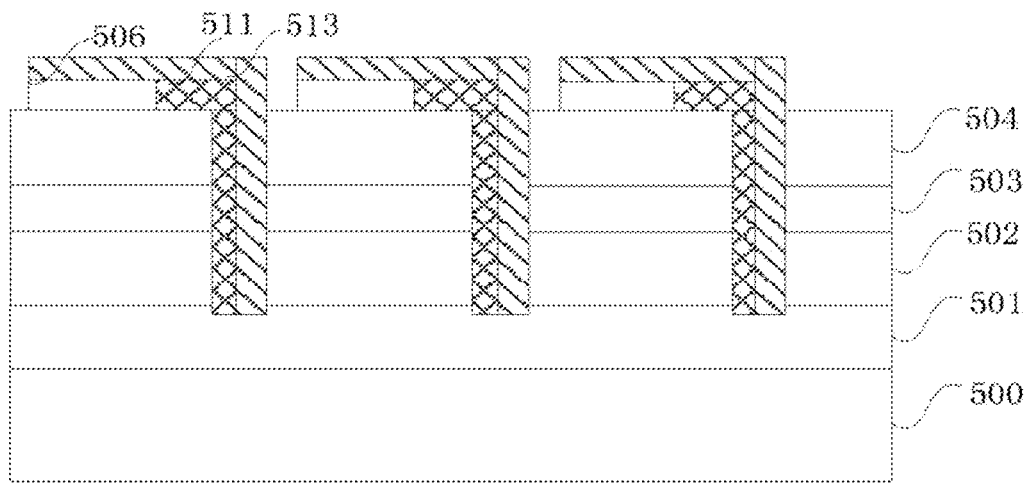

Referring to FIG. 63, when the second concave portion 512 is filled with a conductive material to form the second electrode extension structure 513, specifically, the second concave portion 512 is filled with a conductive material, and the conductive material fills the second concave portion 512, covers the insulating layer 511, and is connected to one side of the second electrode 506 with respect to the second semiconductor layer 504 to form the second electrode extension structure 513. The conductive material may be, for example, a conductive metal or an alloy.

Figure 64:
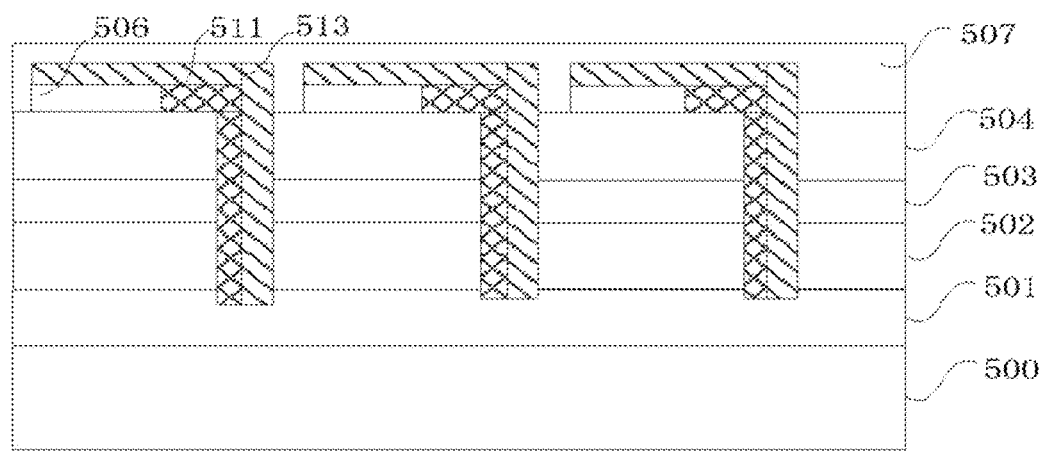

Referring to FIG. 64, when a passivation layer 507 is grown on the second semiconductor layer 504, specifically, a passivation layer 507 is formed on the second semiconductor layer 504, and the passivation layer 507 may cover the second electrode extension structure 513 and the second semiconductor layer 504. The passivation layer 507 may be, for example, a material such as silicon oxide. However, in some embodiments, the passivation layer 507 may be formed on the second semiconductor layer 504 and the second electrode 506 as a protective layer or package.

Figure 65:
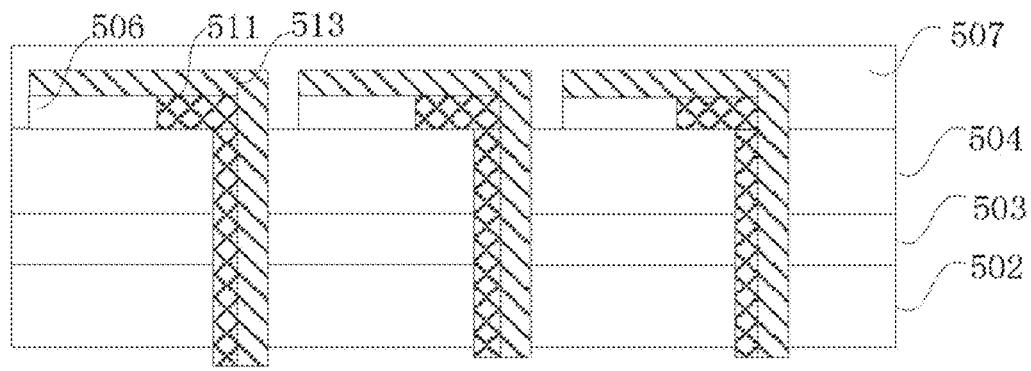

Referring to FIG. 65, when the growth substrate 500 and the buffer layer 501 are removed (e. g. etched), specifically, the growth substrate 500 and the buffer layer 501 are etched by using, for example, an etching technique including dry etching and wet etching. By etching the growth substrate 500 and the buffer layer 501, the first semiconductor layer 502 and the partial insulating layer 511 and the second electrode extension structure 513 are exposed.

Figure 66:
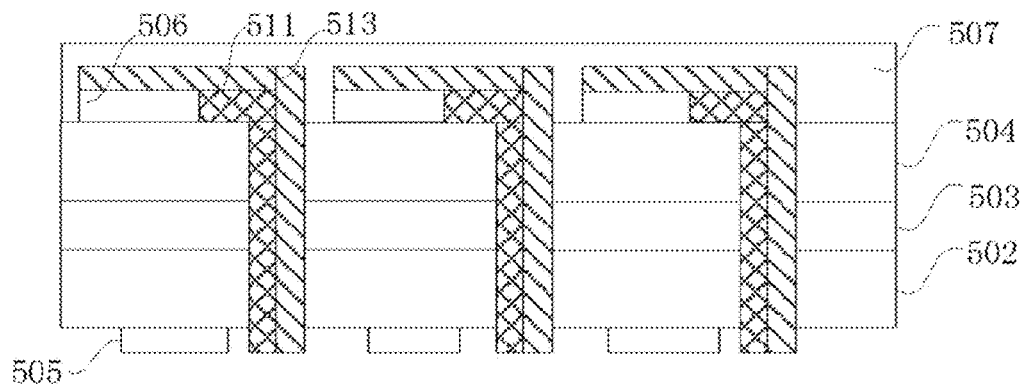

Referring to FIG. 66, when the first electrode 505 is formed on the first semiconductor layer 502, specifically, a plurality of first electrodes 505 are formed on the first semiconductor layer 502 by evaporation and/or sputtering technology, and the length of the first electrodes 505 is, for example, equal to the thickness of the insulating layer 511 to the buffer layer 501.

Figure 67:
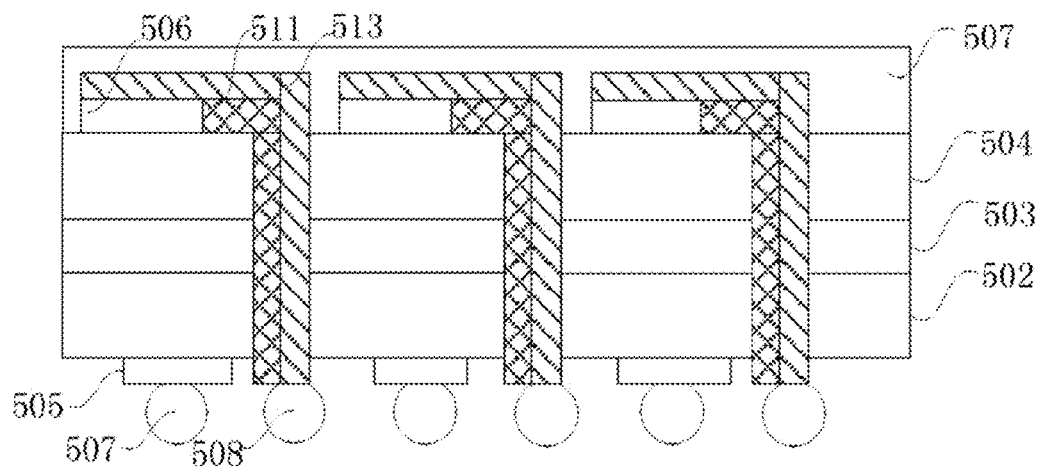

Referring to FIG. 67, when the first tin ball 508 is formed on the first electrode 505 and the second tin ball 507 is formed on the second electrode extension structure 513, specifically, the first tin ball 508 may be formed by reflow soldering of a protective airflow on the first electrode 505, the second tin ball 509 may be formed on the second electrode extension structure 513, and the first tin ball 508 and the second tin ball 509 may be disposed on the same horizontal plane. However, other electrical connectors such as pins may be formed on the electrodes in addition to the tin balls.

Figure 68:
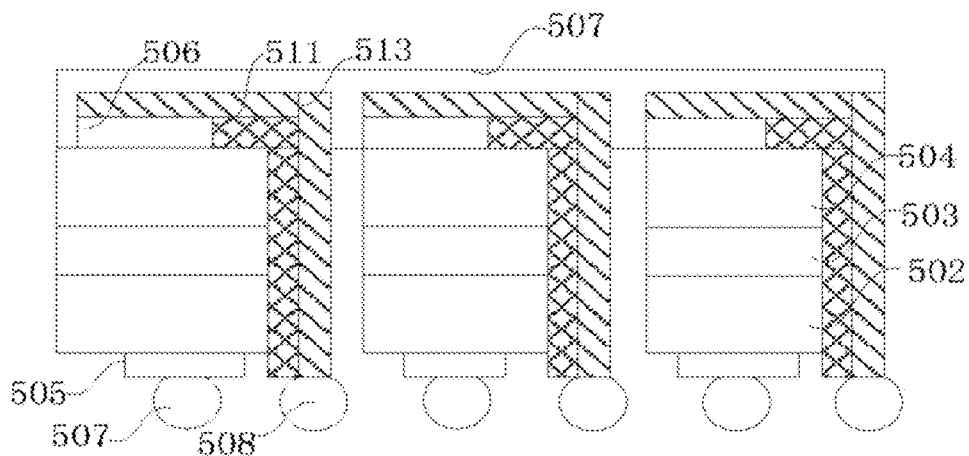

Referring to FIG. 68, when the whole structure is distinguished (separated) into a plurality of micro light emitting diode structures, specifically, a recess may be provided which passes through the first semiconductor layer 502, the light emitting layer 503 and the second semiconductor layer 505 to reach the passivation layer 507, thereby obtaining a plurality of micro light emitting diode structures. In some embodiments, as shown in FIG. 68, a plurality of micro light emitting diode structures may be integrated into a micro light emitting diode chip through a passivation layer 507, a package or a packaging adhesive. The plurality of micro light emitting diode structures of the micro light emitting diode chip may have the same light color (for example, blue light) or different light colors.

Referring to FIGS. 69 to 76, in some embodiments, the micro light emitting diode panel is manufactured by applying the semiconductor device and the micro light emitting diode chip of the present disclosure. The micro light emitting diode chip panel may include a circuit substrate 700, a substrate layer 701, and a plurality of micro light emitting diode chips 703. a plurality of electrical connectors 702 and a planarization layer 704, a light blocking layer 705, a red wavelength conversion layer 706, a green wavelength conversion layer 707, a transparent photoresist 707a, a protective layer 708, and a protective substrate 709. The substrate layer 701 is disposed on the circuit substrate 700, and the plurality of micro light emitting diode chips 703 are disposed on the substrate layer 701. A plurality of electrical connectors 702 are disposed between the substrate layer 701 and the plurality of micro light emitting diode chips 703. The planarization layer 704 is disposed on the plurality of micro light emitting diode chips 703, and the light blocking layer 705, the red wavelength conversion layer 706 and the green wavelength conversion layer 707 are disposed on the planarization layer 704. The protective layer 708 is disposed on the light blocking layer 705, the red wavelength conversion layer 706, the green wavelength conversion layer 707, and the gap between the protective layer 708. A protective substrate 709 is disposed on the protective layer 708.

Figure 69:
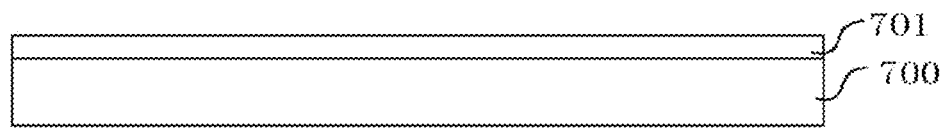
FIG. 69 through FIG. 76 show a forming process of a micro light emitting diode panel in an embodiment of the present disclosure.

Referring to FIG. 69, the circuit board 700 may be, for example, a TFT driving circuit board. A substrate layer 701 may be disposed on the circuit board 700. The substrate layer 701 may be a base layer formed of a polyimide (PI) material, and the heat resistance of the polyimide (PI) material ensures that the display panel is not destroyed in the high temperature (400 degrees centigrade). The low coefficient of thermal expansion characteristic of the polyimide (PI) material guarantees high resolution (300 ppi) and the process alignment accuracy required in the panel process. Finally, the polyimide (PI) material can be peeled off by irradiating the polyimide (PI) material with the ultraviolet-band laser light using the strong absorption characteristic of the ultraviolet light.

Figure 70:
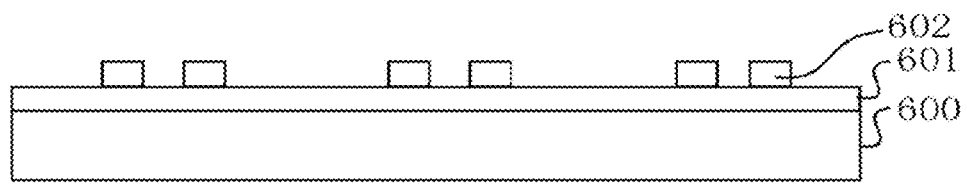
Figure 71:
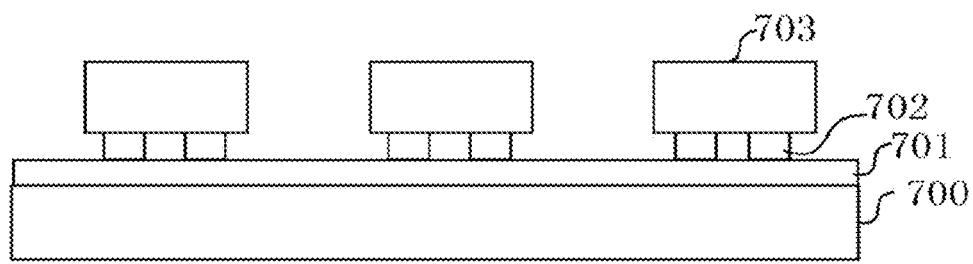

Referring to FIGS. 70 to 71, a side surface of the circuit substrate 700 near the substrate layer is further provided with a driving circuit, which is partially provided on the circuit substrate 700 and partially provided on the substrate layer 701. The function of said driving circuit is to light up the micro light emitting diode chip 703 electrically connected thereto, wherein a plurality of micro light emitting diode chips 703 may have the same or different light colors, for example, a plurality of micro light emitting diode structures emitting blue light, red light or green light. The switching of each micro light emitting diode chip 703 is controlled by a driving circuit. The brightness of the micro light emitting diode panel can be changed by controlling the number of lighted micro light emitting diode chips 703 without changing the magnitude of the current.

Referring to FIG. 71, a plurality of micro light emitting diode chips 703 can be arranged in an array on a circuit substrate 700, each micro light emitting diode chip 703 is equally spaced, and the spacing between adjacent micro light emitting diode chips 703 is less than the length or width of the micro light emitting diode chips 703, so that a display device formed by the micro light emitting diode chips has a higher resolution. The width of the micro light emitting diode chip 703 is, for example, 10 microns or less, and the adjacent micro light emitting diode chip 703 is 10 microns or less. In other embodiments, the width of the micro light emitting diode chips 703 is, for example, 5 microns or less, and adjacent micro light emitting diode chips 703 are 5 microns or less.

Figure 72:
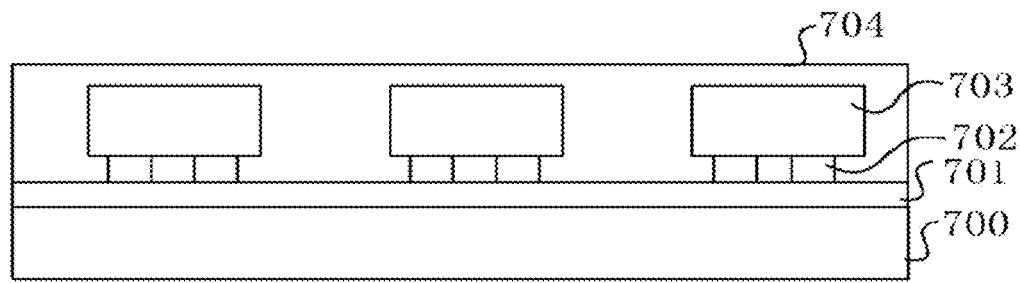

Referring to FIGS. 70-72, a plurality of electrical connectors 702 are further included between the substrate layer 701 and the plurality of micro light emitting diode chips 703, and the driving circuit on the substrate layer 701 is connected to the micro light emitting diode chips 703 via the plurality of electrical connectors 702. Said drive circuit is provided with an electrical connection point on the side of the substrate layer 701 away from the circuit substrate 700, a micro light emitting diode chip 703 is provided with an electrode on the side close to the substrate layer 701, and an electrical connector 702 can connect said electrical connection point with said electrode. The electrical connector 702 may be a metal connection, such as an indium/tin connection.

Referring to FIG. 72, a planarization layer 704 is disposed between and over a plurality of micro light emitting diode chips 703. The planarization layer 704 may comprise a polymer-based material that may be transparent, for example, may comprise a silicon-based resin, an acrylic resin, an epoxy-based resin, PI, polyethylene, etc. A planarization layer 704 is formed between and on the micro light emitting diode chips 703 through an exposure and development process.

Referring to FIG. 72, in other embodiments, the planarization layer 704 further includes a first insulating layer and a second insulating layer (not shown), wherein the first insulating layer is disposed on a side of the planarization layer 704 adjacent to the plurality of micro light emitting diode chips 703 and the second insulating layer is disposed on a side of the planarization layer 704 remote from the plurality of micro light emitting diode chips 703. In some processes for forming the planarization layer, such as a cleaning process, external impurities (e. g. moisture) may damage the micro light emitting diode chip 703. By providing a first insulating layer below the planarization layer and a second insulating layer above the planarization layer 704, moisture permeation is prevented or minimized during and after formation of the planarization layer 704. The first insulating layer and the second insulating layer comprise inorganic insulating materials such as SiOx, SiNx and SiON. The first insulating layer and the second insulating layer may comprise the same material as each other or different materials from each other. The second insulating layer may have a thickness greater than the first insulating layer. In various embodiments, the thickness of the second insulating layer may be equal to or less than the thickness of the first insulating layer.

Referring back to FIG. 72, a micro light emitting diode chip 703 includes a plurality of micro light emitting diodes, which can reduce the number of macro-transfers, reduce error loss, and improve the yield in production and manufacturing in the process of forming a micro light emitting diode panel.

Figure 73:
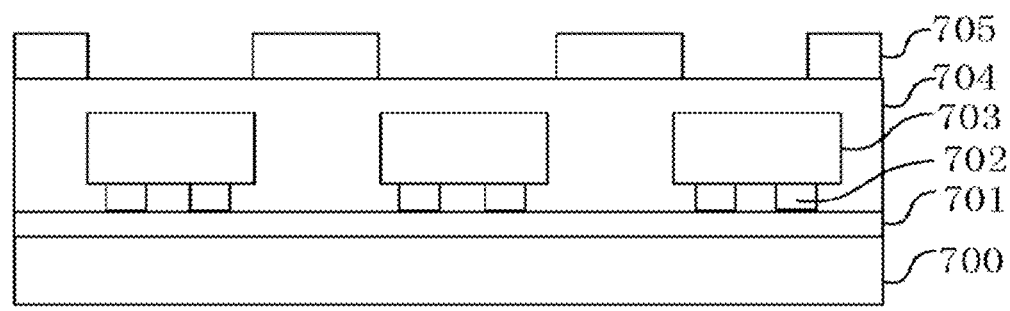

Referring to FIG. 73, a light blocking layer 705 is provided on the planarization layer 704, wherein the light blocking layer 705 comprises a plurality of light blocking layer blocks, the light emitting diode chip 703 is located at a gap of adjacent light blocking layer blocks, and the light emitted from the micro light emitting diode chip 703 passes through the gap. In this embodiment, a method of forming the light blocking layer 705 includes: forming a light blocking layer material layer on the planarization layer 704; using a patterning process to process the material layer of the light blocking layer to obtain a light blocking layer pattern, namely, a plurality of light blocking layer blocks, wherein said light blocking layer blocks are located between the micro light emitting diode chips 703; forming a photoresist layer on the material layer of the light blocking layer by means of coating, magnetron sputtering or plasma enhanced chemical vapour deposition; exposing and developing the photoresist layer to obtain a photoresist pattern; etching the material layer of the light blocking layer through a photoresist pattern, and stripping the photoresist pattern to obtain a patterned light blocking layer 705, namely, a light blocking layer composed of a plurality of light blocking layer blocks.

In some embodiments, after forming the light blocking layer 705, the surface of the light blocking layer 705 may be fluorinated using a plasma fluorination process. The surface of the light blocking layer 705 is fluorinated using a plasma fluorination process to reduce the surface tension of the resulting light blocking layer 705.

Figure 74:
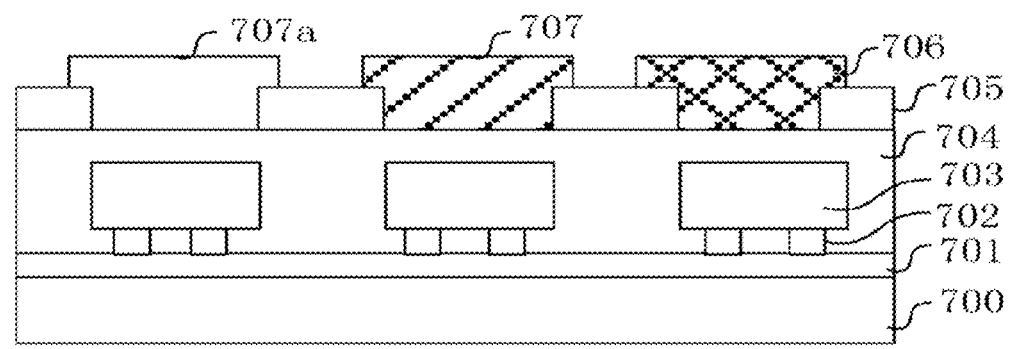

Referring to FIG. 74, when the micro light emitting diode in the micro light emitting diode chip 703 emits blue light, the micro light emitting diode panel further includes a red wavelength conversion layer 706, a green wavelength conversion layer 707, and a transparent resist 707a for converting the light emission of the micro light emitting diode into red or green light, thereby forming a full color. The red wavelength converting layer 706 and the green wavelength converting layer 707 are respectively disposed between the light blocking layers 705 and can cover the edges of the light blocking layers 705 to prevent optical light leakage. In other embodiments, a blue wavelength converting layer may also be included, which may be disposed at the interstices of the light blocking layer 705 and around the edges of the light blocking layer 705.

Referring to FIG. 74, the step of forming the red wavelength conversion layer 706 may include: forming a red photoresist film on the planarization layer 704 having the light blocking layer 705; coating a photoresist on an insulating layer formed with a red photoresist film to form a photoresist layer; using a mask plate to expose the photoresist layer from the side of the photoresist layer away from the insulating layer; developing the exposed photoresist layer; etching and stripping the photoresist layer results in a patterned red wavelength conversion layer 706.

In some embodiments, forming a red photoresist can include: using a rubber scraping plate to evenly scrape the red photoresist material over the whole insulation layer; spin coating, arranging an insulation layer coated with a red photoresist material on a spin coater by means of vacuum adsorption, dropping liquid in the center and controlling the spin coater to rotate at a high speed, so as to form a red photoresist film with a certain thickness on the insulation layer; and pre-baking to volatilize the solvent in the red photoresist film so as to enhance the adhesion of the red photoresist film to the insulating layer.

Referring to FIG. 74, repeating the method described above for obtaining the red wavelength conversion layer 706 results in a patterned green wavelength conversion layer 707. The red wavelength converting layer 706 and the green wavelength converting layer 707 are spaced apart, and reflection of light can also be prevented by the red wavelength converting layer 706, the green wavelength converting layer 707 and the light blocking layer 705.

Figure 75:
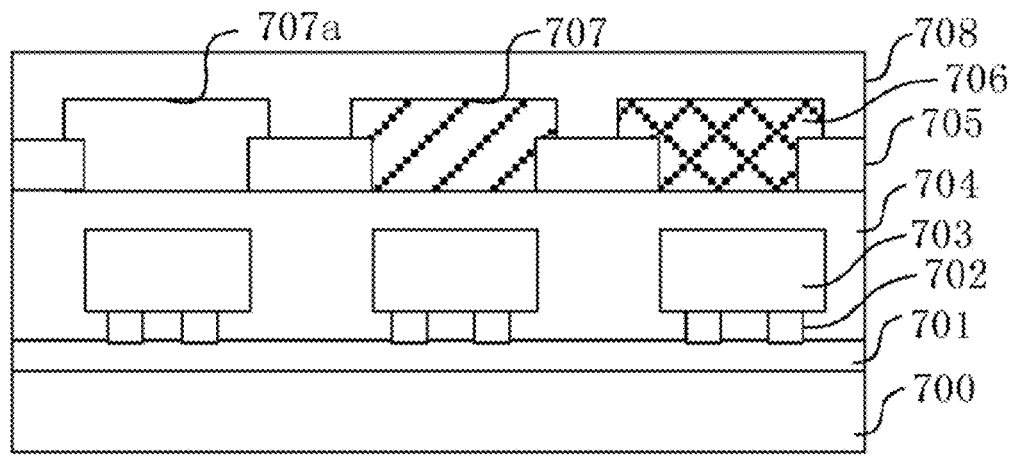

Referring to FIG. 75, in the process of forming said micro light emitting diode chip, further comprising providing a protective layer 708 on the light blocking layer 705, the red wavelength conversion layer 706, the green wavelength conversion layer 707 and the transparent photoresist 707a, wherein the protective layer 708 is located above the light blocking layer 705, the red wavelength conversion layer 706, the green wavelength conversion layer 707 and the transparent photoresist 707a. The material of the protective layer 708 may be a transparent resin material, and in this embodiment, the material of the protective layer 708 may be a propionate polymer.

Figure 76:
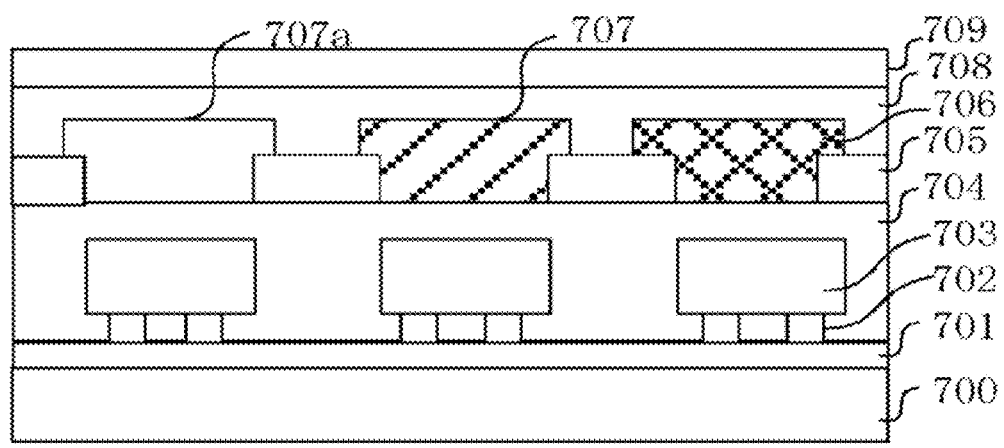

Referring to FIG. 76, in the process of forming a micro light emitting diode panel, the LED further comprises providing a protective substrate 709 on the protective layer 708, and the protective substrate 709 and the protective layer 708 are bonded to form a closed chamber.

Referring to FIGS. 77-83, the present disclosure also provides another micro light emitting diode panel and its formation process. In this embodiment, a side surface of the circuit substrate 800 near the substrate layer is further provided with a driving circuit, which is partially provided on the circuit substrate 800 and partially provided on the substrate layer 801. The micro light emitting diode chip 803 electrically connected thereto can be illuminated by the action of the driving circuit. The brightness of the micro light emitting diode panel can be changed by controlling the number of lighted micro light emitting diode chips 803 without changing the magnitude of the current.

Figure 77:
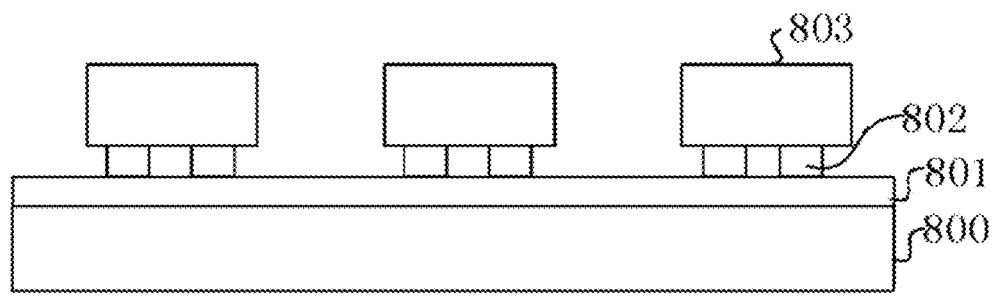
FIG. 77 through FIG. 83 show a forming process of another micro light emitting diode panel in an embodiment of the present disclosure.

Referring to FIG. 77, a plurality of electrical connectors 802 are further included between the substrate layer 801 and the plurality of micro light emitting diode chips 803, and the driving circuit on the substrate layer 801 is connected to the micro light emitting diode chips 703 via the plurality of electrical connectors 802. Said drive circuit is provided with an electrical connection point on the side of the substrate layer 801 away from the circuit substrate 800; the side of the micro light emitting diode chip 803 close to the substrate layer 801 is provided with an electrode; and an electrical connector 802 can connect said electrical connection point with said electrode. The electrical connector 802 may be a metal connection, such as an indium/tin connection or a tin ball.

Figure 78:
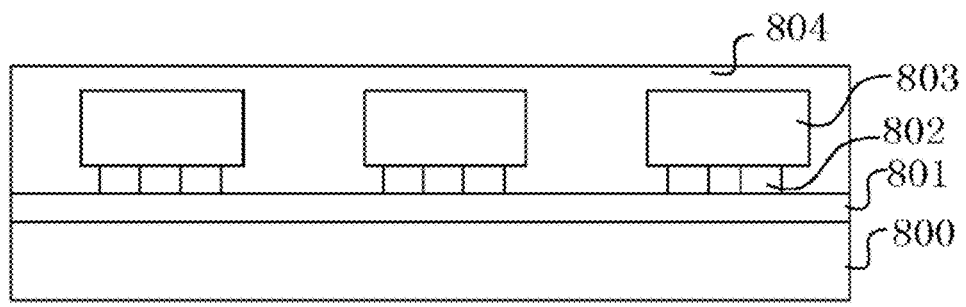

Referring to FIG. 78, a planarization layer 804 is provided between and above a plurality of micro light emitting diode chips 803, and the planarization layer 804 is formed between and above the micro light emitting diode chips 803 through an exposure and development process.

Referring to FIG. 78, in some embodiments, the planarization layer 804 can include an optical layer that can improve the luminous efficiency of the light emitted from the micro light emitting diode structure or reduce chromatic aberration, converging the diverging light rays out at a smaller divergence angle. The optical layer may include a layer having a shape of a concave lens or a convex lens and may include a plurality of layers having different refractive indices.

Figure 79:
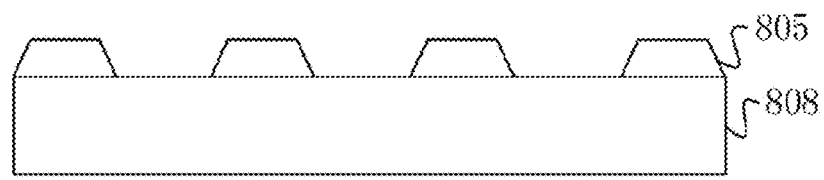

Referring to FIG. 79, a transparent substrate 809 is provided, and a light blocking layer 805 is provided on the transparent substrate 809, wherein the light blocking layer 805 comprises a plurality of light blocking layer blocks. In some embodiments, a method for forming the light blocking layer 805 comprises: forming a light blocking layer material layer on the transparent substrate 809; using a patterning process to process the material layer of the light blocking layer to obtain a light blocking layer pattern, namely, a plurality of light blocking layer blocks, wherein each of said light blocking layer blocks has a gap therebetween.

Figure 80:
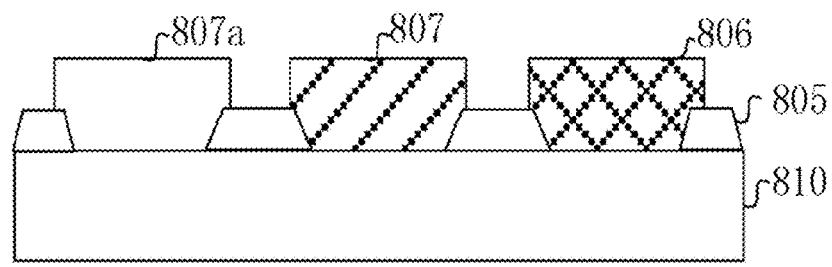

Referring to FIG. 80, when the micro light emitting diode in the micro light emitting diode chip 803 emits blue light, a micro light emitting diode panel further comprises a red wavelength conversion layer 806, a green wavelength conversion layer 807 and a transparent photoresist 807a, wherein the red wavelength conversion layer 806, the green wavelength conversion layer 807 and the transparent photoresist 807a are respectively arranged at the gap of the light blocking layer 805 and cover the edge of the light blocking layer 805 to prevent optical light leakage, and the red wavelength conversion layer 806 and the green wavelength conversion layer 807 are arranged at intervals.

Referring to FIG. 80, the step of forming the red wavelength conversion layer 806 includes: forming a red photoresist film on a transparent substrate 808 having a light blocking layer; coating a photoresist on an insulating layer formed with a red photoresist film to form a photoresist layer; using a mask plate to expose the photoresist layer from the side of the photoresist layer away from the insulating layer; developing the exposed photoresist layer; etching and stripping the photoresist layer results in a patterned red wavelength conversion layer 806.

Referring to FIG. 80, repeating the method described above to obtain the red wavelength conversion layer 806 results in a patterned green wavelength conversion layer 807. The red wavelength converting layer 806, the green wavelength converting layer 807 are spaced apart, and reflection of light can be prevented by the red wavelength converting layer 806, the green wavelength converting layer 807, and the light blocking layer 805.

Figure 81:
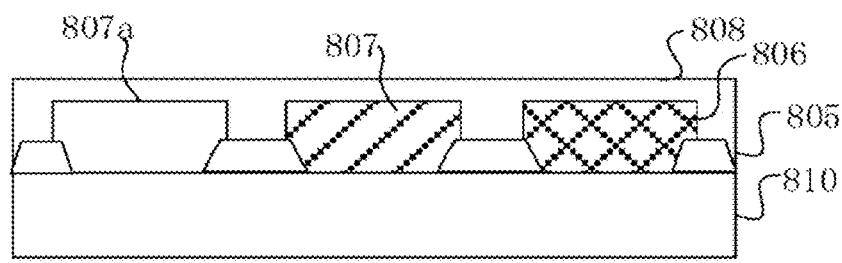

Referring to FIG. 81, forming a micro light emitting diode chip further includes forming a protective layer 808 over the light blocking layer 805, the red wavelength converting layer 806, the green wavelength converting layer 807, and the transparent resist 807a. The material of the protective layer 808 may be a transparent resin material, and in the present embodiment, the material of the protective layer 808 may be a propionate polymer, and the protective layer 808 may be deposited by using sputtering or evaporation.

Figure 82:
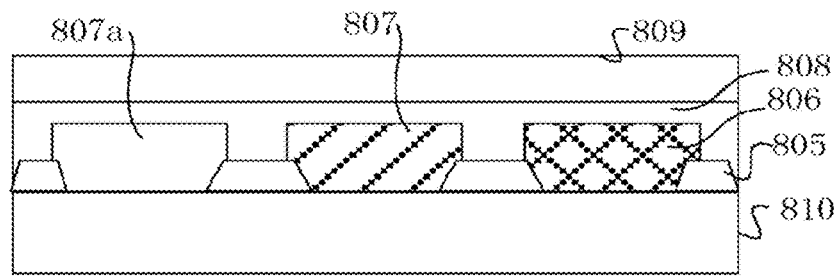

Referring to FIG. 82, in the process of forming a micro light emitting diode chip, further comprising forming a transparent conductive layer 809 on the protective layer 808, wherein the material of the transparent conductive layer 809 can be, but is not limited to, indium tin oxide, indium zinc oxide, etc. and the transparent conductive layer 809 can be deposited by using sputtering or evaporation.

Figure 83:
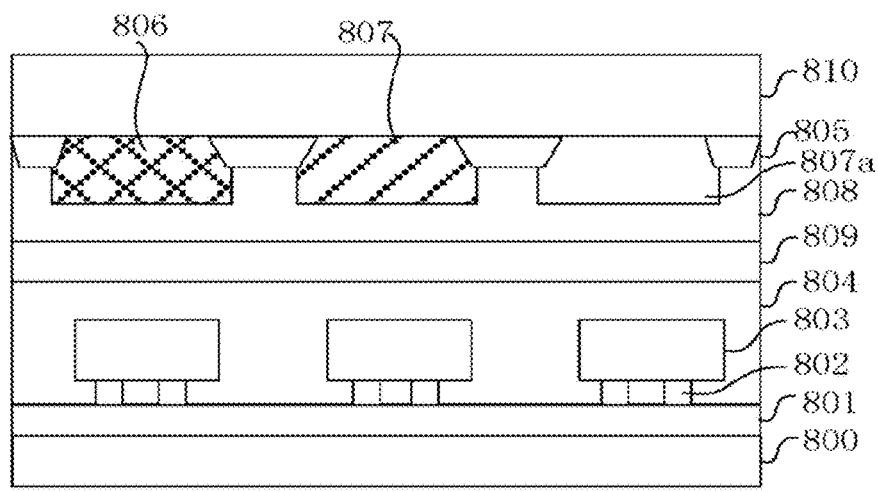

Referring to FIG. 83, a transparent substrate 808 and structures comprised thereon, including a light blocking layer 805, a red wavelength conversion layer 806, a green wavelength conversion layer 805, a protective layer 808 and a transparent conductive layer 809, are bonded to a circuit substrate 800 and a micro light emitting diode structure 801 and a deflection layer 802 thereon to form said micro light emitting diode chip.

Figure 84:
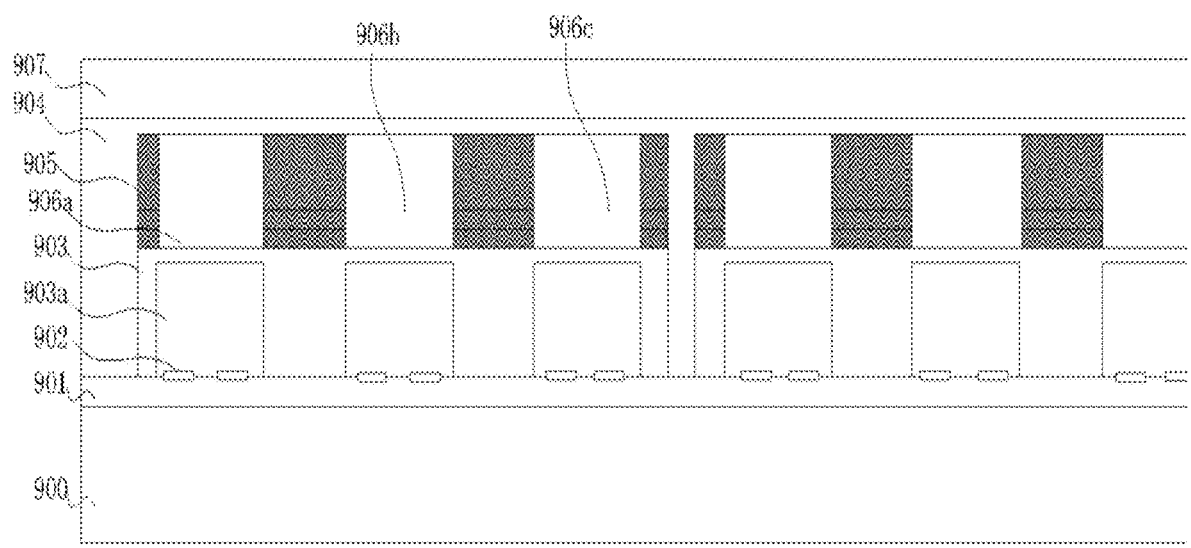
FIG. 84 is a structural diagram of a micro light emitting diode panel in an embodiment of the present disclosure.

Referring to FIG. 84, when a micro light emitting diode panel is manufactured using the semiconductor device and the micro diode chip of the present disclosure, the micro light emitting diode panel may include a circuit substrate, a plurality of micro light emitting diode chips 903, and a wavelength conversion layer 906. The circuit substrate may be a thin film transistor array substrate having a plurality of thin film transistors (Thin Film Transistor, TFT). The circuit substrate includes a substrate 900 and a circuit layer 901 generally disposed on top of the substrate 900. The substrate 900 may be a glass substrate, a sapphire substrate, etc. and the substrate 900 has a fixed property and a flat surface. The circuit layer 901 includes a driving circuit and a plurality of switching elements. The substrate 900 includes a display area and a non-display area, the non-display area includes a driving circuit thereon, and the display area includes a plurality of micro light emitting diode chips 903 thereon.

Referring back to FIG. 84, a plurality of micro light emitting diode chips 903 are arranged on a circuit substrate, the micro light emitting diode chips 903 are electrically connected to a circuit layer 901 on the circuit substrate, and a driving circuit on the circuit substrate can drive the plurality of micro light emitting diode chips 903 to emit light. A plurality of micro light emitting diode chips 903 are arranged on a circuit substrate to constitute a pixel structure, wherein the circuit substrate comprises a plurality of pixel structures, and the plurality of pixel structures are arranged in an array manner in a display area of the circuit substrate.

Referring to FIG. 84, a plurality of bonding contacts 902 are further provided on the circuit layer 901, and a plurality of micro light emitting diode chips 903 are specifically provided on the plurality of bonding contacts 902, and specifically, electrodes are provided on the micro light emitting diode chips 903, and a plurality of said electrodes are electrically connected to the plurality of bonding contacts 902. A plurality of light emitting diode chips are electrically connected to the circuit substrate by bonding contacts 902. The driving circuit on the circuit substrate may light up the micro light emitting diode chip 903 connected thereto. In this embodiment, the bonding contacts 902 may be metal bonding contacts 902, such as indium/tin bonding contacts 902. In other embodiments, the engagement contacts 902 may include BCB.

Referring to FIG. 84, the micro light diode chip 903 internally includes a plurality of micro light emitting diode structures 903a, and the plurality of micro light emitting diode structures 903a are arranged in an array in the micro light emitting diode chip 903. The distance between adjacent micro light emitting diode structures 903a is less than the width of the micro light emitting diode structures 903a, e. g. 5 microns, and the distance between adjacent micro light emitting diode structures 903a is less than 5 microns.

Referring to FIG. 84, a light blocking layer 905 is disposed over the micro light emitting diode chip 903 at a gap between adjacent micro light emitting diode structures 903a. The forward projection of the light blocking layer 905 on the circuit substrate does not overlap with the forward projection of the micro light emitting diode structure 903a on the circuit substrate. The light blocking layer 905 has the characteristics of reflectivity, scattering or absorption, and the light blocking layer 905 is disposed between the adjacent micro light emitting diode structures 903a to prevent the light emitted from the micro light emitting diode structures 903a from interfering with each other and to reduce the problem of light leakage.

Referring to FIG. 84, a wavelength conversion layer is disposed above the micro light emitting diode chip 903, and a plurality of wavelength conversion layers 906 are disposed directly above the plurality of micro light emitting diode structures 903a on the other side of the circuit substrate with respect to the micro light emitting diode chip 903. The wavelength conversion layer is located between adjacent light blocking layers 905, and the forward projection of the wavelength conversion layer overlaps the forward projection of the micro light emitting diode structure 903a on the circuit substrate. In some embodiments, the wavelength converting layer 906 encapsulates a portion of the light blocking layer 905 to reduce light leakage.

Referring to FIG. 84, at least one wavelength conversion layer 906 is formed on a plurality of micro light emitting diode chips 903, and materials for fabricating the wavelength conversion layer 906 include phosphors, quantum dots, etc. The wavelength converting layer 906 may include, for example, a first wavelength converting layer 906a, a second wavelength converting layer 906b, and a third wavelength converting layer 906c. The micro light emitting diode structures 903a are, for example, all blue light emitting micro light emitting diode structures 903a, the first wavelength converting layer 906a can be, for example, a red light wavelength converting layer 906, the second wavelength converting layer 906b can be a green light wavelength converting layer, and the third wavelength converting layer 906c can be a wavelength converting layer 906 composed of a scattering material, a wavelength converting structure, but does not change the light output of the micro light emitting diode structures 903a. Red light may be presented through the first wavelength converting layer 906a, green light may be presented through the second wavelength converting layer 906b, blue light may be presented through the third wavelength converting layer 906c, and the pixel structure may be presented with a full-color display effect through the first wavelength converting layer 906a, the second wavelength converting layer 906b, and the third wavelength converting layer 906c. In other embodiments, the wavelength converting layer 906 may also include a blue light wavelength converting layer 906. The plurality of wavelength converting layers 906 have the same thickness, so that the light conversion quality can be optimized and the light output efficiency can be uniform.

Referring to FIG. 84, in some embodiments, the micro light emitting diode chip 903 is, for example, a red light emitting micro light emitting diode chip 903, the first wavelength converting layer 906a may be a green wavelength converting layer, and the second wavelength converting layer 906b may be a blue wavelength converting layer. In other embodiments, the micro light emitting diode chip 903 is, for example, a green emitting micro light emitting diode chip 903, the first wavelength converting layer 906a may be a red wavelength converting layer, and the second wavelength converting layer 906b may be a blue wavelength converting layer. In other embodiments, the micro light emitting diode chip 903 is, for example, a micro light emitting diode chip 903 emitting ultraviolet light, the first wavelength converting layer 906a may be a red wavelength converting layer, the second wavelength converting layer 906b may be a green wavelength converting layer, and the third wavelength converting layer 906c may be a blue wavelength converting layer.

Note that the wavelength conversion layer may be formed of different color photoresist materials or quantum dot materials, and the wavelength conversion layer may be formed on the micro light emitting diode chip or on the individual micro light emitting diodes for converting the wavelength of light emitted from the micro light emitting diodes, that is, converting the color of light emitted from the micro light emitting diodes.

Referring to FIG. 84, the micro light emitting display panel comprises a protective layer 904 which is disposed between adjacent pixels and above the light blocking layer 905 and the wavelength conversion layer 906. The protective layer 904 can avoid the problem of moisture or oxidation of the micro light emitting diode panel. The micro light emitting display panel comprises a protective substrate 907 arranged on the protective layer 904, and the protective substrate 907 and the protective layer 904 are bonded to form a closed chamber.

It should be understood that the photoresist layer is disposed between the micro light emitting diode chip or the micro light emitting diode to block different light colors. In some embodiments, the photoresist layer may be, for example, a white photoresist layer or a high reflectivity barrier layer for reflecting light emitted from the micro light emitting diode. Moreover, the white or highly reflective photoresist layer may be, for example, tapered, so as to reflect the light emitted from the micro light emitting diode upward and improve the light emitting efficiency.

Figure 85:
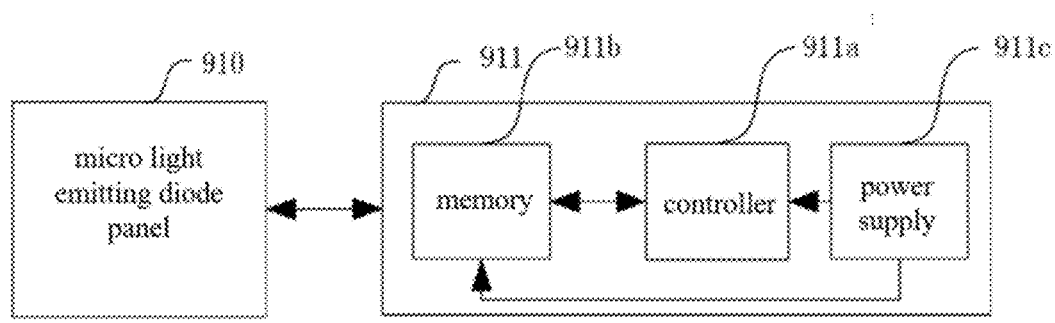
FIG. 85 is a structural block diagram of an electronic device in an embodiment of the present disclosure.

Referring to FIG. 85, the present disclosure further provides an electronic device comprising a micro light emitting diode panel 910 and an electronic device body 911, the micro light emitting diode panel 910 being connected to the electronic device body 911, wherein the micro light emitting diode panel 910 comprises a circuit substrate, a plurality of micro light emitting diode chips 903, and at least one wavelength conversion layer 906. The electronic device body 911 includes a controller 911a, a memory 911b, and a power supply 911c. Here, the power supply 911c can convert the mains power (220V AC power) into the DC power required by the controller 911a and the memory 911b, while supplying power to the micro light emitting diode panel 910. The memory 911b is connected to a power supply 911c for storing data relating to the operation of the electronic device, and the controller 911a is connected to the power supply 911c for supplying power to the controller 911a, and the controller executes the program control in the memory 911b to control the electronic device. The electronic device may be, for example, a display panel, a cell phone, a watch, a notebook computer, an on-board device, a charging device, a charging dock, a virtual reality (VR) device, an augmented reality (AR) device, a portable electronic device, a gaming machine, or other electronic device.

Figure 86:
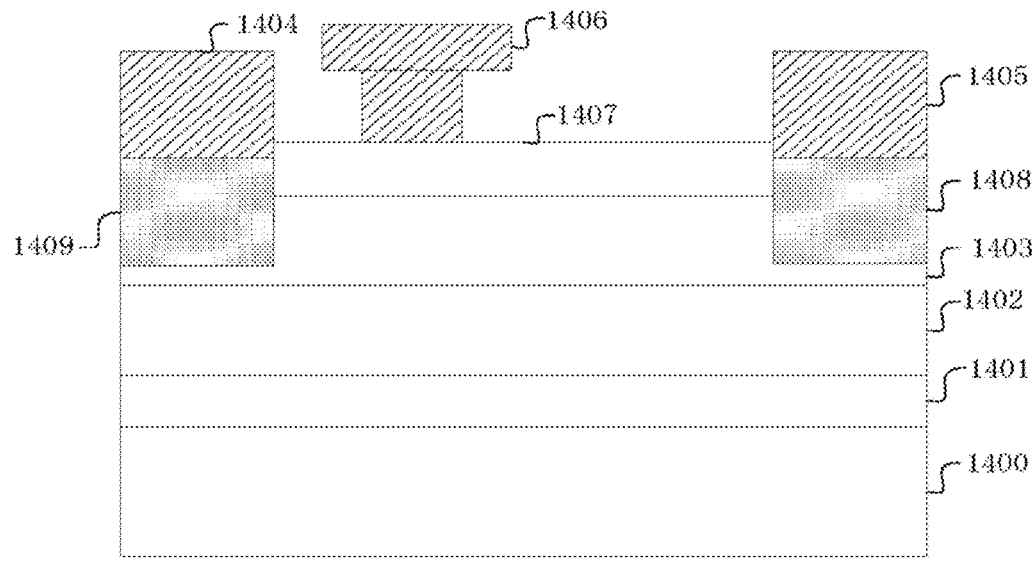
FIG. 86 is a structural diagram of a semiconductor device in an embodiment of the present disclosure.

Referring to FIG. 86, when the semiconductor epitaxial structure of the present disclosure is applied to manufacture a semiconductor device, the semiconductor device includes a substrate 1400, a buffer layer 1401, a first semiconductor layer 1402, a second semiconductor layer 1403, a source 1404, a drain 1405, and a gate 1406. Wherein a buffer layer 1401 is provided on a substrate, a first semiconductor layer 1402 is provided on the buffer layer 1401, a second semiconductor layer 1403 is provided on the first semiconductor layer 1402, a source 1404 is formed on the second semiconductor layer 1403, a drain 1405 is formed on the second semiconductor layer 1403, and a gate 1406 is formed on the second semiconductor layer 1403 and is located between the source 1404 and the drain 1405. Substrate 1400 can be a variety of suitable growth substrates 1400, and can be a semiconductor substrate 1400 material such as silicon (Si), silicon carbide (SiC), sapphire ($Al_2O_3$), gallium arsenide (GaAs), lithium aluminate ($LiAlO_2$), and in some embodiments, substrate 1400 can be a silicon (Si)-based material, such as a silicon-based material such as silicon (Si) or silicon carbide (SiC).

Referring again to FIG. 86, a buffer layer 1401 is disposed between the substrate 1400 and the first semiconductor layer 1402 to mitigate lattice mismatch between the substrate 1400 and the first semiconductor layer 1401. The material of the first semiconductor layer 1402 may be, for example, an indium-containing gallium nitride layer. To mitigate the case of lattice mismatch, the buffer layer 1401 is, for example, a gallium nitride layer, the thickness of which may be set to, for example, 5-10 nm. Meanwhile, the buffer layer 1401 disposed between the substrate 1400 and the first semiconductor layer 1402 facilitates the growth of a subsequent epitaxial structure, improving the quality of the semiconductor device.

Referring again to FIG. 86, the material of the first semiconductor layer 1402 is, for example, an indium-containing gallium nitride layer (InGaN). Using a gallium nitride layer containing indium as the first semiconductor layer 1402 can reduce the noise figure of the semiconductor device, and when the first semiconductor layer 1402 contains indium, the electron affinity increases, providing a high leakage current and a higher cut-off frequency for the semiconductor device. The thickness of the first semiconductor layer 1402 may be set to, for example, 70 to 80 nm. However, in other embodiments, the first semiconductor layer 1402 may be a gallium nitride layer.

Referring again to FIG. 86, the semiconductor device includes a second semiconductor layer 1403 on the first semiconductor layer 1402. In this embodiment, the material of the second semiconductor layer 1403 may be an indium-containing aluminum nitride layer (InAlN), and the thickness of the second semiconductor layer 1403 may be, for example, 15 to 25 nm. A higher aluminum content in the indium-containing aluminum nitride layer has a higher carrier density, resulting in a higher leakage current and transconductance of the semiconductor device while achieving a lower minimum noise figure. The second semiconductor layer 1403 uses an aluminum nitride layer containing indium to improve lattice mismatch with the buffer layer 1401. In this embodiment, InAlN can be obtained by easily diffusing at a high temperature using the principle that indium has a low melting point. The method of the second semiconductor layer 1403 includes: said second semiconductor layer 1403 is obtained by periodically growing a first AlN layer, a first InN layer and a second AlN layer, and in the process of growing a second semiconductor, the content of indium in the second semiconductor layer 1403 is adjusted by controlling the growth temperature and the thickness of the first AlN layer, the first InN layer and the second AlN layer. The second semiconductor layer 1403 uses the principle that indium has a low melting point and is easily diffused at a high temperature to obtain InAlN as the second semiconductor layer 1403, and the second semiconductor layer 1403 can effectively reduce the dark current of said semiconductor device, thereby reducing the noise current of said semiconductor device, improving the signal-to-noise ratio and improving the quality of said semiconductor device.

Referring back to FIG. 86, the semiconductor device includes a source 1404, a drain 1405, and a gate 1406, which are disposed on the second semiconductor layer 1403, and the gate 1406 is located between the source 1404 and the drain 1405. A first recess and a second recess are provided on one side of the semiconductor device, wherein the source 1404 is provided in the first recess and the drain 1405 is provided in the second recess. Wherein said first concave portion is located at one side of said semiconductor device, a first concave portion is etched on the second semiconductor layer 1403, the depth of said first concave portion is less than the thickness of the second semiconductor layer 1403, namely, the bottom of said first concave portion has a certain pre-set distance from the bottom of the second semiconductor layer 1403, namely, a first pre-set distance; the second recess is provided on the second semiconductor layer 1403 and is located on the opposite side of the first recess; the second recess is etched on the second semiconductor layer 1403, and the depth of the second recess is less than the thickness of the second semiconductor layer 1403, namely, the bottom of the second recess has a certain pre-set distance, namely, a second pre-set distance, from the bottom of the second semiconductor layer 1403. In this embodiment the first predetermined distance is equal to the second predetermined distance.

Referring to FIG. 86, a source 1404 is provided in a first recess and higher than the first recess, a drain 1405 is provided in a second recess and higher than the second recess, a gate 1406 is provided on the second semiconductor layer 1403, and the gate 1406 is located between the source 1404 and the drain 1405 and on a side closer to the source 1404. In various embodiments, the gate 1406 may be "T" shaped to improve noise.

Referring to FIG. 86, an oxide layer 1407 is further included between the gate 1406 and the second semiconductor layer 1403. The oxide layer 1407 may include at least one of ITO, ZnO, RuOx, TiOx, or IrOx. In this embodiment, the oxide layer 1407 is a titanium dioxide layer (TiO2). The current and cut-off frequency of the semiconductor device can be improved compared to other oxides by providing a titanium dioxide layer as the oxide layer 1407. At the same time, the oxide layer 1407 can reduce the contact resistance between the gate 1406 and the second semiconductor layer 1403, thereby improving the noise of the semiconductor device to be less at the maximum available current.

Referring to FIG. 86, in some embodiments, the side of the source 1404 in contact with the second semiconductor layer 1403 includes a first heavily N-type doped region 1409, the first heavily N-type doped region 1409 is located in the first trench, and the height of the first heavily N-type doped region 1409 is higher than that of the second semiconductor layer 1403, ensuring that the first heavily N-type doped region 1409 is in full contact with the second semiconductor layer 1403. The side of the drain 1405 in contact with the second semiconductor layer 1403 comprises a second N-type heavily doped region 1408, wherein the second N-type heavily doped region 1408 is located in said second trench, and the height of the second N-type heavily doped region 1408 is higher than that of the second semiconductor layer 1403, ensuring that the second N-type heavily doped region 1408 is completely in contact with the second semiconductor layer 1403. The first N-type heavily doped region 1409 and the second N-type heavily doped region 1408 are both highly doped regions and form a good ohmic contact with the second semiconductor layer 1043.

Figure 87:
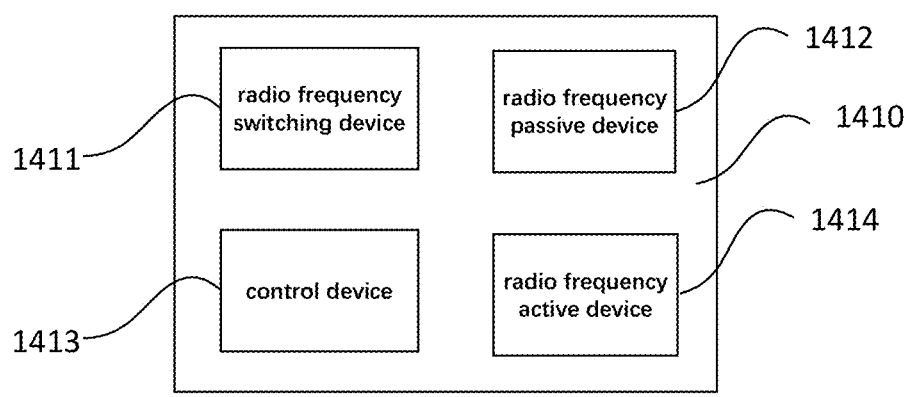
FIG. 87 is a block diagram of a radio frequency module according to an embodiment of the present disclosure.

Referring to FIG. 87, when the semiconductor device of the present disclosure is applied to a radio frequency module, the radio frequency module includes the semiconductor device. The radio frequency module mainly comprises a radio frequency (radio frequency, RF) switching device 1411, a radio frequency (radio frequency, RF) active device 1414, a radio frequency (radio frequency, RF) passive device 1412 and a control device 1413. Here, the radio frequency (RF) active device 1414 may be a semiconductor device as described in the present application, and the radio frequency (RF) passive device 1412 may be a passive device such as a capacitor, a resistor and an inductor. Wherein a radio frequency (RF) switching device 1411, a radio frequency (RF) active device 1414, a radio frequency (RF) passive device 1412 and a control device 1413 are all formed on the semiconductor substrate 1410.

Figure 88:
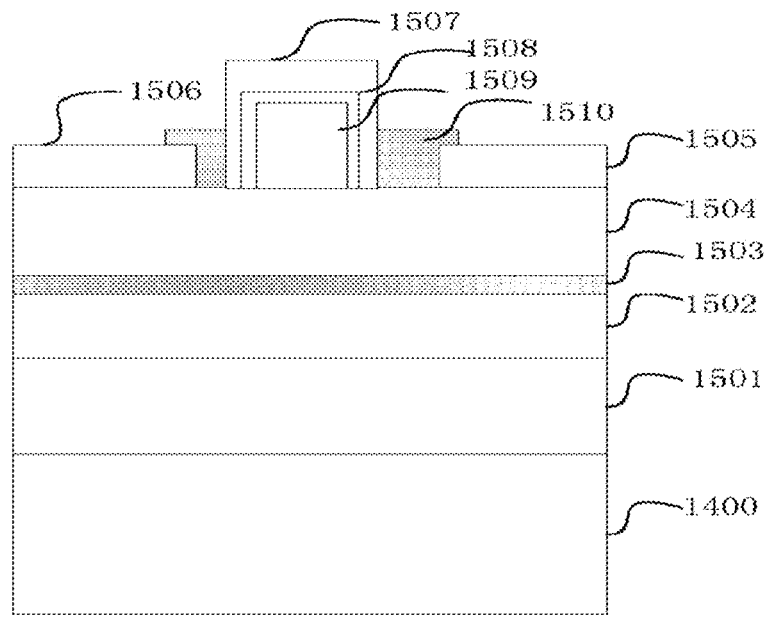
FIG. 88 is a structural diagram of another semiconductor device in an embodiment of the present disclosure.

Referring to FIG. 88, in various embodiments, when a semiconductor device is fabricated using the semiconductor apparatus and epitaxial structures provided by the present disclosure, the semiconductor device includes a substrate 1400, a buffer layer 1501, a first semiconductor layer 1502, a second semiconductor layer 1504, a source 1506, a drain 1505, a gate 1507, and a first semiconductor mesa 1509. A buffer layer 1501 is provided on the substrate 1400, a first semiconductor layer 1502 is provided on the buffer layer 1501, a second semiconductor layer 1504 is provided on the first semiconductor layer 1502, a source 1506 and a drain 1505 are formed on the second semiconductor layer 1504 on two opposite sides, a first semiconductor mesa 1509 is formed on the second semiconductor layer 1504 between the source 1506 and the drain 1505, and the gate 1507 is formed on the first semiconductor mesa 1509, wherein the length or width of the gate 1507 is greater than the length or width of the first semiconductor mesa 1509.

The material of the substrate 1400 may be a semiconductor substrate 1400 material such as silicon (Si), silicon carbide (SiC), sapphire ($Al_2O_3$), gallium arsenide (GaAs), lithium aluminate ($LiAlO_2$), and in some embodiments, the substrate 1400 may be a silicon (Si) based material, such as a silicon-based material such as silicon (Si) or silicon carbide (SiC). The row of first semiconductor layers 1502 is located on the buffer layer 1501, and the first semiconductor layer 1502 is located between the buffer layer 1501 and the second semiconductor layer 1504. In some embodiments, the first semiconductor layer 1502 is, for example, a gallium nitride layer, and the thickness of the first semiconductor layer 1502 may be set to, for example, 200-300 nm. Located on the first semiconductor layer 1502 is a second semiconductor layer 1504, which in this embodiment is, for example, an aluminum gallium nitride layer (AlGaN), which may have a thickness of, for example, 10-15 nm.

Referring again to FIG. 88, in one embodiment, the first semiconductor layer 1502 is a gallium nitride layer (GaN) and the second semiconductor layer 1504 is an aluminum gallium nitride layer (AlGaN). The gallium nitride layer and the aluminum gallium nitride layer may form a hetero-type semiconductor structure, which is an enhanced type semiconductor structure. By virtue of the strong spontaneous and piezoelectric polarization effects of the first semiconductor layer 1502 (gallium nitride layer) and the second semiconductor layer 1504 (aluminum gallium nitride layer), a two-dimensional electron gas 1503 is induced in the heterostructure of the first semiconductor layer 1502 and the second semiconductor layer 1504.

Referring again to FIG. 88, the half structure further includes a patterned passivation layer 1510 disposed on the second semiconductor layer 1504. The formation of the passivation layer 1510 includes: A passivation layer 1510 is first formed on the second semiconductor layer 1504, then a patterned photoresist layer is formed on the passivation layer 1510, then the passivation layer 1510 is etched according to the patterned photoresist layer to form the patterned passivation layer 1510, and then the patterned photoresist layer is removed and cleaned. The passivation layer 1510 may be made of silicon oxide or aluminum oxide to protect the semiconductor device from reverse leakage and improve chip reliability. In some embodiments, the passivation layer 1510 may be selected from the material $SiO_2$ to facilitate etching the openings, and portions of the passivation layer 1510 may be removed during etching by a buffered silicon oxide etch or a dry etch.

Referring to FIG. 88, in one embodiment, two openings, a first opening and a second opening, are etched in the passivation layer 1510 while a recess is etched in the passivation layer 1510. The recess is located in the middle of the passivation layer 1510 and contacts the second semiconductor layer 1504 through the passivation layer 1510. The first opening and the second opening are respectively located on two sides of said recess, and the first opening and the second opening are oppositely arranged, and both the first opening and the second opening are in contact with the second semiconductor layer 1504 through the passivation layer 1510. In the present embodiment, the source 1506 is provided in the first opening and the drain 1505 is provided in the second opening, and the height of the source 1506 and the drain 1505 is less than the thickness of the passivation layer 1510.

Referring to FIG. 88, the semiconductor device further includes a gate 1507 disposed between a source 1506 and a drain 1505, within the recess, and on a first semiconductor mesa 1509. In the present embodiment, the first semiconductor mesa 1509 is located on the second semiconductor layer 1504 and is arranged in the recess, the height of the first semiconductor mesa 1509 is greater than the depth of the recess, the first semiconductor mesa 1509 has a certain pre-set distance from the side wall of the recess, and the material of the first semiconductor mesa 1509 is, for example, P-type GaN. In the absence of activation of the buried P-type GaN, the unmetallized semiconductor structure exhibits high leakage current under reverse bias, while after activation, high leakage of current can be suppressed. The activated process is for example: activation was performed by annealing at 725° C. for 30 minutes in a dry air atmosphere.

Referring to FIG. 88, a gate 1507 is disposed on the first semiconductor mesa 1509, and the length or width of the gate 1507 is greater than the length or width of the first semiconductor mesa 1509. A gate 1507 is disposed on the first semiconductor mesa 1509 and on the second semiconductor layer 1504, the gate 1507 filling the channel between the first semiconductor mesa 1509 and the recessed sidewall. The gate 1507 has an inverted "concave" cross-section that fits over the first semiconductor mesa 1509. The gate 1507 has a greater length or width than the first semiconductor mesa 1509. In the case where the length or width of the gate 1507 is greater than the length or width of the first semiconductor mesa 1509, it is easier to open the two-dimensional electron gas of the channel, resulting in higher leakage current, and the gate 1507 between the first semiconductor mesa 1509 and the sidewall of the recess has better gate control, better transconductance, and lower gate leakage current, thereby improving the performance of the semiconductor device.

Referring to FIG. 88, an oxide layer 1508 is further included between the gate 1507 and the first semiconductor mesa 1509. The oxide layer 1508 is disposed between the gate 1507 and the first semiconductor mesa 1509. The gate leakage current is reduced by disposing the oxide layer 1508. In this embodiment, the oxide layer 1508 is, for example, an aluminum oxide layer. By providing the oxide layer 1508 as an aluminum oxide layer, the capacitive capacity, forward current density, and transconductance of the oxide layer can be increased, facilitating a two-dimensional electron gas for channel opening, and improving the quality of the semiconductor device.

Figure 89:
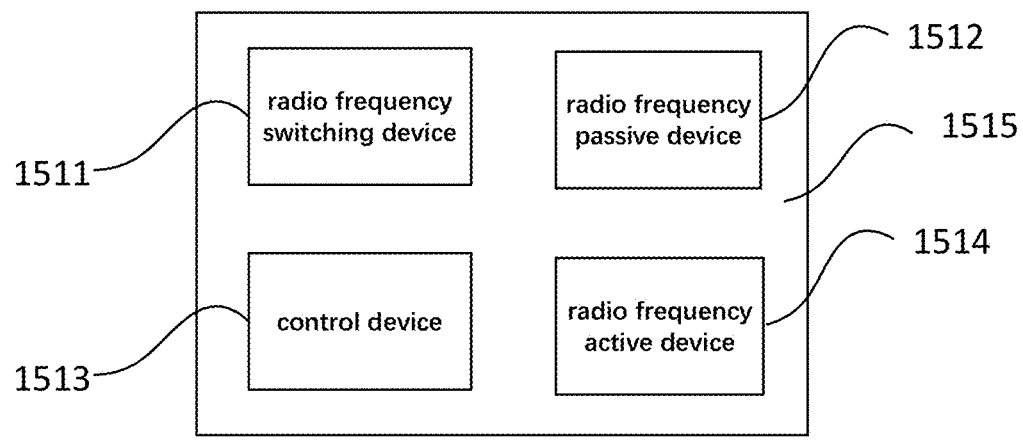
FIG. 89 is a block diagram of another radio frequency module in an embodiment of the present disclosure.

Referring to FIG. 89, when the semiconductor device of the present disclosure is applied to a radio frequency module, the radio frequency module includes the semiconductor device. The radio frequency module mainly comprises a radio frequency (radio frequency, RF) switching device 1511, a radio frequency (radio frequency, RF) active device 1514, a radio frequency (radio frequency, RF) passive device 1512 and a control device 1513. Here, the radio frequency (RF) active device 1514 may be a semiconductor device described in the present application, and the radio frequency (RF) passive device 1512 may be a passive device such as a capacitor, a resistor, and an inductor. Wherein a radio frequency (RF) switching device 1511, a radio frequency (RF) active device 1514, a radio frequency (RF) passive device 1512 and a control device 1513 are all formed on a semiconductor substrate 1515.

Referring to FIG. 88, in various embodiments, when a semiconductor device is fabricated using the semiconductor devices and epitaxial structures provided by the present disclosure, the semiconductor device includes a substrate 1400, a buffer layer 1601, a first semiconductor layer 1603, a second semiconductor layer 1604, a third semiconductor layer 1602, and a source 1607, a drain 1608, and a gate 1609. Wherein a buffer layer 1601 is formed on the substrate 1400, a first semiconductor layer 1603 is formed on the buffer layer 1601, a second semiconductor layer 1604 is formed on the first semiconductor layer 1603, and a third semiconductor layer 1602 is formed between the first semiconductor layer 1603 and the buffer layer 1601. A source 1607 is formed on one side of the first semiconductor layer 1603 and extends from the second semiconductor layer 1604 to the buffer layer 1601, a drain 1608 is formed on the other side of the first semiconductor layer 1603 and extends from the second semiconductor layer 1604 to the buffer layer 1601, and a gate 1609 is formed on the second semiconductor layer 1604 and is located between the source 1607 and the drain 1608.

Figure 90:
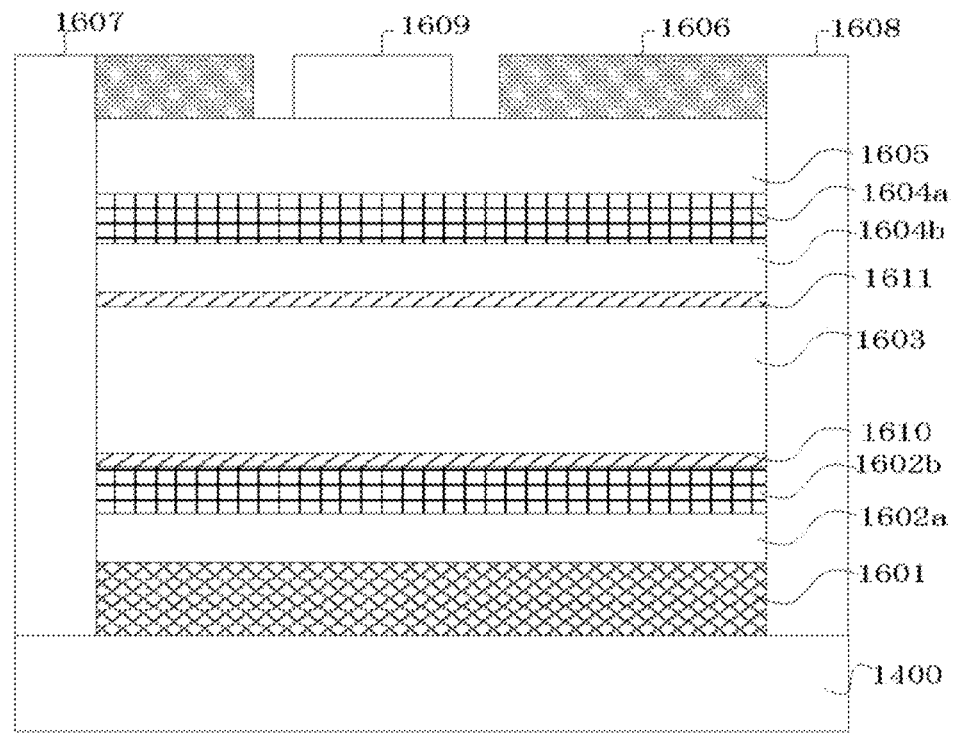
FIG. 90 is a structural diagram of still another semiconductor device in an embodiment of the present disclosure.

Referring to FIG. 90, the semiconductor device includes a substrate 1400. The substrate 1400 may generally be any suitable growth substrate 1400. The substrate 1400 may be a semiconductor substrate material such as silicon (Si), silicon carbide (SiC), sapphire ($Al_2O_3$), gallium arsenide (GaAs), lithium aluminate ($LiAlO_2$), or the like. In this embodiment, the substrate 1400 is a silicon (Si) based material, such as a silicon-based material such as silicon (Si) or silicon carbide (SiC).

Referring to FIG. 90, the semiconductor device includes a buffer layer 1601 disposed on the substrate 1400 between the substrate 1400 and a semiconductor layer to mitigate lattice mismatch between the substrate 1400 and the semiconductor layer. The material of the buffer layer 1601 is generally determined based on the material of the substrate 1400 and the semiconductor material on the substrate 1400. In this embodiment, buffer layer 1601 may be a gallium aluminum nitride layer having a thickness of, for example, between 115 and 125 angstroms, for example, 120 angstroms. Simultaneously growing buffer layer 1601 on substrate 1400 facilitates the growth of the epitaxial structure disposed thereon, improving the quality of the semiconductor device.

Referring to FIG. 90, the semiconductor device includes a third semiconductor layer 1602 disposed over a buffer layer 1601. In this embodiment, the third semiconductor layer 1602 includes a third donor layer 1602a, which is a gallium aluminum nitride layer, disposed on the buffer layer 1601, and a third spacer layer 1602b, which has a thickness of, for example, between 48 and 52 angstroms, for example, 50 angstroms. The ion doping concentration of the third donor layer 1602a is, for example, $1\times10^{24}$ $m^{-3}$ to $2\times10^{24}$ $m^{-3}$. A third spacer layer 1602b is disposed between the third donor layer 1602a and the first semiconductor layer 1603, the third spacer layer 1602b is a gallium aluminum nitride layer, and the thickness of the third spacer layer 1602b is disposed the same as the thickness of the third donor layer 1602a, for example, 50 angstroms.

Referring to FIG. 90, the semiconductor device includes a first semiconductor layer 1603 disposed on a third semiconductor layer 1602. In this embodiment, the first semiconductor layer 1603 is, for example, a gallium nitride layer, and the thickness of the first semiconductor layer 1603 is set to, for example, between 195 and 205 angstroms, for example, 200 angstroms. Gallium nitride is a third-generation wide bandgap semiconductor material with a large bandgap (3.4 eV), a high electron saturation rate, a high breakdown field, a relatively high thermal conductivity, corrosion resistance and radiation resistance, and the gallium nitride layer can form a AlGaN/GaN heterojunction with the gallium nitride aluminum layer, thereby forming a two-dimensional electron gas with a high concentration and a high mobility, so as to facilitate the fabrication of a semiconductor device.

Referring to FIG. 90, the semiconductor device includes a second semiconductor layer 1604 formed on a first semiconductor layer 1603. In this embodiment, the second semiconductor layer 1604 includes a second donor layer 1604a and a second spacer layer 1604b, the second donor layer 1604a is disposed on the first semiconductor layer 1603, the second donor layer 1604a is also a gallium aluminum nitride layer, and the thickness of the second donor layer 1604a is disposed the same as the third donor layer 1602a, for example, disposed at 50 angstroms. The ion doping concentration of the second donor layer 1604a is the same as the ion doping concentration of the third donor layer, e. g. $1\times10^{24}$ $m^{-3}$ to $2\times10^{24}$ $m^{-3}$. A second spacer layer 1604b is disposed between the first semiconductor layer 1603 and the second donor layer 1604a. The second spacer layer 1604b is also a gallium aluminum nitride layer having the same thickness as the second spacer layer 1604b, e. g. 50 angstroms.

Referring to FIG. 90, the semiconductor device includes two two-dimensional electron gas layers, a first two-dimensional electron gas layer 1610 and a second two-dimensional electron gas layer 1611. A first two-dimensional electron gas layer 1610 is formed between the first semiconductor layer 1603 and the third semiconductor layer 1602, and a second two-dimensional electron gas layer 1611 is formed between the first semiconductor layer 1603 and the second semiconductor layer 1604. The two two-dimensional electron gas layers provide the semiconductor device with a higher voltage resistance and also facilitate the two-dimensional electron gas for channel opening.

Referring to FIG. 90, the semiconductor device includes a barrier layer 1605 disposed on a second semiconductor layer 1604. In this embodiment, barrier layer 1605 is a gallium aluminum nitride layer and barrier layer 1606 is provided to a thickness of between 115-125 angstroms, e. g. 120 angstroms.

Referring to FIG. 90, the semiconductor device further includes a gallium nitride cap layer 1606, which is disposed over the barrier layer. In this embodiment, the gallium nitride cap layer 1606 has a thickness of, for example, between 95-105 angstroms, for example, 100 angstroms.

Referring to FIG. 90, the semiconductor device structure includes a source 1607, a drain 1608, and a gate 1609. A source 1607 is provided on one side of the first semiconductor and extends from the second semiconductor layer 1604 to the buffer layer 1601, a drain 1608 is provided on the other side of the first semiconductor layer 1603 and extends from the second semiconductor layer 1604 to the buffer layer 1601. A gate 1609 is disposed between the source 1607 and the drain 1608, and the gate 1609 is disposed on the second semiconductor layer 1604.

Referring to FIG. 90, in the present embodiment, the source 1607 passes through the second semiconductor layer 1604, the first semiconductor layer 1603 and the third semiconductor layer 1602 to reach the buffer layer 1601, and the drain 1608 also passes through the second semiconductor layer 1604, the first semiconductor layer 1603 and the third semiconductor layer 1602 to reach the buffer layer 1601, and both the source 1607 and the drain 1608 are ohmically connected to the first two-dimensional electron layer 1610 and the second two-dimensional electron layer 1611. It is easier to open the two-dimensional electron gas of the channel. The gate 1609 is provided on the second semiconductor layer 1604, and the cross-sectional width of the gate 1609 is smaller than the width of the source 1607 and the drain 1608.

Figure 91:
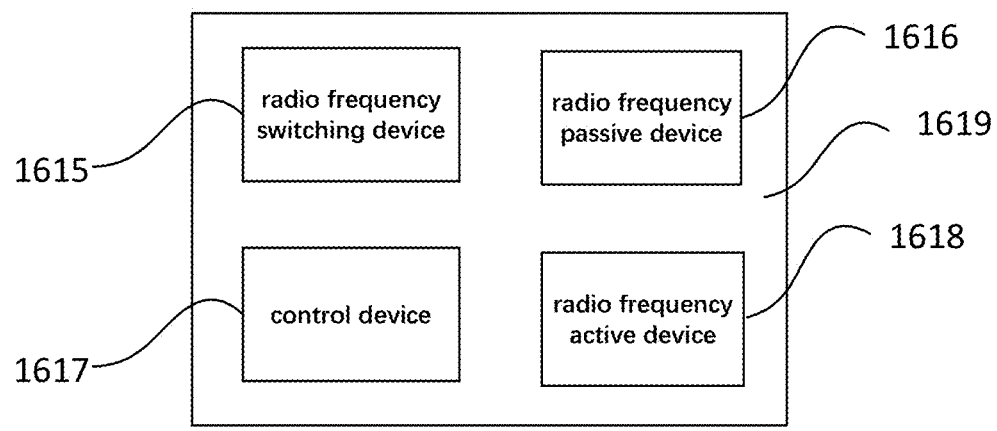
FIG. 91 is a block diagram of still another radio frequency module in an embodiment of the present disclosure.

Referring to FIG. 91, when the semiconductor device of the present disclosure is applied to a radio frequency module, the radio frequency module includes the semiconductor device. The radio frequency module mainly comprises a radio frequency (radio frequency, RF) switching device 1615, a radio frequency (radio frequency, RF) active device 1618, a radio frequency (radio frequency, RF) passive device 1616 and a control device 1617. A radio frequency (RF) active device 1618 can be the semiconductor device described in the present application, and a radio frequency (RF) passive device 1616 can be a passive device such as a capacitor, a resistor and an inductor. Wherein a radio frequency (RF) switching device 1615, a radio frequency (RF) active device 1618, a radio frequency (RF) passive device 1616 and a control device 1617 are all formed on a semiconductor substrate 1619.

Figure 92:
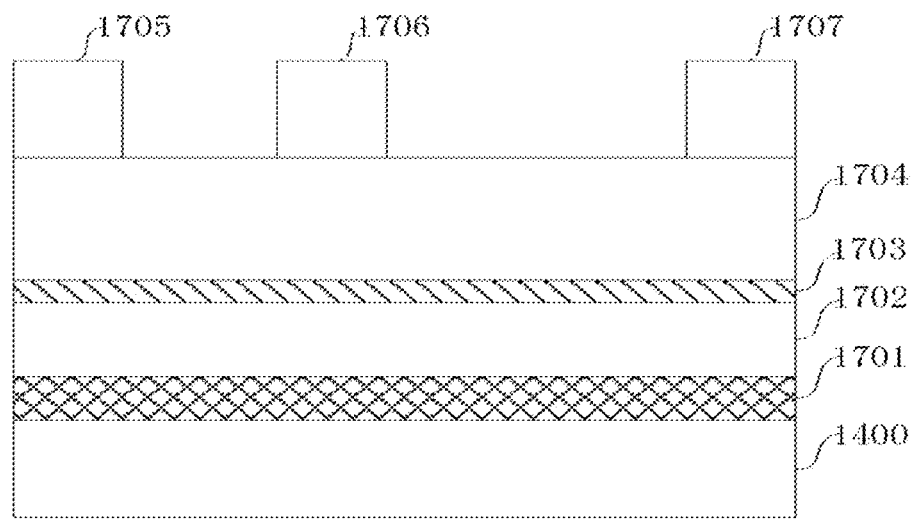
FIG. 92 is a structural diagram of even still another semiconductor device in an embodiment of the present disclosure.

Referring to FIG. 92, in various embodiments, when a semiconductor device is fabricated using the semiconductor devices and epitaxial structures provided by the present disclosure, the semiconductor device includes a substrate 1400, a buffer layer 1701, a first semiconductor layer 1702, a second semiconductor layer 1704, and a source 1705, a drain 1707, and a gate 1706 on the second semiconductor layer 1704. A buffer layer 1701 is disposed on the substrate 1400, a first semiconductor layer 1702 is disposed on the buffer layer 1701, and a second semiconductor layer 1704 is disposed on the first semiconductor layer 1702. A source 1705 and a drain 1707 are formed on said second semiconductor layer 1704, the source 1705 and the drain 1707 are located on two opposite sides, and the gate 1706 is located between the source 1705 and the drain 1707, wherein a two-dimensional electron gas layer 1702 is formed between the first semiconductor layer 1702 and the second semiconductor layer 1704.

Referring to FIG. 92, the material of the substrate 1400 may be silicon (Si), silicon carbide (SiC), sapphire ($Al_2O_3$), gallium arsenide (GaAs), lithium aluminate ($LiAlO_2$), etc. With the semiconductor device provided by the present disclosure, a buffer layer 1701 is formed on a substrate 1400 by means of physical vapour deposition, and the buffer layer 1701 is provided between the substrate 1400 and a semiconductor layer, so that the lattice mismatch between the substrate 1400 and said semiconductor layer can be mitigated, while growing the buffer layer 1701 on the substrate 1400 facilitates the growth of an epitaxial structure provided thereon, and improves the quality of said semiconductor device. The material of the buffer layer 1701 is determined according to the material of the substrate 1400 and the semiconductor material on the substrate 1400. The buffer layer 1701 may be, for example, a gallium nitride buffer layer, and the gallium nitride buffer layer 1701 has a larger thickness, and the thickness of the aluminum nitride buffer layer 1701 may be set to be, for example, greater than 60 nm.

Referring to FIG. 92, a first semiconductor layer 1702 is disposed on a buffer layer 1701, wherein the first semiconductor layer 1702 is an unintentionally doped gallium nitride layer. A second semiconductor layer 1704, which is an aluminum gallium nitride layer, is disposed on the first semiconductor layer 1702. The gallium nitride layer has a strong spontaneous and piezoelectric polarization effect with the aluminum gallium nitride, and a two-dimensional electron gas layer 1702 is induced between the first semiconductor layer 1702 and the second semiconductor layer 1704, so that the formed semiconductor device has better vertical leakage and breakdown characteristics.

Referring to FIG. 92, the second semiconductor layer 1704 includes a source 1705, a drain 1707, and a gate 1706 thereon, the source 1705 forming a side opposite to the second semiconductor layer 1704, the drain 1707 being located at a side opposite to the source 1705, and the gate 1706 being disposed between the source 1705 and the drain 1707.

Figure 93:
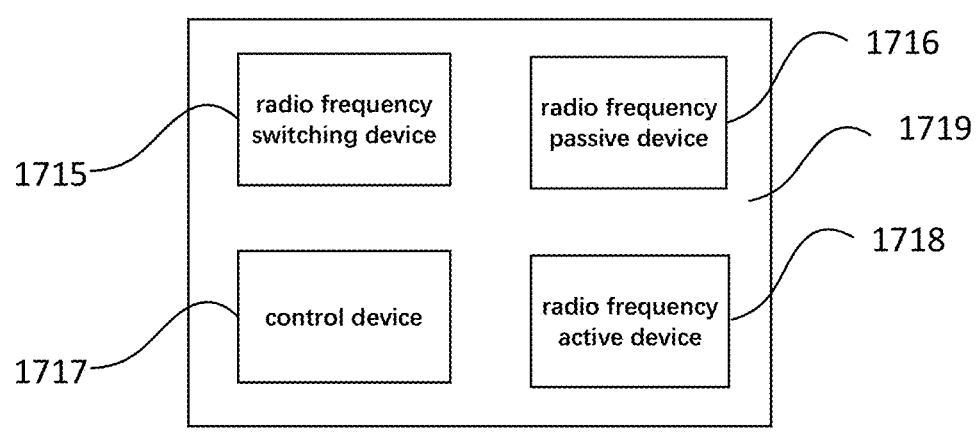
FIG. 93 is a block diagram of even still another radio frequency module in an embodiment of the present disclosure.

Referring to FIG. 93, when the semiconductor device of the present disclosure is applied to a radio frequency module, the radio frequency module includes the semiconductor device. The radio frequency module mainly comprises a radio frequency (radio frequency, RF) switching device 1715, a radio frequency (radio frequency, RF) active device 1718, a radio frequency (radio frequency, RF) passive device 1716 and a control device 1717. Here, the radio frequency (RF) active device 1718 may be the semiconductor device described in the present application, and the radio frequency (RF) passive device 1716 may be a passive device such as a capacitor, a resistor and an inductor. Wherein a radio frequency (RF) switching device 1715, a radio frequency (RF) active device 1718, a radio frequency (RF) passive device 1716 and a control device 1717 are all formed on a semiconductor substrate 1719.

In summary, the present application proposes a semiconductor device capable of improving the uniformity of coating. Other such quality films or epitaxial structures, such as metal films, semiconductor films, insulating films, compound films, or films of other materials, may also be applied using the apparatus or fabrication methods of the present application. Furthermore, the high quality thin films and epitaxial structures formed in the present application can be applied to a variety of semiconductor structures, electronic components, or electronic devices, such as switching elements, power elements, radio frequency elements, light emitting diodes, micro light emitting diodes, display panels, cell phones, watches, notebook computers, on-board devices, charging devices, charging posts, virtual reality (VR) devices, extended reality (AR) devices, portable electronic devices, gaming devices, or other electronic devices.

While the foregoing is directed to preferred embodiments of the present invention and illustrative embodiments of the principles of the technology employed, it will be understood by those skilled in the art that the scope of the disclosure is not limited to any particular combination of the features described above, but is intended to cover other embodiments in which any combination of the features described above, or equivalents thereof, may be employed without departing from the spirit of the disclosure, such as by substituting features disclosed in this application for other features having similar functions.

In addition to the technical features described in the description, the remaining technical features are known techniques to a person skilled in the art, and in order to highlight the innovative features of the present disclosure, the remaining technical features will not be described in detail herein.

What is claimed is:

1. A semiconductor epitaxial structure, comprising:
a substrate;
an aluminum nitride layer, formed in direct contact with the substrate;
a first gallium nitride layer, formed in direct contact with the aluminum nitride layer; and
a second gallium nitride layer, formed in direct contact with the first gallium nitride layer;
wherein a lattice structure of the first gallium nitride layer is different from that of the second gallium nitride layer;
wherein the lattice structure of the first gallium nitride layer is a polycrystalline structure or a single crystal structure, and the lattice structure of the second gallium nitride layer is an amorphous structure.

2. The semiconductor epitaxial structure of claim 1, wherein a thickness of the aluminum nitride layer is in a range of 5-30 nm.

3. The semiconductor epitaxial structure of claim 1, wherein a thickness of the first gallium nitride layer is in a range of 200-400 nm, and a thickness of the second gallium nitride layer is in a range of 0.1-0.5 mm.

* * * * *